US012767523B2

(12) United States Patent
Ang et al.

(10) Patent No.: US 12,767,523 B2
(45) Date of Patent: Oct. 20, 2026

(54) HIGHLY SENSITIVE THERMOELECTRIC-BASED INFRARED DETECTOR WITH HIGH CMOS INTEGRATION

(71) Applicant: MERIDIAN INNOVATION PTE LTD, Singapore (SG)

(72) Inventors: Wan Chia Ang, Singapore (SG); Piotr Kropelnicki, Singapore (SG)

(73) Assignee: Meridian Innovation Pte Ltd, Singapore (SG)

( * ) Notice: Subject to any disclaimer, the term of this patent is extended or adjusted under 35 U.S.C. 154(b) by 224 days.

(21) Appl. No.: 18/710,198

(22) PCT Filed: Nov. 16, 2022

(86) PCT No.: PCT/SG2022/050830
§ 371 (c)(1),
(2) Date: May 15, 2024

(87) PCT Pub. No.: WO2023/091084
PCT Pub. Date: May 25, 2023

(65) Prior Publication Data

US 2024/0351863 A1 Oct. 24, 2024

Related U.S. Application Data

(63) Continuation-in-part of application No. 17/612,200, filed on Nov. 17, 2021, now Pat. No. 12,553,776, and
(Continued)

(51) Int. Cl.
*G01J 5/02* (2022.01)
*B81B 7/00* (2006.01)
*B81C 1/00* (2006.01)

(52) U.S. Cl.
CPC .......... *B81B 7/008* (2013.01); *B81C 1/00246* (2013.01); *G01J 5/024* (2013.01); *B81C 2203/0735* (2013.01)

(58) Field of Classification Search
CPC ................ B81B 7/008; B81C 1/00246; B81C 2203/0735; G01J 5/024; G01J 5/0235; G01J 5/12
See application file for complete search history.

(56) References Cited

U.S. PATENT DOCUMENTS

2018/0331155 A1* 11/2018 Leduc .................... H10N 19/00
2019/0027522 A1* 1/2019 Kropelnicki ........ B81C 1/00317
(Continued)

FOREIGN PATENT DOCUMENTS

EP 2897170 A1 7/2015
EP 3428592 A2 1/2019
(Continued)

*Primary Examiner* — Uzma Alam
*Assistant Examiner* — Mamadou Faye
(74) *Attorney, Agent, or Firm* — HORIZON IP PTE. LTD.

(57) ABSTRACT

A CMOS-MEMS integrated device and a method for forming such a device are disclosed. The integrated device includes a double released MEMS infrared sensor. The double released MEMS sensor is a free-standing sensor over a lower sensor cavity which is etched into the substrate of the device. The free-spending MEMS sensor is devoid of a support dielectric membrane which supports the MEMS sensor, resulting in the MEMS sensor being suspended over the lower sensor cavity. The support dielectric is removed by a second release process. The second release process may also remove a protective dielectric layer over the MEMS sensor. The MEMS sensor without the protective dielectric layer enhances sensor sensitivity. In other cases, the free-
(Continued)

200 standing MEMS sensor may include an absorber thereover. The absorber enhances sensor sensitivity.

20 Claims, 47 Drawing Sheets

Related U.S. Application Data a continuation-in-part of application No. 17/440,784, filed on Sep. 19, 2021, now Pat. No. 12,168,603, and a continuation-in-part of application No. 17/440,175, filed on Sep. 16, 2021, now Pat. No. 11,845,653, and a continuation-in-part of application No. 17/439,797, filed on Sep. 15, 2021, now Pat. No. 12,631,491, and a continuation-in-part of application No. 17/156,639, filed on Jan. 25, 2021, now Pat. No. 11,990,498.

(60) Provisional application No. 63/279,682, filed on Nov. 16, 2021.

(56) References Cited

U.S. PATENT DOCUMENTS

| | | | | |
|---|---|---|---|---|
| 2019/0341419 | A1* | 11/2019 | Kropelnicki | H10F 30/10 |
| 2020/0203417 | A1 | 6/2020 | Kropelnicki et al. | |
| 2020/0367362 | A1* | 11/2020 | Kim | H05K 7/1427 |
| 2021/0082866 | A1* | 3/2021 | Chen | H10H 20/857 |
| 2021/0183732 | A1* | 6/2021 | Nelhiebel | H01L 23/367 |

FOREIGN PATENT DOCUMENTS

| | | | |
|---|---|---|---|
| EP | 3875424 | A1 | 9/2021 |
| WO | 2021053267 | A1 | 3/2021 |

* cited by examiner

350

450

450

450

650

650

750

900

900

900

900

900

900

900

900

900

1300

| Design | (i) | (ii) | (i') | (ii') |
|---|---|---|---|---|
| Thermal conductivity | Si: 34 W/mK<br>SiO2: 1.4 W/mK | | Si: 20 W/mK<br>SiO2: 1.4 W/mK | |
| Temperature increase (degC) | 2.24 | 3.67 | 2.99 | 6.26 |
| Response Speed (ms) | 8.37 | 4.22 | 11.14 | 6.89 |

1400

HIGHLY SENSITIVE THERMOELECTRIC-BASED INFRARED DETECTOR WITH HIGH CMOS INTEGRATION

CROSS-REFERENCE TO RELATED APPLICATION

This application claims the benefit of U.S. Provisional Application Ser. No. 63/279,682, filed on Nov. 16, 2021. This application is also a continuation-in-part of U.S. patent application Ser. No. 17/612,200, filed on Nov. 17, 2021; a continuation-in-part of U.S. patent application Ser. No. 17/440,784, filed on Sep. 19, 2021; a continuation-in-part of U.S. patent application Ser. No. 17/440,175, filed on Sep. 16, 2021; a continuation-in-part of U.S. patent application Ser. No. 17/439,797, filed on Sep. 15, 2021 which are all a continuation-in-part of U.S. patent application Ser. No. 17/156,639, filed on Jan. 25, 2021. The disclosures of above said applications are herein incorporated by reference in their entireties for all purposes.

FIELD OF THE INVENTION

The present disclosure generally relates to monolithic integrated CMOS-MEMS devices. More particularly, the disclosure relates to monolithic integrated CMOS-MEMS devices with highly sensitive MEMS sensors. The highly sensitive MEMS sensors are free-standing MEMS sensors, such as free-standing MEMS infrared sensors.

BACKGROUND

The demand for uncooled infrared detectors is continually growing due to the increased demand from numerous applications. These applications, just to name a few, include air conditioning systems, handphones, autonomous driving cars, the internet of things (IoT), fire-fighting and traffic safety.

Conventional uncooled infrared detectors have been implemented using microbolometers. However, microbolometers require mechanical components for calibration purposes. As an example, microbolometers require mechanical shutters for offset correction. The required mechanical components for microbolometers increase manufacturing complexity. Such complexity increases cost. In addition, the need for mechanical components for microbolometers makes it difficult to produce small or compact devices as well as being more susceptible to reliability issues.

The present disclosure is directed to cost-effective and compact infrared detectors with high sensitivity and response time integrated with CMOS components.

SUMMARY

Embodiments of the present disclosure generally relate to devices and methods of forming thereof. In one embodiment, a device is disclosed. The device includes a substrate with a complementary metal oxide semiconductor (CMOS) region and a microelectromechanical systems (MEMS) region. The CMOS region includes transistor regions with transistors. The MEMS region includes a lower sensor cavity and a free-standing sensor disposed over the lower sensor cavity. The free-standing sensor is devoid of a support dielectric between the sensor and the lower sensor cavity. The free-standing sensor improves response time and sensor sensitivity. A pre-metal dielectric layer with pre-metal contacts is disposed on the substrate over the CMOS and MEMS regions. A back-end-of-line (BEOL) dielectric is disposed on the pre-metal dielectric layer. The BEOL dielectric includes a plurality of inter-metal dielectric (IMD) layers with metal and via levels disposed over the pre-metal dielectric. The metal levels include metal lines and the via levels include via contacts for interconnecting the components of the device via the pre-metal dielectric layer.

In another embodiment, a method for forming a device is disclosed. The method includes providing a substrate prepared with a complementary metal oxide semiconductor (CMOS) region and a microelectromechanical systems (MEMS) region. The CMOS region is processed to form first and second types of transistors in first and second transistor regions. The MEMS region is processed to form a lower sensor cavity trench filled with a cavity trench fill. A sensor support dielectric layer is formed over the lower sensor cavity on top of the trench fill. A sensor is formed on the sensor support dielectric layer. A pre-metal dielectric layer with pre-metal contacts connected to the CMOS and MEMS components of the device is formed on the substrate. A back-end-of-line (BEOL) dielectric is formed on the pre-metal dielectric layer. The BEOL dielectric includes a plurality of inter-metal dielectric (IMD) layers with metal and via levels, the metal levels include metal lines and the via levels include via contacts for interconnecting the CMOS and MEMS components of the device via the pre-metal dielectric layer. The BEOL dielectric and pre-metal dielectric are patterned to form a sensor opening in the dielectric layers. The patterning of the dielectric layers also forms release openings to expose the cavity trench fill. A first release is performed to remove the cavity trench fill to form the lower sensor cavity followed by a second release to remove the sensor support dielectric. This results in the sensor being a free-standing sensor. The free-standing sensor improves sensor sensitivity and response time.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to devices, for example, semiconductor devices or integrated circuits (ICs) with thermoelectric-based infrared detectors. The IC, for example, is a complementary metal oxide semiconductor (CMOS) device. As for the infrared detector, it is, for example, a micro-electrical mechanical system (MEMS) detector. The MEMS detector is embedded into the IC with high CMOS integration. Furthermore, the MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single-pixel or line array temperature or motion sensors.

The fabrication of devices may involve the formation of features on a substrate that makes up circuit components, such as transistors, resistors, capacitors and MEMS sensors. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel.

Figure 1:
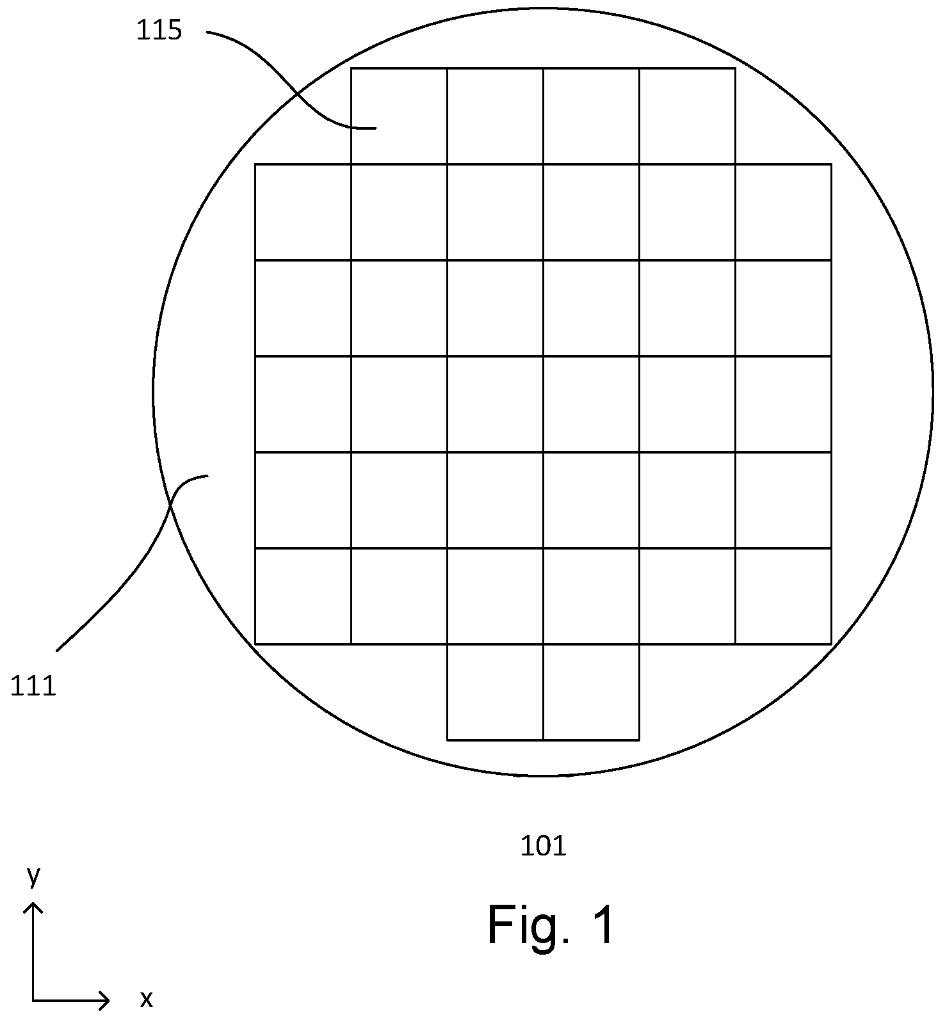
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI) or silicon germanium wafers as well as doping with other types of dopants or dopant concentrations may also be useful.

The wafer includes an active surface 111 on which a device 115 is formed. A plurality of devices may be formed on the wafer in parallel. The devices, for example, are arranged in rows along a first (x) direction and columns along a second (y) direction. Separating the devices are dicing channels. After processing is completed, the wafer is diced along the dicing channels to singulate the devices into individual chips.

Figure 2A:
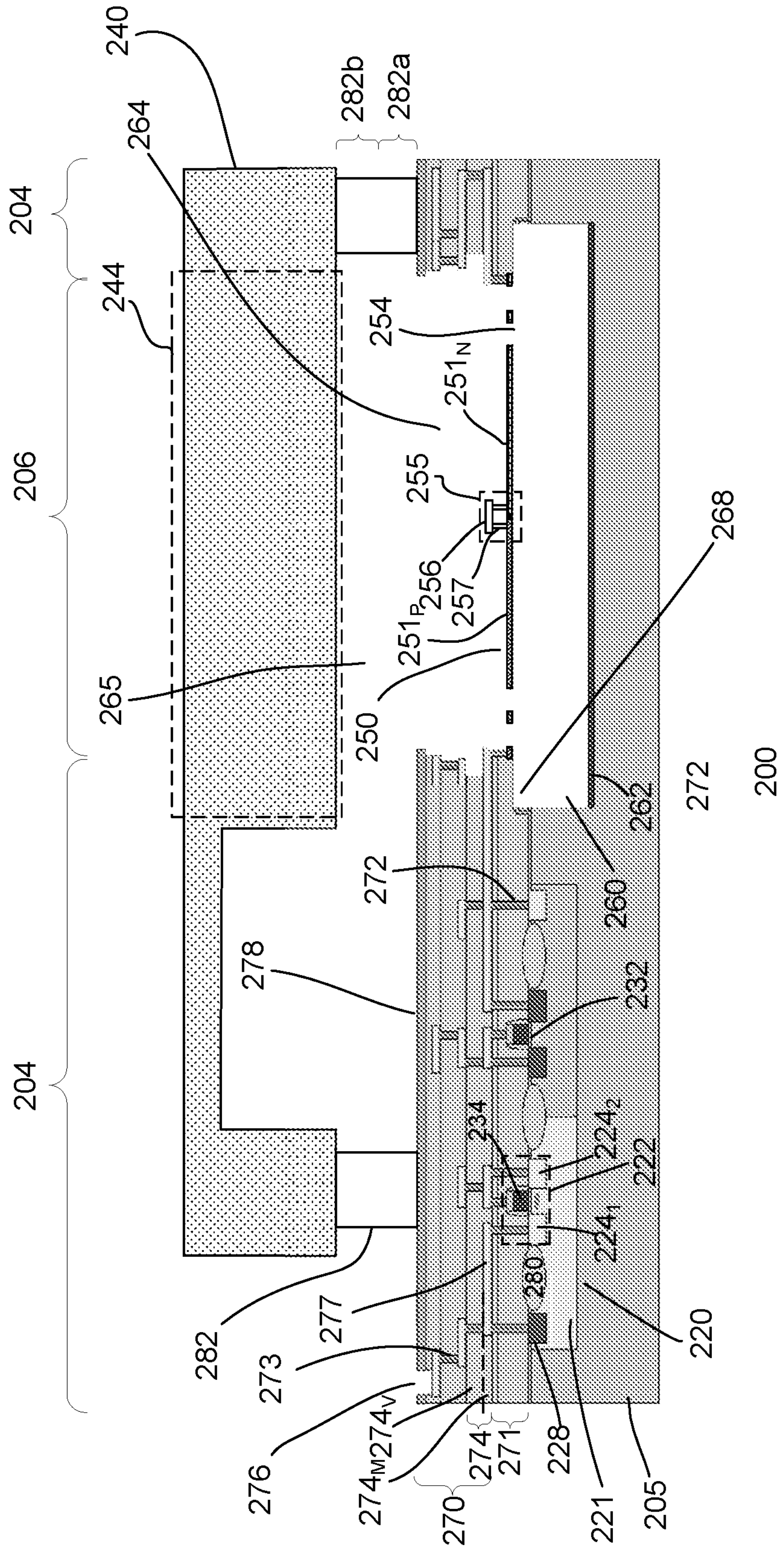
FIG. 2*a* shows a simplified cross-sectional view of an embodiment of a device.

FIG. 2*a* shows a simplified embodiment of a device 200. The device, for example, is a CMOS device with an embedded MEMS structure or component. In one embodiment, the device is a CMOS device embedded with a thermoelectric-based infrared sensor. As shown, the device is embedded with one thermoelectric-based infrared sensor. It is understood that the device may include a plurality of sensors configured to form a sensor array. For example, the device may be an infrared imager in which each sensor may be a pixel of an infrared imager. Other types of MEMS structures or applications may also be useful.

The device includes a substrate 205. The device, for example, may be a part of the wafer, as described in FIG. 1. Common elements may not be described or described in detail. The substrate, for example, may be a semiconductor substrate, such as a silicon substrate. The substrate, for example, may be a lightly doped p-type silicon substrate. Other types of substrates or wafers may also be useful. In one embodiment, the substrate includes first and second device regions 204 and 206. The first device region is a CMOS region while the second region is a sensor region. The CMOS region includes CMOS components and the sensor region includes a MEMS sensor, such as a CMOS compatible infrared sensor.

As shown, the CMOS region includes first and second CMOS component regions 220. The first component region may be a first type component region and the second component region may be a second type component region. The first type component region may be a p-type component region and the second type component region may be an n-type component region. The component regions, for example, accommodate metal-oxide field effect transistors (MOSFETs) 222. For example, the component regions are transistor regions. Providing component regions for other types of components may also be useful. In one embodiment, the first transistor region is a p-type transistor region for a p-type transistor and the second transistor region is an n-type transistor region for an n-type transistor.

A transistor region includes a transistor well 221. The transistor well is an oppositely doped well. For example, if the transistor region is a p-type (first type) transistor region, the well is an n-type (second type) doped well. The transistor well serves as the body of the transistor. The transistor includes a gate disposed above the substrate between the first and second first type heavily doped source/drain (S/D) regions 224$_{1-2}$ disposed in the transistor well.

The gate of the transistor may include a gate electrode 234 over a gate dielectric 232. The gate electrode may be polysilicon and the gate dielectric may be thermal silicon oxide. Other types of materials or configurations of gates may also be useful. For a p-type MOS transistor, the device well is an n-type well and the S/D regions are heavily doped p-type regions. On the other hand, an n-type transistor has a p-type device well and heavily doped n-type S/D regions. The S/D regions may include lightly doped extension regions. The lightly doped extension regions are lightly doped with the same polarity type dopants as the heavily doped S/D regions. The sidewalls of the gate may include dielectric spacers. The spacers facilitate aligning the S/D and lightly doped extension regions. The transistor well may include a well contact 228 which is heavily doped with the same polarity type dopants as the transistor well.

The CMOS region, as shown, may be a logic region which includes first and second transistors. However, the logic region may include numerous transistors. In addition, the logic region may include regions for transistors having different operating characteristics or voltages. For example, low voltage transistors may be provided in a low voltage (LV) region, intermediate or medium voltage transistors may be provided in a medium voltage (MV) region and high voltage transistors may be provided in a high voltage (HV) region. Other types of device regions may also be included. For example, a memory region may be included in which a memory array is disposed.

Isolation regions 280 are provided to isolate the component regions. For example, isolation regions are provided to isolate the first and second transistor regions as well as the sensor region. In addition, isolation regions may be provided to isolate a well contact from an S/D contact. The isolation regions may be field oxide (FOX) isolation regions. Other types of isolation regions, such as shallow trench isolation (STI) regions, may also be useful.

As shown, the sensor region includes a sensor 250, such as a CMOS compatible sensor. For example, the sensor region is configured for one sensor. In one embodiment, the sensor is a MEMS infrared sensor. Other types of sensors may also be useful. As shown, a lower sensor cavity 260 is disposed in the substrate below the sensor. The lower sensor cavity, in one embodiment, is disposed below the surface of the substrate. For example, the lower sensor cavity is a trench that has been etched into the substrate. The lower sensor cavity may have a square or rectangular footprint or shape. Other shapes for the lower sensor cavity may also be useful. The bottom and sides of the lower sensor cavity are defined by the substrate.

A reflector 262 is disposed at the bottom of the lower sensor cavity. The reflector reflects infrared radiation. The reflector may be formed from a conductive material. In one embodiment, the reflector is a conductive metal silicide reflector. The metal silicide reflector may be a titanium silicide ($TiSi_x$), a tungsten silicide ($WSi_x$) or an aluminum silicide ($AlSi_x$) reflector. Other types of metal silicide reflectors may also be useful. Alternative types of reflectors may also be useful. For example, the reflector may be a conductive reflector layer. The conductive reflector layer may be a doped reflector layer, such as a doped polysilicon layer. The doped reflector layer may be heavily doped with p-type or n-type dopants. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming infrared radiation. In other embodiments, the reflector may be a non-conductive reflector, such as a photonic crystal reflector. For example, a photonic crystal layer is formed by etching the surface of the lower sensor cavity. The photonic crystal layer may include a grating pattern configured to reflect incident infrared radiation. For example, different grating patterns of varying depths may be etched from the surface of the photonic crystal layer to adjust the wavelengths and properties of the reflected infrared radiation. Other types of reflectors may also be useful.

In one embodiment, the sensor is a free-standing infrared MEMS sensor suspended over the lower sensor cavity. The infrared MEMS sensor, in one embodiment, is a thermopile infrared sensor. The free-standing MEMS sensor does not have a support dielectric layer disposed below it. For example, the support and protection dielectric layer are removed in the second release process. The free-standing sensor defines a top of the lower sensor cavity.

In some embodiments, the free-standing sensor includes an absorber layer (not shown) on its surface. In such cases, the free-standing sensor includes an absorber layer over it. The absorber layer, for example, is configured to absorb incident infrared radiation. In one embodiment, the absorber layer is disposed on a central portion of the sensor body. The absorber layer is thermally coupled to a center of the sensor body. The absorber layer may be a silicon nitride (SiN) layer. Other types of absorber layers may also be useful. For example, the absorber layer may be a doped polysilicon layer, nickel-chromium (NiCr) layer or titanium nitride (TiN) layer. In the case of a conductive absorber layer, it is electrically and thermally coupled to the hot end of the sensor. A protective layer may be provided to protect the absorber layer. The protective layer may be removed by the second release process.

In one embodiment, the absorber is part of an interferometric absorption system. For example, the absorber may be integrated as part of an interferometric system to improve absorption efficiency or performance. In one embodiment, the interferometric absorption system is configured or tuned to efficiently absorb incident infrared radiation at the desired wavelength. For example, the absorption system may be tuned to absorb greater than 80% of incident infrared radiation having a wavelength of 8-14 μm. Providing any other configurations may also be useful. In other embodiments, the absorber is configured to absorb incident radiation having a wavelength of 2-5 μm. For example, another harmonic of the interferometric absorber may be used. In one embodiment, the interferometric absorption system includes the absorber and reflector configured with a ¼ wavelength spacing therebetween. For example, the desired wavelength is the center wavelength of the desired range of wavelengths to be absorbed. The highly efficient interferometric absorber layer improves sensor sensitivity.

In one embodiment, the lower sensor cavity has a depth which is selected for optimal reflection of infrared radiation by the reflector. For example, the lower sensor cavity is part of the interferometric absorption system. In one embodiment, the depth of the cavity is sufficient to ensure ¼ wavelength optical distance between the absorber and reflector. For example, the optical distance may be about 2-3 μm for detecting infrared radiation having a wavelength of 8-12 μm. Other distances may also be useful, depending on the wavelength to be detected. For example, by decreasing or increasing the optical distance, infrared radiation with smaller or larger wavelengths can be detected respectively. The optical distance is defined as the distance where the infrared radiation wave possesses an optical path going through several layers.

In one embodiment, the sensor includes a sensor body with first and second body segments $251_P$ and $251_N$. The first and second body segments, in one embodiment, are doped with first and second polarity type dopants. For example, the first body segment is doped with p-type dopants and the second body segment is doped with n-type dopants. The sensor body, for example, is patterned to form first and second body segments. The sheet resistance of the sensor body is adjusted to match the ambient sheet resistance, which is about 377 Ω/square. This advantageously enables the sensor body to also serve as an absorber. For example, no additional absorber layer is necessary. In one embodiment, the sensor body is a polysilicon sensor body. Other types of materials which are stable under high temperatures having thermoelectric properties may also be used to serve as the sensor body. For example, such materials may include silicon germanium (SiGe), gallium nitride (GaN) or a 2D material, such as graphene, black phosphorus or molysulfide.

In one embodiment, the sensor body is configured to be resistant to the second release process (second release etchant). In the case that an absorber layer is provided over the sensor body, the absorber layer should also be resistant to the second release etchant. If not, a protective layer is provided over the absorber layer.

Patterning and doping the sensor body, for example, may be achieved using mask and doping and mask and patterning techniques. As for the doping of the body segments, it may be integrated with the S/D doping processes of the p-type and n-type transistors. Other techniques for doping the body segments may also be useful.

The patterning of the sensor body forms sensor body segments with main segments and lead segments. For example, the patterning of the sensor body forms a p-doped body segment with a p-doped main segment and a p-doped lead segment and an n-doped body segment with an n-doped main segment and an n-doped lead segment. The ends of the first and second lead segments serve as first and second sensor terminals. The first and second terminals, for example, are cold ends or cold terminals of the thermoelectric sensor. The patterning of the sensor body also forms openings or spaces 254 within the sensor body. For example, the spaces are disposed between the sensor body main and lead segments. Other configurations of the spaces, sensor body main and lead segments may also be useful. The openings facilitate a release process for forming the lower sensor cavity. In one embodiment, the patterning also forms undoped body spacers (not shown) which are in contact with both the first and second body segments. The spacers enhance the mechanical stability of the free-standing sensor body.

The first and second body segments, in one embodiment, have about the same surface area to produce about symmetrical heat dissipation between the segments. Variations in processing may occur, causing variances in the surface areas of the first and second body segments. Preferably, the variance is less than about ±5%. Other variances which produce acceptable differences in heat dissipation between the body segments may also be useful. For example, the surface area differences may be less than about ±20%. In one embodiment, the first and second body segments are essentially mirror images of each other. Other configurations of the body segments may also be useful.

In one embodiment, the sensor is a double-released sensor. For example, a first release process is used to create the lower sensor cavity while the second release process is used to create the free-standing sensor by removing the support and protection dielectric layer. The second release forms a step 268 in a contact dielectric layer 271.

In one embodiment, a sensor body contact 255 couples the first and second body segments. The body contact may be disposed at the interface of the first and second body segments, interconnecting them. As shown, the sensor body contact includes sensor body via contacts 257 connected to the body segments and a second body interconnect 256 interconnecting the sensor body via contacts. In one embodiment, the sensor body contact should be a high-temperature contact. For example, the sensor body contact can sustain subsequent process temperatures. The components of the sensor body contact may be formed of titanium (Ti), aluminum (Al) or a combination thereof. Other types of high-temperature metals which are CMOS process compatible may also be used to form the components of the sensor body contact. In one embodiment, the sensor body via contacts are closed-loop sensor body via contacts. For example, the closed loop via contacts traps dielectric within the closed loops, even after the second release process. This provides additional mechanical stability for the free-standing sensor body.

A pre-metal interlayer dielectric (ILD) layer 271 disposed on the substrate over the CMOS components. As shown, the pre-metal ILD layer includes pre-metal contacts 272 which are connected to contact regions of the components. For example, the pre-metal contacts are connected to S/D regions, transistor gates and well contacts. The pre-metal contacts, for example, may be tungsten (W) contacts. Other types of contacts may also be useful. The pre-metal ILD layer may be formed from multiple dielectric layers. Various dielectric materials, such as silicon oxide ($SiO_2$), may be used to form the pre-metal ILD layer. The pre-metal contacts may be formed by a single damascene process. Other techniques for forming the pre-metal contacts may also be useful.

Forming the CMOS components, such as transistors, the sensor and the ILD layer with pre-metal contacts may be considered a part of the front-end-of-line (FEOL) processing. After FEOL processing, back-end-of-line processing commences. Other configurations of FEOL and BEOL may also be useful.

A back-end-of-line (BEOL) dielectric layer 270 is provided over the ILD layer. In one embodiment, the BEOL dielectric is formed by BEOL processing. In one embodiment, the BEOL dielectric layer includes a plurality of intermetal dielectric (IMD) layers 274 disposed over the pre-metal ILD layer. An IMD layer includes a metal-dielectric level or layer $274_M$ below a via dielectric level $274_V$. The dielectric layers of the IMD layer may be $SiO_2$. Other types of dielectric materials or combinations of dielectric materials or layers may also be useful to form the IMD layer. The metal level includes metal lines 277 in the metal-dielectric layer and the via level includes via contacts 273 in the via dielectric layer. The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process.

In some embodiments, the metal lines may be formed using a reactive ion etching (RIE) process. For example, a metal layer is formed and patterned by RIE using an etch mask to form the metal lines. The different IMD layers may employ different processes. For example, one IMD layer may employ separate single damascene processes to form the contacts and metal lines, another may employ a dual damascene process to form the contacts and metal lines, and yet another may employ a single damascene process to form the contacts followed by an RIE process to form the metal lines.

The IMD layers may be planarized to form a planar top surface over the CMOS region and the MEMS region. For example, CMP is performed on the substrate. Providing any other planarization techniques such as spin-on-glass (SOG) to fill the gaps or planarize the surface of the substrate may also be useful. The overall thickness of the IMD layers over the structure may be from 100-400 nm. Providing any other thicknesses for the IMD layers over the structure to define the depth of the vias for subsequent standard CMOS processes may also be useful.

A passivation layer 278 is disposed above the top metal level of the BEOL dielectric layer. The passivation layer may be a silicon nitride layer. Other types of passivation layers may be used. The passivation layer may serve as an etch stop and top protection layer. In some embodiments, the passivation layer may be a passivation stack having multiple passivation layers, such as a combination of silicon oxide and silicon nitride layers. As shown, a dielectric layer is provided over the top metal dielectric layer. The dielectric layer may be considered as a top via dielectric layer below the passivation layer. In some cases, the dielectric layer may be considered a part of the passivation stack. In yet other cases, a dielectric layer may be disposed over the passivation layer but is removed during processing. Other configurations of the passivation layer may also be useful. The passivation layer serves as a protection layer for the BEOL dielectric layer during the double-release processing for forming the sensor.

The top metal level of the top BEOL dielectric serves as a pad level. Bond openings 276 are provided in the passivation layer to expose the bond pads below. For example, the top metal level of the BEOL dielectric layer is covered by the passivation stack. The top metal level does not include a via level. The bond pads provide external access to the internal components of the device. For example, input, output and power signals may be provided via the bond pads. Bond pads are provided in the periphery of the device. As shown, bond pads are provided on one side of the device which is the opposite side of the sensor region. Bond pads may also be provided on one or more of the other sides of the device.

As shown, the BEOL dielectric layer includes 2 IMD layers which include metal layers M1 and M2. A top metal level M3 is provided over V2. The top metal level is covered by the passivation stack. The metal level M1 is the bottom metal level and the metal level M3 is the top metal level. Providing other numbers of IMD layers may also be useful. The number of IMD layers may depend on the CMOS process employed. Typically, the pre-metal ILD level is formed using a single damascene process. For example, pre-metal contacts are formed in contact openings of the pre-metal ILD layer to couple to various terminals of the components. The pre-metal contacts may contact S/D regions of the transistors, well contacts and terminals of the sensor. The first metal level of the first IMD layer may employ a single damascene or an RIE process. As for M2 metal lines of the second metal dielectric layer and V1 via contacts of the first via dielectric layer, they may be formed by a dual damascene process. Likewise, M3 metal lines and V2 via contacts may be formed by a dual damascene technique. Other configurations of processes for forming the various IMD layers may also be useful.

The BEOL provides interconnections between the CMOS components and sensor region to operate the sensor. For example, the CMOS components provide power to the sensor, switching it on and off. In addition, the CMOS components enable storing and reading out information from the sensor. The CMOS components may also be configured to perform other functions.

In some embodiments, the sensor region includes a sensor array with a plurality of sensors arranged in a matrix with rows and columns of sensors. Each sensor corresponds to a pixel of an array of pixels. The CMOS components, for example, may include select switches, row and column decoders and readout circuits. Other CMOS components may also be included. The CMOS components are configured to read out each pixel of the array. Once the full array of sensors is read out, an image may be reconstructed. The image, for example, is one frame corresponding to the sensors of the array.

In one embodiment, the BEOL and pre-metal dielectric material in the sensor region is removed to expose the sensor. For example, the removal of the dielectric over the sensor forms an upper sensor or BEOL cavity 264. In one embodiment, metal lines and vias may be provided in the BEOL to facilitate structuring the profile of the cavity. For example, the metal lines and vias may form a dam structure surrounding the sensor region, preventing the dielectric layers from eroding into the CMOS region from the release processes.

A cap 240 is disposed on the substrate, encapsulating the CMOS and sensor regions. The cap is disposed on the periphery of the device within the bond pads. For example, the bond pads are disposed outside of the encapsulated CMOS and sensor regions. This enables access to the bond pads. The cap includes an upper cap portion and a lower cap portion. The cap portions may be integrated. For example, the cap portions are formed by a single cap material. As shown, the upper and lower portions of the sides of the cap are aligned. Alternatively, the upper portion may protrude over the bond pad, resulting in non-aligned upper and lower portions on the side with the bond pads. Other configurations of the cap may also be useful.

A cap cavity 265 is provided in the lower portion of the cap and is over the CMOS region and sensor region with the upper cavity 264. The cap cavity and the upper sensor cavity may be collectively referred to as the cap cavity. In one embodiment, the cap cavity is a vacuum. The cap is formed of a material which is transparent to infrared radiation. For example, the cap is capable of transmitting infrared radiation to the sensor. The cap may be a silicon (Si) cap. Other types of materials, such as germanium (Ge), silicon-germanium (SiGe) or zinc sulfide (ZnS), may also be used to form the cap. Providing a cap formed from other types of materials which transmit infrared radiation may also be useful.

In one embodiment, the cap includes an anti-reflective region 244. The anti-reflective region facilitates the transmission of infrared radiation through the cap. In one embodiment, the anti-reflective region includes a bottom grating on the inner (bottom) surface of the cap and a top grating on the outer (top) surface of the cap. The gratings can have a moth-eye grating pattern or structure to facilitate the transmission of infrared radiation. The gratings may have other patterns which facilitate the transmission of infrared radiation. The gratings may be formed by etching the surfaces of the cap. Anti-reflective regions are described in, for example, co-pending U.S. patent application Ser. No. 17/612,200, filed on Nov. 17, 2021, which is already herein incorporated by reference for all purposes.

In another embodiment, the anti-reflective region includes an anti-reflection coating disposed on the front and back sides of the cap. Materials with a different reflective index may be deposited alternatively on the surfaces of the anti-reflective region. For example, materials for the anti-reflection coating may be zinc sulfide (ZnS) or germanium (Ge). Providing any other materials and deposition techniques for the anti-reflective coating may also be useful. The anti-reflective coating may be deposited on the surfaces of the cap and patterned to remain in the anti-reflective region.

A getter (not shown) may be disposed on the inner surface of the cap. The getter, for example, may be disposed on the inner surface of the cap in a recessed region adjacent to the anti-reflective region. The getter absorbs moisture and outgassing within the encapsulated device. The getter, for example, may be zirconium (Zr) alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates maintaining the integrity of the vacuum in the cavity, improving reliability.

In one embodiment, a sealing ring 282 is employed to facilitate the bonding of the cap to the substrate. The sealing ring, for example, includes a cap sealing ring 282*b* and a substrate sealing ring 282*a*. The cap sealing ring, in one embodiment, surrounds the sensor and CMOS regions. The cap and substrate sealing rings are mated, bonding the cap to the substrate. In one embodiment, the sealing rings may be a metal or metal alloy. The sealing rings may be gold-based sealing rings, such as gold, gold-tin or a combination thereof. Providing other materials and structures for the sealing rings may also be useful. In one embodiment, the sealing rings are mated by thermal compression. Other techniques for bonding the cap to the substrate by forming thermal compression bonds or eutectic bonds may also be useful.

The cap may be part of a cap wafer which is processed to form a plurality of caps. The cap wafer may be bonded to a wafer with a plurality of devices. For example, wafer-level vacuum packaging bonds the caps to the devices. The cap wafer and device wafer are diced to separate the devices into individual vacuum-packaged devices.

As described, the sensor region includes 1 sensor. However, it is understood that the sensor region may include a plurality of sensors. The sensors, for example, may be configured in a matrix format with rows and columns of sensors forming a sensor array. Each sensor, for example, may correspond to a pixel of an image, such as a thermal image.

Figure 2B:
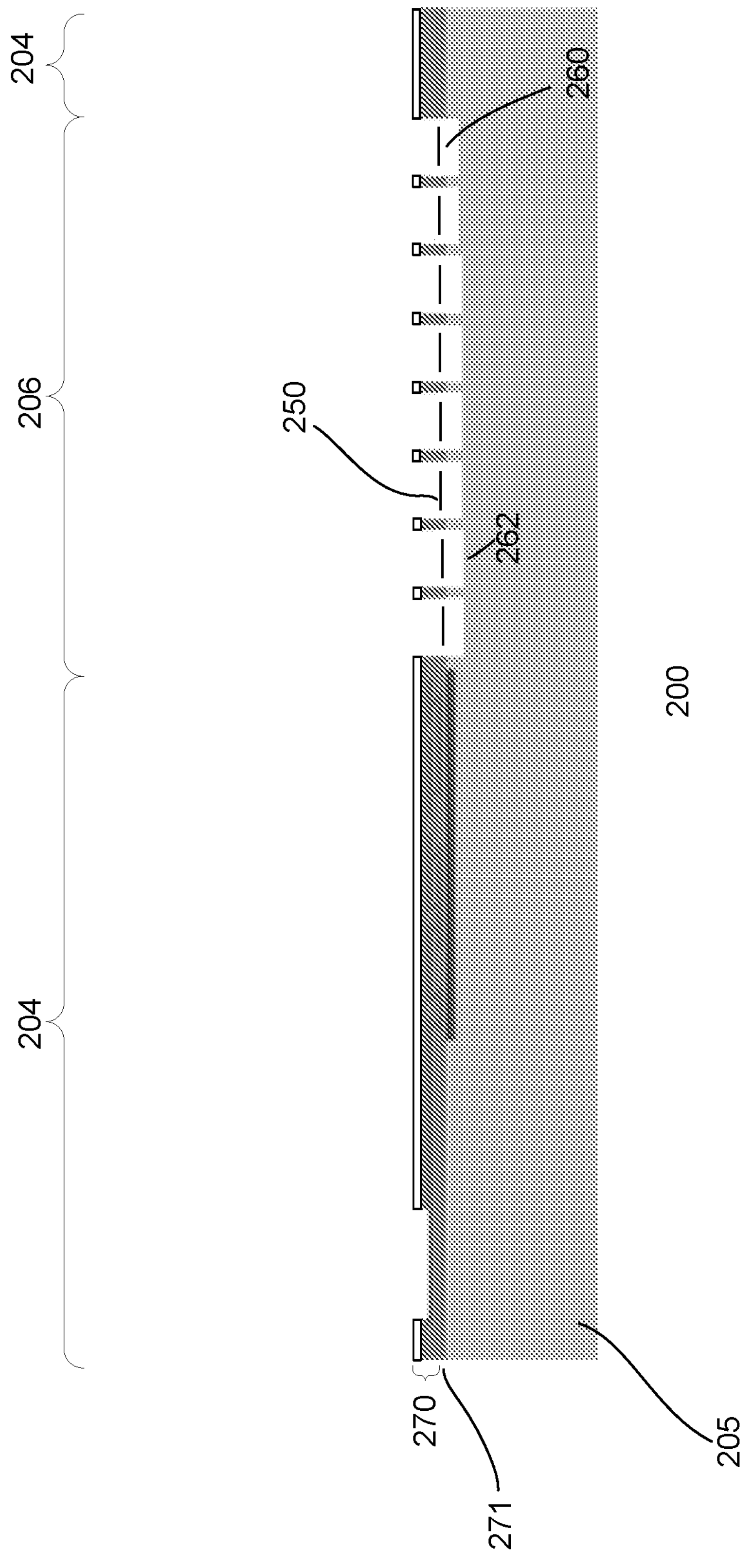
FIG. 2*b* shows a simplified cross-sectional view of another embodiment of a device.

In one embodiment, as shown in FIG. 2*b*, each sensor 250 is configured with its respective lower sensor cavity 260. For example, a matrix of sensor cavities is provided for the matrix of sensors. The sensor cavities may be separated by the substrate walls. In one embodiment, dielectric dividers are provided on top of the substrate walls between the sensor cavities. The dielectric dividers, for example, are part of the ILD layer 271 and BEOL dielectric layer 270. For example, the dielectric divider includes via contacts and interconnects for connecting to the sensors. The cap cavity may be a common cavity to the sensors above the dielectric dividers.

Figure 3A:
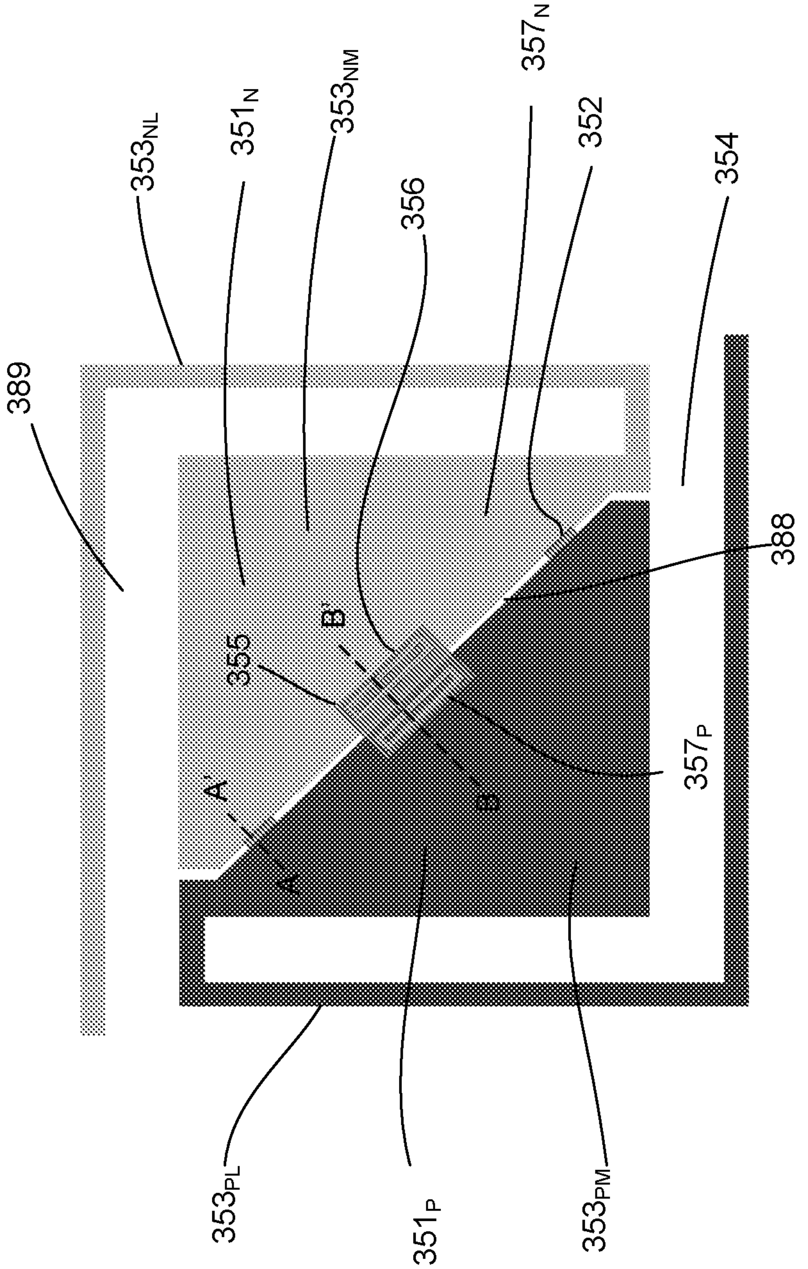
FIG. 3*a* shows a simplified top view of an embodiment of a sensor.
Figure 3B:
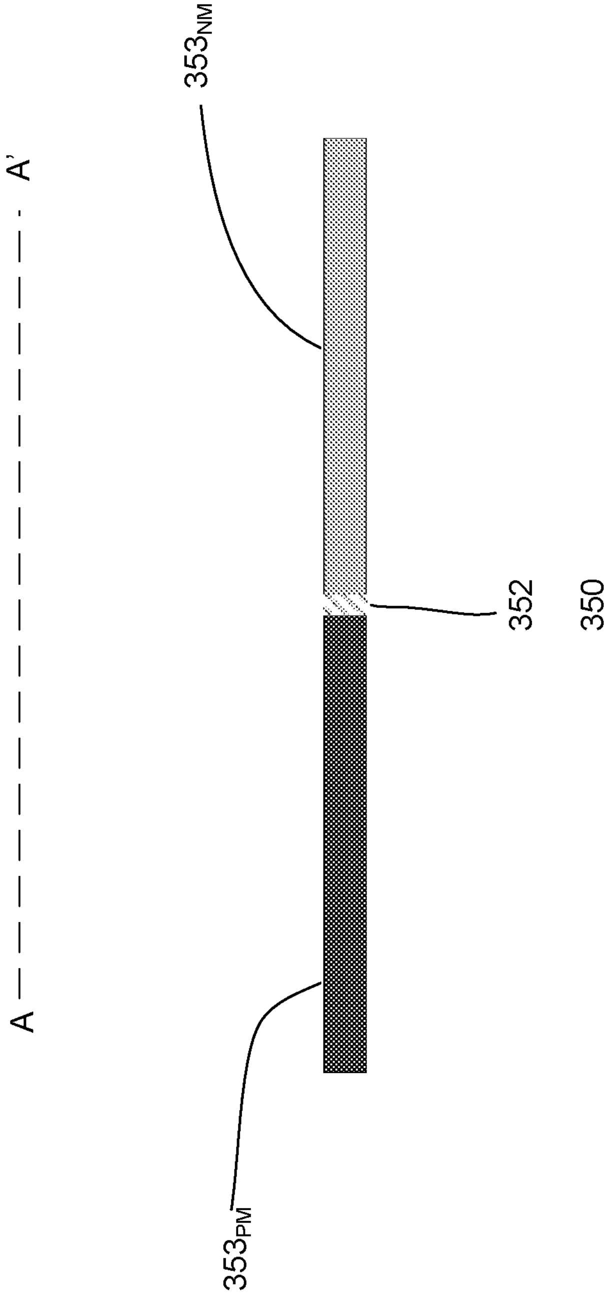
FIGS. 3*b*-3*c* show simplified cross-sectional views along A-A' and B-B' of the sensor of FIG. 3*a;*
Figure 3C:
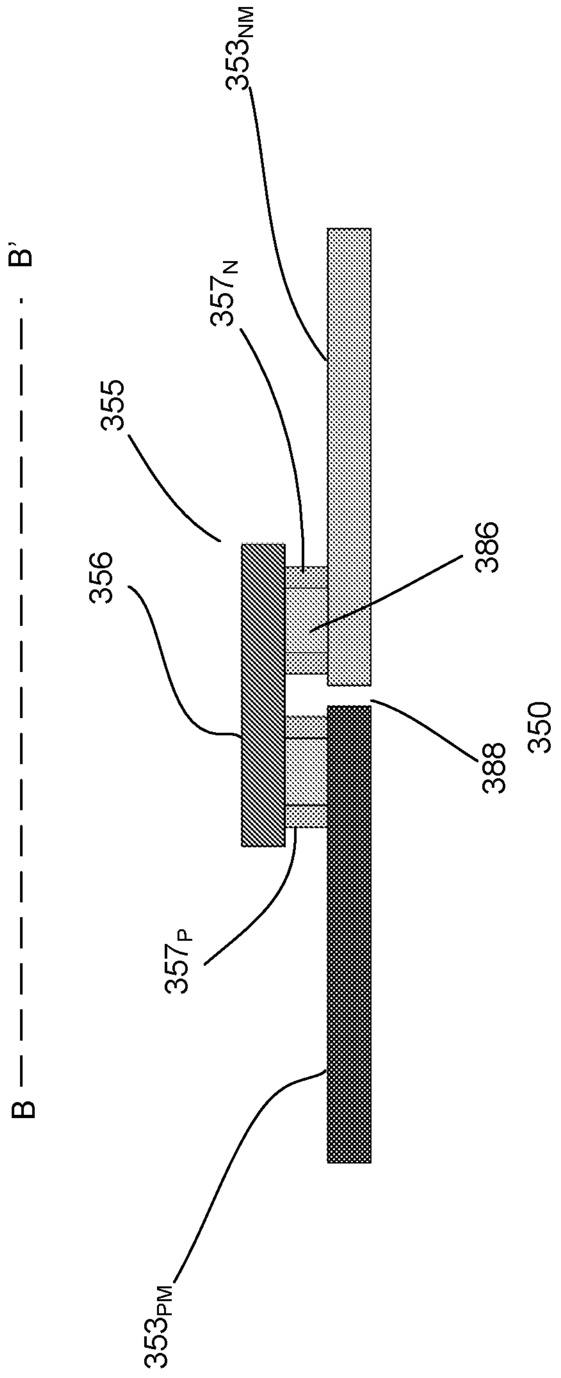
Figure 3D:
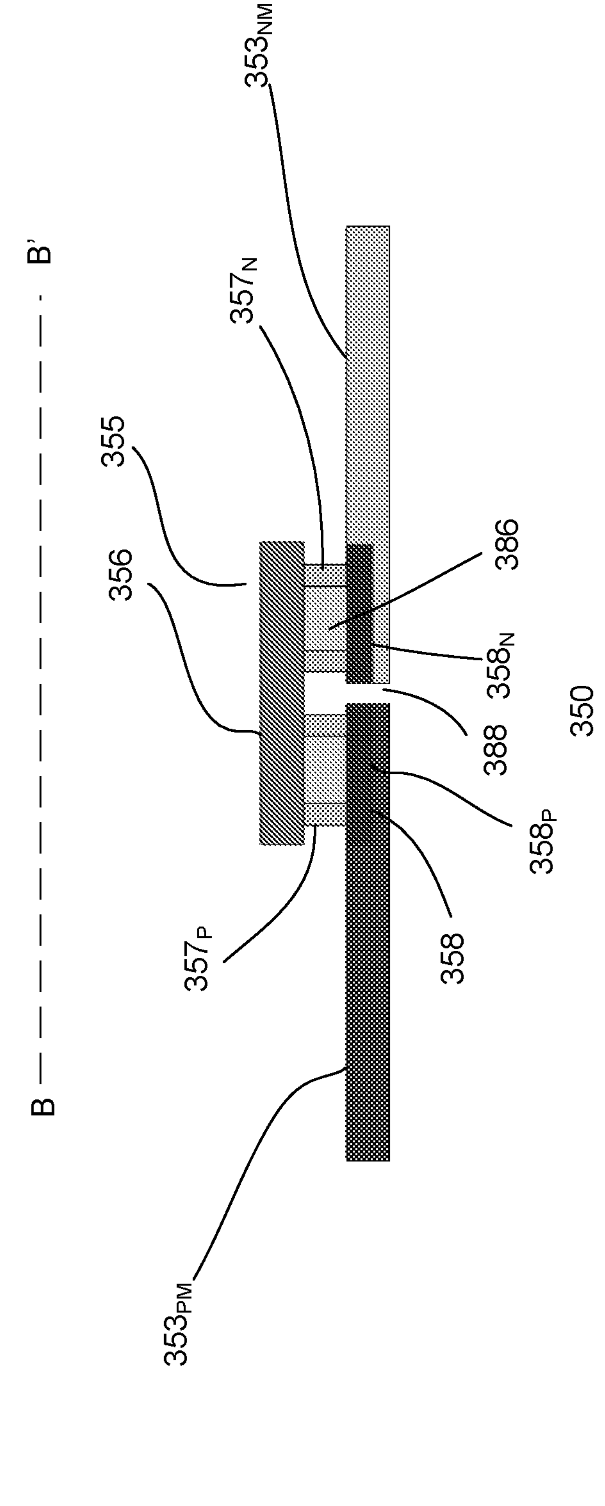
FIG. 3*d* shows a simplified cross-sectional view along B-B' of an alternative embodiment of the sensor of FIG. 3*a;*

FIG. 3*a* shows a simplified top view of an embodiment of a sensor 350. FIGS. 3*b*-3*c* show simplified cross-sectional views along A-A' and B-B' of the sensor. FIG. 3*d* shows a simplified cross-sectional view along B-B' of an alternative embodiment of the sensor. The sensor is a CMOS-compatible sensor. In one embodiment, the sensor is a thermoelectric-based infrared (IR) detector. The sensor is disposed within a sensor region of the CMOS device with an embedded sensor. As shown, the sensor includes a sensor body. The sensor body includes first and second sensor segments $\mathbf{351}_P$ and $\mathbf{351}_N$. In one embodiment, the first body segment is doped with p-type dopants and the second body segment is doped with n-type dopants. A body segment includes a main segment and a lead segment. For example, the first body segment includes a first main segment $\mathbf{353}_{PM}$ and a first lead segment $\mathbf{353}_{PL}$; the second body segment includes a second main segment $\mathbf{353}_{NM}$ and a second lead segment $\mathbf{353}_{NL}$.

In one embodiment, the first and second body segments are configured to have about the same surface area. For example, the first body segment (first main and lead segments) has about the same surface area as the second body segment (second main and lead segments). For example, the first and second body segments are essentially symmetrical. Variations in processing may occur, causing variances in the surface areas of the first and second body segments. Preferably, the variance is less than about ±5%. Providing other variances between the surface areas of the body segments may also be useful. For example, the surface area differences may be less than about ±20%.

In other embodiments, the body segments may not be symmetrical. For example, it is not crucial or necessary for the body segments to be symmetrical. In some cases, it may be desirable to have body segments which are not symmetrical. For example, in the case that p-doped poly is more efficient in IR absorption, then the p-doped body may be configured to be larger than the n-doped body segment to increase IR absorption efficiency. Other configurations of the body segments may also be useful.

In one embodiment, the sensor body is rectangular-shaped. For example, the first and second body segments, when combined, form a rectangular-shaped sensor body. In one embodiment, the first and second main segments together form a rectangular shape main segment portion of the sensor body. The first and second lead segments extend from the first and second main segments. The first and second lead segments are configured to form the rectangular-shaped sensor body. In one embodiment, the first body segment and the second body segment have similar shapes except that they are flipped vertically and horizontally. Other configurations of the sensor body segments and/or shaped sensor body may also be useful. The lead or extended segments also advantageously serve as an absorber (e.g., doped poly absorber).

As shown, a main segment is essentially a right isosceles triangular-shaped member while a lead segment is an elongated-shaped member that extends from one end of the main segment between the base and one of the sides of the isosceles triangular-shaped member. Other shaped main segments may also be useful. For example, the shapes of the sensor body may depend on design requirements such as available space. The lead segment is connected to the main segment and extends outwardly and along the sides of the isosceles-shaped member. The main segment and the lead segment are separated by an L-shaped gap 389 (e.g., main-lead gap) therebetween. The first and second main segments are similarly shaped segments except that one is flipped vertically and horizontally from the other. In one embodiment, the first and second main segments are isolated segments. In some cases, the segments may be connected by undoped anchors. In other cases, the segments are completely isolated from each other. The gaps are provided to avoid dopant diffusion.

Anchors 352 may be provided within the base gap between the bases. The anchors, for example, are connected portions of the first and second main segments within the base gap, as illustrated by FIG. 3*b*. The anchors provide additional mechanical support for the free-standing sensor body. As shown, the first and second anchors are provided proximate to opposing ends of the base gap. Other configurations of the anchors may also be useful. For example, a greater or lesser number of anchors may be provided.

In one embodiment, the sensor body is a polysilicon sensor body. Other types of materials which are stable under high temperatures having thermoelectric properties may also be used to serve as the sensor body. For example, such materials may include silicon germanium (SiGe), gallium nitride (GaN) or a 2D material, such as graphene, black phosphorus or molysulfide.

In one embodiment, the sensor body is doped with p-type and n-type dopants to form p and n regions. Doping, for example, may be achieved using ion implantation with a mask. For example, to form the p region of the sensor body, p-type dopants are implanted into the sensor body with the n region masked off, such as with a resist or implant mask. Similarly, to form the n region of the sensor body, n-type dopants are implanted into the sensor body with the p region masked off. The doping of the body segments, for example, may be integrated into the S/D doping processes of the p-type and n-type transistors. Other techniques for doping the body segments may also be useful. For example, separate doping processes may be employed to form the doped body segments.

In one embodiment, the sensor body is patterned prior to doping. For example, after the patterning process to form the sensor body (e.g., first and second body segments and anchors), it is doped to form n and p regions. The ends of the first and second lead segments serve as the first and second sensor terminals. The first and second terminals are, for example, the cold-ends of the sensor. The sensor body also includes spaces or gaps, such as the main-lead and base gaps. Other configurations of gaps may also be useful. The gaps facilitate a release process for forming the lower sensor cavity as well as creating thermal isolation between the main segments and the lead segments. The patterning process may include mask and etch processes, such as a patterned resist mask to serve as an etch mask for a reactive ion etch (RIE) process.

In the case of a polysilicon-based sensor body, it may be formed with the polysilicon layer used to form the gate electrodes. For example, the CMOS process may include a gate electrode layer for gate electrodes and may also be employed to also serve as the polysilicon sensor. In the case where the CMOS process includes more than one polysilicon gate electrode layer, the thinner polysilicon gate electrode layer may be preferably selected to serve as the polysilicon sensor. Alternatively, the gate electrode layer matching or closely matching the desired thickness of the sensor body thickness is preferably selected. In another embodiment, a separate layer may be employed to serve as the sensor body. Other configurations of forming the gate and sensor body may also be useful.

In one embodiment, a sensor body contact 355 couples the first and second body segments. As shown, the sensor body contact is disposed on the top surface of the sensor body. For example, the sensor body contact is disposed on the top surface which is opposite of the bottom surface facing the lower sensor cavity. In one embodiment, the sensor body contact is disposed at about an interface of the first and second main segments. For example, the sensor body contact is provided over the base gap between the main segments. As shown, the sensor body contact occupies a central portion of the interface of the first and second main segments between the anchors. It may be preferable to have the body contact as short as possible. However, there is a minimum length required to ensure mechanical strength and adhesion between the contact and the sensor body. The minimum length depends on, for example, the baseline design rules to accommodate the body contacts. Illustratively, the length of the sensor body is about ⅓ the total length of the base gap between the anchors. Other configurations, including the length of the sensor body contact, may also be useful.

As shown, the sensor body contact includes first and second sensor body via contacts $\mathbf{357}_P$ and $\mathbf{357}_N$ connected to the first and second body segments. Bottom surfaces of the first and second body via contacts are coupled to the first and second main segments. A sensor body interconnect 356 interconnects the top surfaces of the first and second via contacts. For example, the sensor body interconnect electrically connects the first and second body segments together. In one embodiment, the sensor body via contacts are closed loop via contacts. For example, a closed loop via contact includes a metal contact configured as a metallic ring which forms a closed loop. As shown, the via contacts are configured as rectangular-shaped metallic rings. Within the closed is a dielectric fill 386, as shown in FIG. 3*c*. The dielectric fill may be, for example, silicon oxide. Other types of dielectric materials may also be useful. The dielectric fill provides additional mechanic support for the free-standing sensor body.

The sensor body contact, in one embodiment, includes a high-temperature contact. For example, the sensor body contact can sustain subsequent process temperatures. The components of the sensor body contact may be formed of titanium (Ti), aluminum (Al), copper (Cu) or a combination thereof. Other types of high-temperature metals may also be used to form the components of the sensor body contact. The type of material used for the contact may depend on the technology node. For example, matured technology nodes may employ Al while advanced technology nodes may employ Cu.

In some embodiments, silicide contacts 358 are provided on main segments, as shown in FIG. 3*d*. The first and second silicide contacts $\mathbf{358}_P$ and $\mathbf{358}_N$ are provided in contact regions of the first and second main segments $\mathbf{351}_P$ and $\mathbf{351}_N$. As shown, the silicide contacts are provided on surface portions of the main segments where the body via contacts are disposed. For example, the first and second sensor body via contacts $\mathbf{357}_P$ and $\mathbf{357}_N$ are disposed on the first and second silicide contacts. The silicide contacts reduce the contact resistance between the main segments and via contacts. The silicide contacts may be formed by providing metal on the contact region of the sensor body followed by an anneal.

As discussed, the first and second body segments are doped with first and second dopants, such as p-type and n-type dopants. In one embodiment, the sheet resistance of the body segments is adjusted to match the ambient (atmospheric) sheet resistance, which is about 377 Ω/square. Tuning the sheet resistance of the body segments to the atmospheric sheet resistance advantageously enables the body sensor to serve as an absorber, obviating the need to use a separate absorber layer. An additional absorber, such as TiN or SiN may be disposed on the body segments even though the body sensor already serves as an absorber. This further enhances IR absorption.

In other embodiments, a separate absorber (not shown) is provided on the main segments if the sensor body does not serve as an absorber. Examples of configurations of absorbers are shown and described in FIGS. 7*a*, 7*b*, 8*a* and 8*b*. The absorber may be provided on the first and second main segments. The absorber, for example, may be formed over the patterned sensor body. The absorber layer is then patterned, followed by forming the sensor body contact.

The absorber may be provided when the sensor body sheet resistance is not tuned to the ambient sheet resistance. In other embodiments, the absorber is provided in addition to having the sensor body tuned to match the ambient sheet resistance. This may further enhance absorption.

The absorber, for example, is configured to absorb incident infrared radiation. The absorber may be a silicon nitride layer. Other types of absorbers, such as titanium nitride (TiN), nickel-chromium (NiCr) or other materials, may also be useful. In one embodiment, the absorber is configured to be part of an interferometric system which absorbs most of the incident infrared radiation. For example, the absorber interferometric system may be configured to absorb greater than 80% of incident infrared radiation having a wavelength of 8-14 μm. Providing any other configurations of the absorber may also be useful. In other embodiments, the absorber is configured to absorb incident radiation having a wavelength of 2-5 μm.

A sensor protection layer (not shown) may be provided over the absorber layer. Examples of different configurations of the sensor protection layer are shown and described in FIGS. 7*b* and 8*b*. The sensor protection layer serves to protect the sensor from subsequent etch processes. For example, the protection layer serves to protect the sensor body and absorber from etchants, such as $XeF_2/SF_6$ and VHF used in the first and second release processes. In one embodiment, a multi-layered protection layer may be employed. For example, the outer or exposed layer may be removed during the second release process, leaving an inner layer protecting the absorber after the outer layer is removed. The remaining protection layer, for example, is transparent to infrared radiation and is selective to the second release process.

The absorber may have various configurations. For example, the absorber may be separated from the sensor body by a dielectric liner, such as silicon oxide. Alternatively, the absorber may be embedded within a dielectric layer, such as silicon oxide, which is encased by a sensor protection layer, such as SiN. Other configurations of the absorber may also be useful.

Figure 4A:
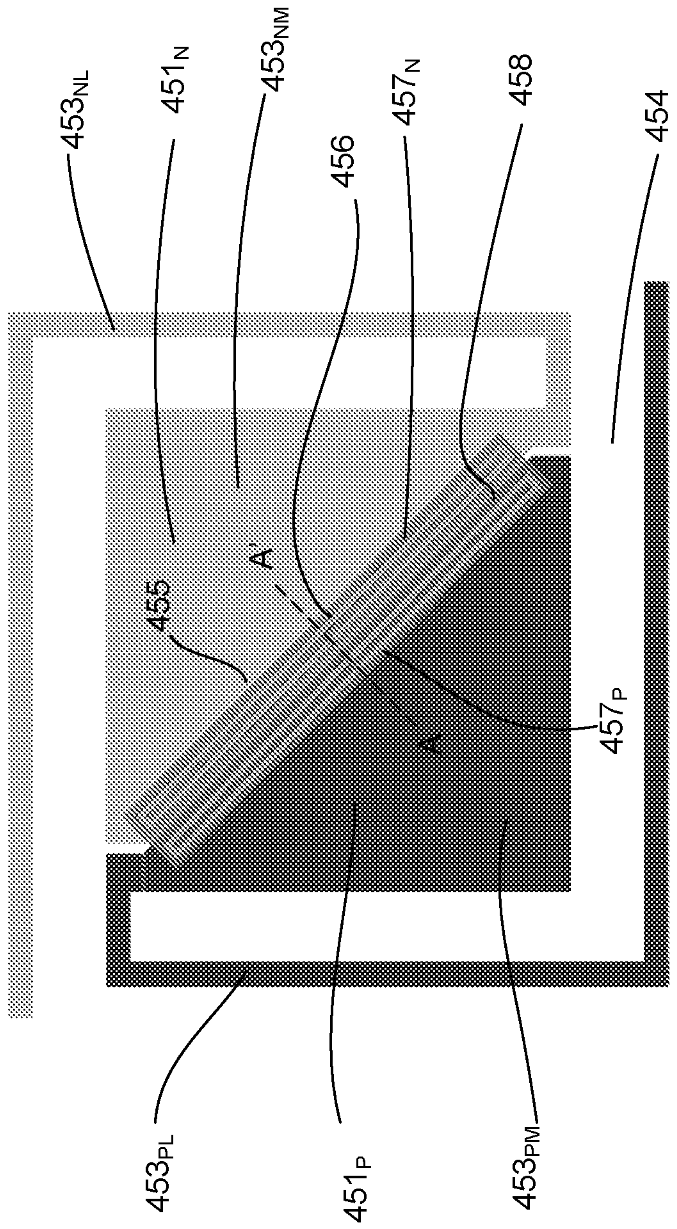
FIG. 4*a* shows a simplified top view of another embodiment of a sensor.
Figure 4B:
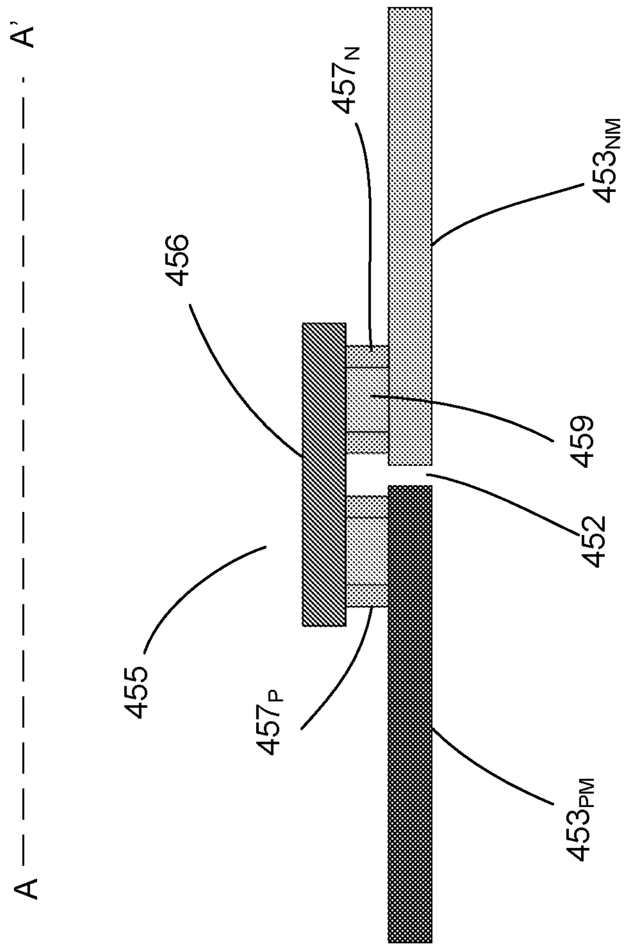
FIG. 4*b* shows a simplified cross-sectional view along A-A' of the sensor of FIG. 4*a;*
Figure 4C:
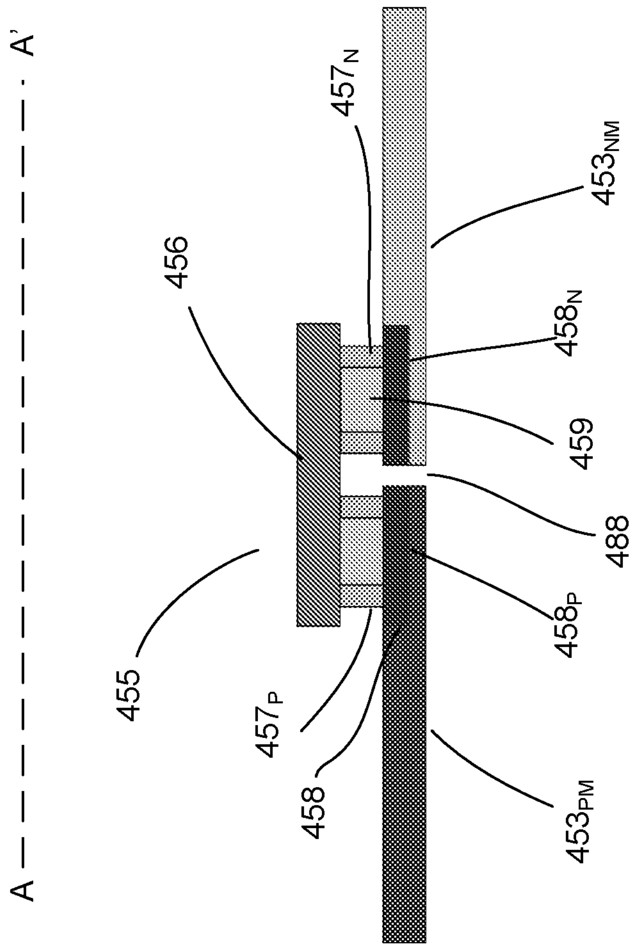
FIG. 4*c* shows a simplified cross-sectional view along A-A' of an alternative embodiment of the sensor of FIG. 4*a;*

FIG. 4*a* shows a simplified top view of an embodiment of a sensor 450. FIG. 4*b* shows a simplified cross-sectional view along A-A' of the sensor. FIG. 4*c* shows a simplified cross-sectional view along A-A' of an alternative embodiment of the sensor. The sensor is a CMOS-compatible sensor. The sensor is similar to the sensor described in FIGS. 3*a*-3*d*. Common elements may not be described or described in detail.

As shown, the sensor includes a sensor body with first and second sensor segments $\mathbf{451}_P$ and $\mathbf{451}_N$. The first body segment, for example, is doped with p-type dopants and the second body segment is doped with n-type dopants. The first body segment includes a first main segment $\mathbf{453}_{PM}$ and a first lead segment $\mathbf{453}_{PL}$; the second body segment includes a second main segment $\mathbf{453}_{NM}$ and a second lead segment $\mathbf{453}_{NL}$.

A sensor body contact 455 is provided to electrically connect the first and second body segments. The sensor body contact includes first and second sensor body via contacts $\mathbf{457}_P$ and $\mathbf{457}_N$ connected to the first and second body segments. A sensor body interconnect 456 interconnects the body via contacts. The sensor body via contacts, for example, are closed loop via contacts.

Unlike the embodiments of FIGS. 3*a*-3*d*, the sensor body contact occupies a major central portion of the interface of the first and second main segments. As shown, the length of the sensor body contact occupies about 80-90% of the base gap at the interface of the main segments. By having such a long body contact, it provides sufficient mechanical stability and adhesive to avoid the need for anchors. By eliminating the need for anchors, dopant interdiffusion between the first and second body segments is avoided. For example, without the anchors, the first and second body segments are completely isolated from each other. However, it is understood that, although anchors are not needed, they may still be provided. In addition, a larger contact reduces contact resistance. However, this is at the expense of reduced absorber area. Even with the reduced absorber area, the sensor should still have adequate absorption. Other configurations of the sensor body contact may also be useful. Furthermore, to further reduce contact resistance, silicide contacts 458 may be provided on main segments, as shown in FIG. 4*c*.

Figure 5A:
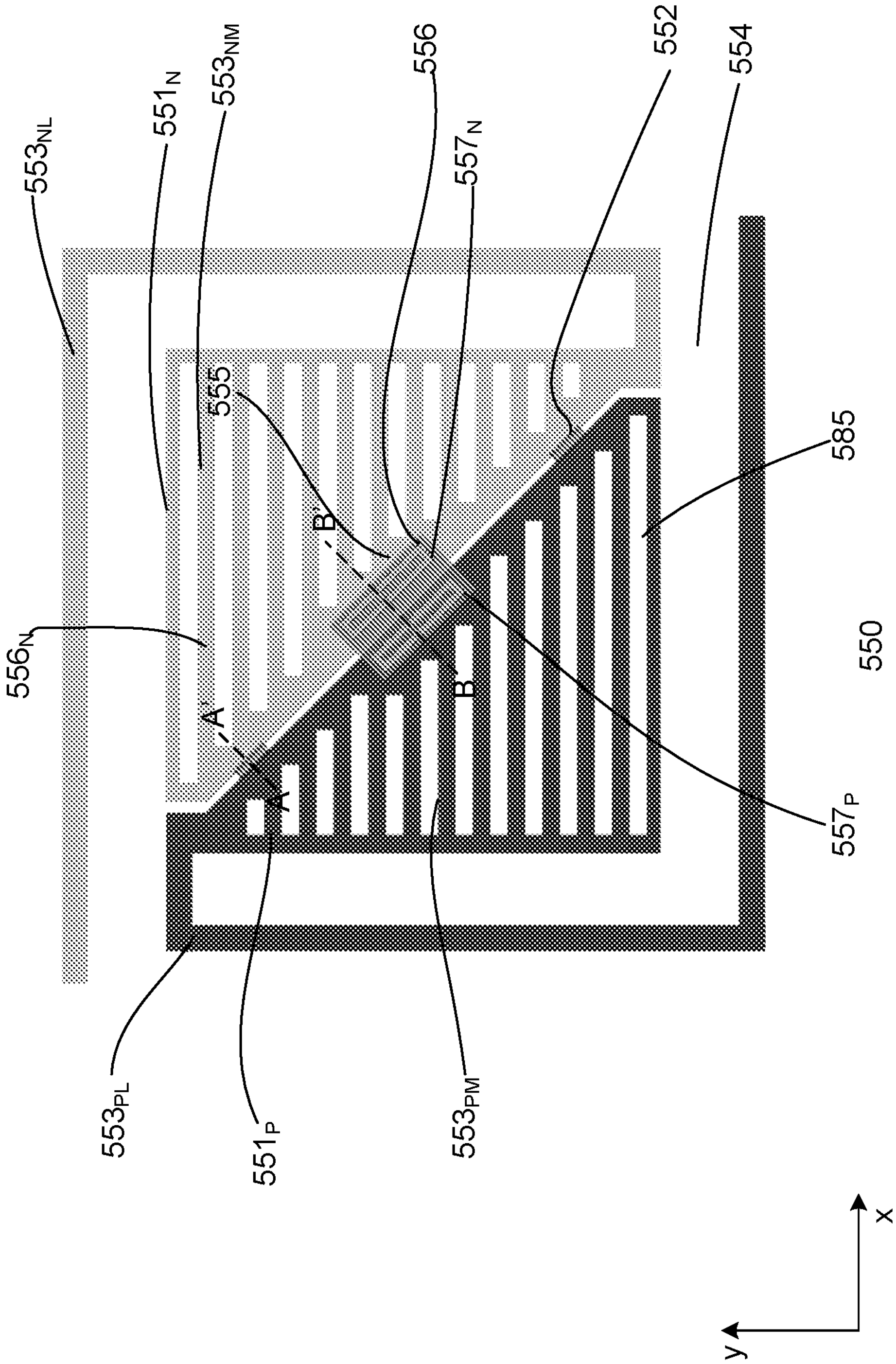
FIG. 5*a* shows a simplified top view of another embodiment of a sensor.
Figure 5B:
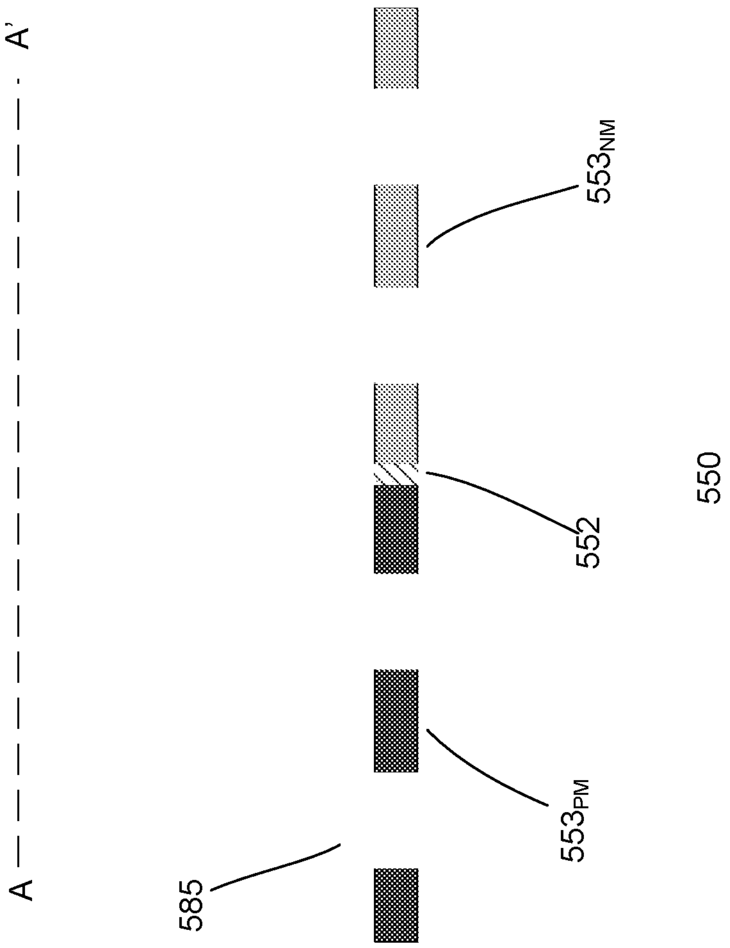
FIGS. 5*b*-5*c* show simplified cross-sectional views along A-A' and B-B' of the sensor of FIG. 5*a;*
Figure 5C:
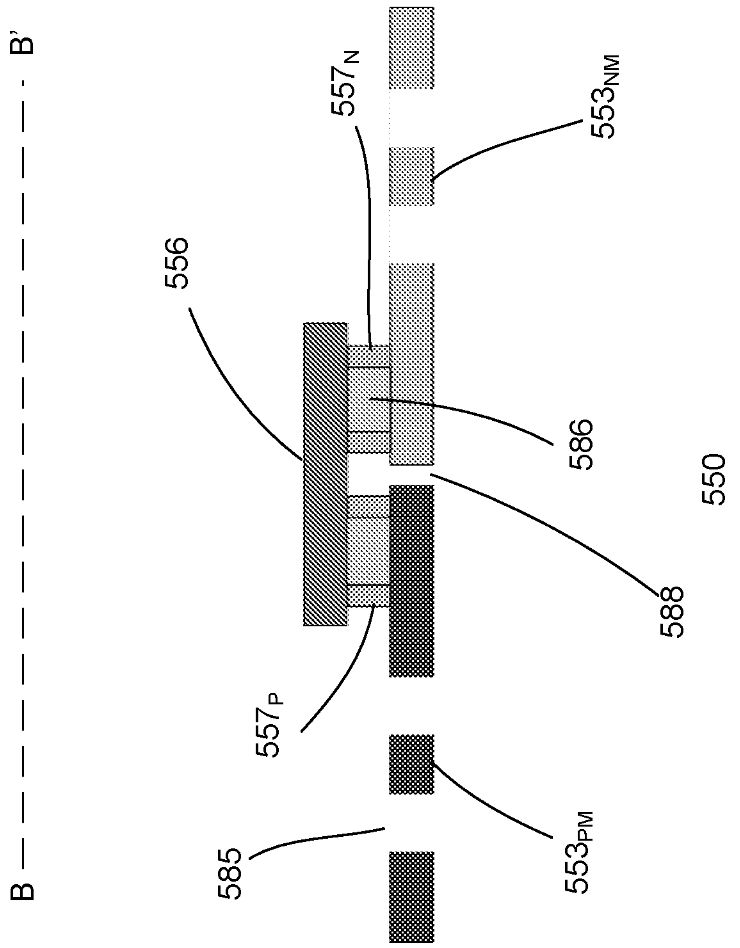
Figure 5D:
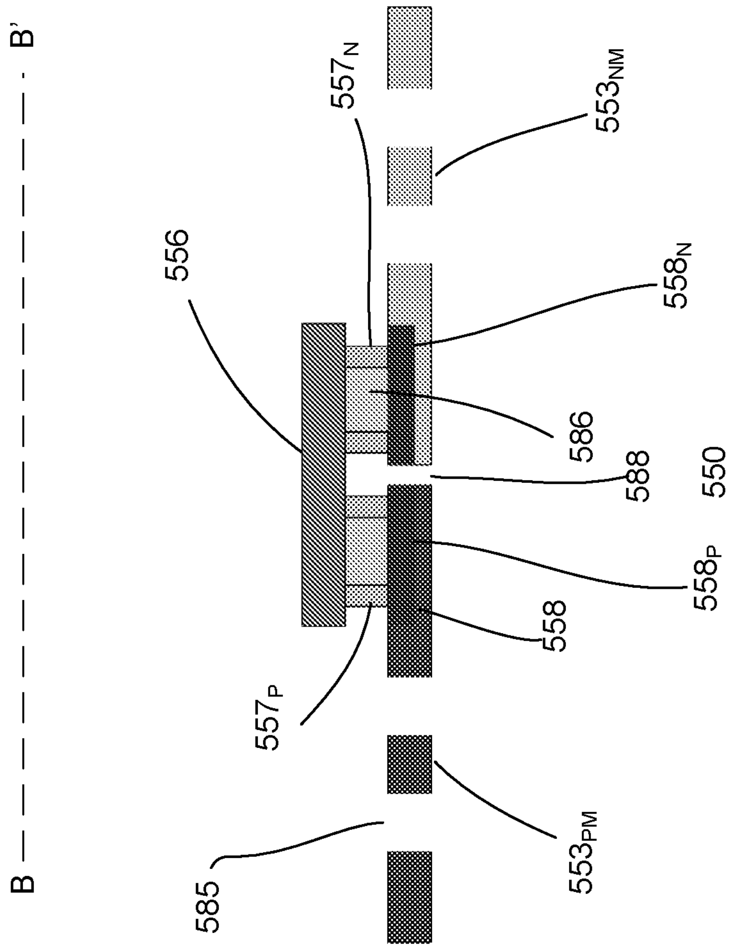
FIG. 5*d* shows a simplified cross-sectional view along B-B' of an alternative embodiment of the sensor of FIG. 5*a;*

FIG. 5*a* shows a simplified top view of another embodiment of a sensor 550. FIGS. 5*b*-5*c* show simplified cross-sectional views along A-A' and B-B' of the sensor. FIG. 5*d* shows a simplified cross-sectional view along B-B' of an alternative embodiment of the sensor. The sensor is a CMOS-compatible sensor. The sensor is similar to the sensors described in FIGS. 3*a*-3*d* and 4*a*-4*d*. Common elements may not be described or described in detail.

As shown, the sensor includes a sensor body with first and second sensor segments $\mathbf{551}_P$ and $\mathbf{551}_N$. The first body segment includes a first main segment $\mathbf{553}_{PM}$ and a first lead segment $\mathbf{553}_{PL}$; the second body segment includes a second main segment $\mathbf{553}_{NM}$ and a second lead segment $\mathbf{553}_{NL}$. The sensor body may include anchors 552 within the base gap between the main segments. In one embodiment, first and second anchors are provided proximate to opposing ends of the base gap 588. Other configurations of the anchors may also be useful. For example, a greater or lesser number of anchors may be provided.

A sensor body contact 555 electrically connects the first and second body segments. The sensor body contact includes first and second sensor body via contacts $\mathbf{557}_P$ and $\mathbf{557}_N$ connected to the first and second body segments. A sensor body interconnect 556 interconnects the body via contacts. The sensor body via contacts, for example, are closed loop via contacts. As shown, the sensor body contact occupies a central portion of the interface of the first and second main segments between the anchors. The sensor contact should have a minimum length to ensure sufficient mechanical stability of the free-standing sensor body. Anchors can be provided to provide additional support. In the case that the sensor body contact is sufficiently long, anchors may be eliminated. It is understood that the larger the sensor body contact, the lower the contact resistance. Also, the larger the sensor body contact, the smaller the absorber is. This reduces absorption efficiency. As shown, the length of the sensor body is about ⅓ the total length of the base gap between the anchors. Other configurations of the sensor body contact may also be useful. In some embodiments, silicide contacts 558 are provided on main segments, as shown in FIG. 5*d*, to reduce contact resistance.

Unlike the embodiments of FIGS. 3*a*-3*d*, the main segments include openings or gaps 585 For example, main segments include main segment gaps. When patterning to form the sensor body, main segment gap patterns may be included for the first and second main segments. For example, the first main segment is patterned to form a first main segment gap pattern with first segment gaps; the second main segment is patterned to form a second main segment gap pattern with second segment gaps. The first and second main segment gap patterns may be similar. For example, the first and second segments have the same shape except that one is flipped vertically and horizontally from the other.

The gaps reduce or minimize the thermal capacity of the sensor body. The absorber can be provided to the sensor body. In one embodiment, in the case of metallic absorbers, the sheet resistance should be configured to have ambient sheet resistance to enhance or maximize IR absorption or to reduce or minimize reflection. Other configurations of absorbers may also be useful.

In one embodiment, the gap patterns include a plurality of slots or elongated openings along a first direction. As shown, the slots are along the x-direction. Alternatively, the slots may be along the second or y-direction. Providing other configurations of gap patterns may also be useful. The pattern, in particular, dimensions and spacing should be selected to improve absorption. For example, the spacing or gaps or openings should be less than ¼ wavelength to avoid impacting absorption. For example, openings may be a matrix of openings, such as square, rectangular, circle, oval, other geometric shapes or a combination thereof. For example, it may also include a combination of different-shaped openings as well as a combination of elongated and isolated openings in first or second directions. In a preferred embodiment, the gap pattern is configured to maximize the surface area of the openings or gaps within a body segment. The gap pattern should still provide the necessary mechanical stability.

Figure 6A:
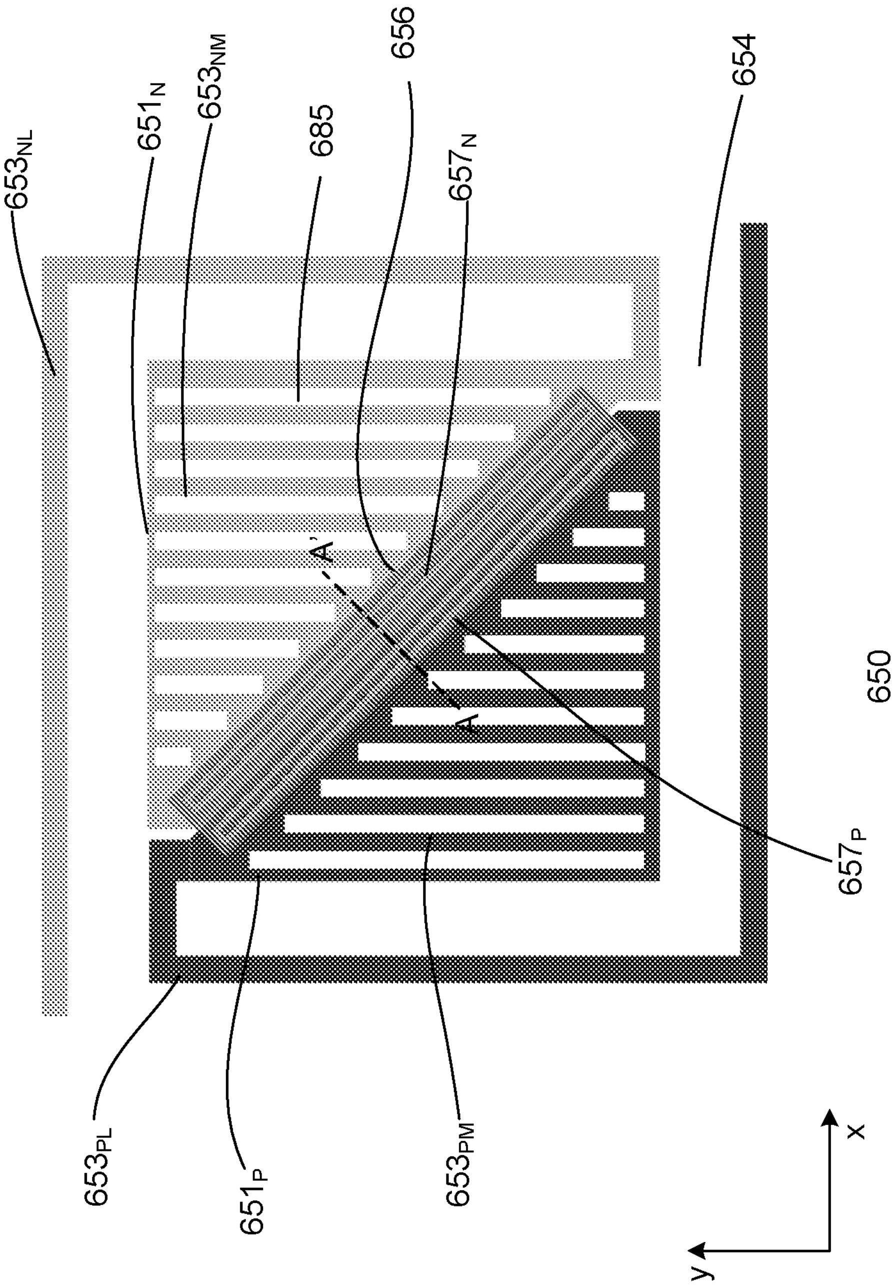
FIG. 6*a* shows a simplified top view of another embodiment of a sensor.
Figure 6B:
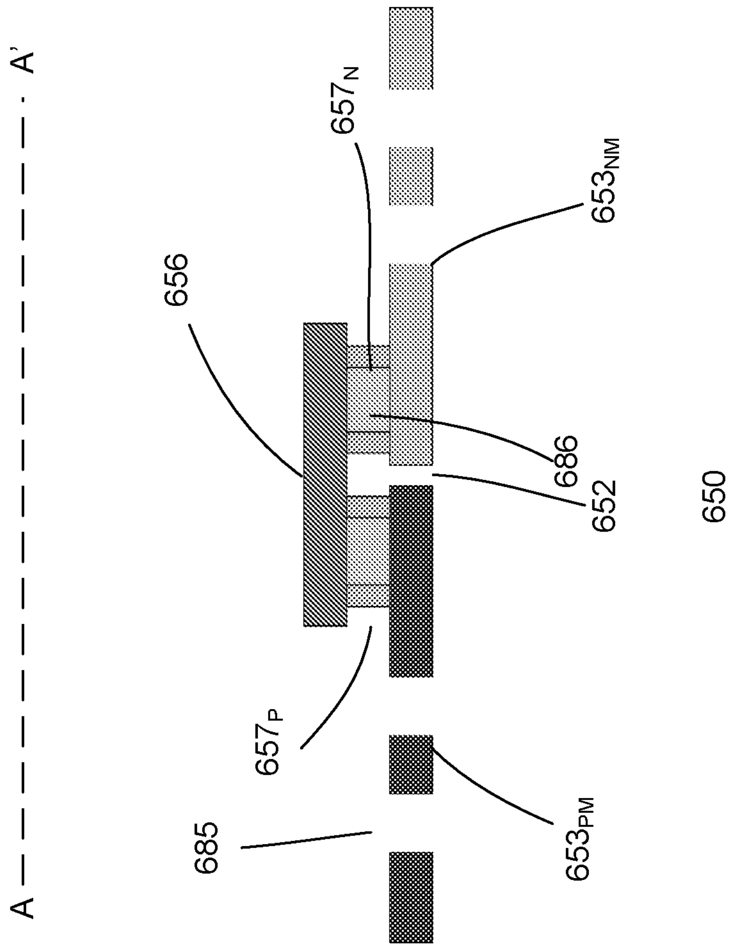
FIG. 6*b* shows a simplified cross-sectional view along A-A' of the sensor of FIG. 6*a;*
Figure 6C:
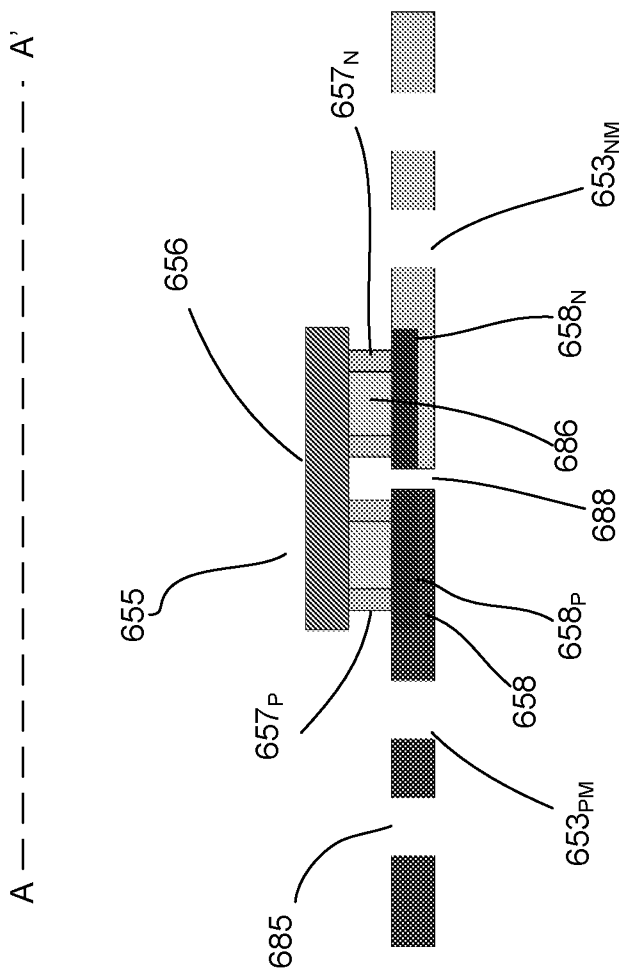
FIG. 6*c* shows a simplified cross-sectional view along A-A' of an alternative embodiment of the sensor of FIG. 6*a;*

FIG. 6*a* shows a simplified top view of another embodiment of a sensor 650. FIG. 6*b* shows a simplified cross-sectional view along A-A' of the sensor. FIG. 6*c* shows a simplified cross-sectional view along A-A' of an alternative embodiment of the sensor. The sensor is a CMOS-compatible sensor. The sensor is similar to the sensors described in FIGS. 3*a*-3*d*, 4*a*-4*d* and 5*a*-5*d*. Common elements may not be described or described in detail.

As shown, the sensor includes a sensor body with first and second sensor segments $\mathbf{651}_P$ and $\mathbf{651}_N$. The first body segment includes a first main segment $\mathbf{653}_{PM}$ and a first lead segment $\mathbf{653}_{PL}$; the second body segment includes a second main segment $\mathbf{653}_{NM}$ and a second lead segment $\mathbf{653}_{NL}$.

A sensor body contact 655 electrically connects the first and second body segments. The sensor body contact includes first and second sensor body via contacts $\mathbf{657}_P$ and $\mathbf{657}_N$ connected to the first and second body segments. A sensor body interconnect 656 interconnects the body via contacts. The sensor body via contacts, for example, are closed loop via contacts. As shown, similar to FIGS. 4*a*-4*c*, the sensor body contact occupies a major central portion of the interface of the first and second main segments. As shown, the length of the sensor body contact occupies about 80-90% of the base gap at the interface of the main segments. The mechanical stability provided by the body contact eliminates the need for anchors. Other configurations of the sensor body contact may also be useful. In some embodiments, silicide contacts 658 are provided on main segments, as shown in FIG. 6*c*, to reduce contact resistance.

Similar to FIGS. 5*a*-5*d*, the main segments include openings or gaps 685. For example, main segments include main segment gaps. When patterning to form the sensor body, main segment gap patterns may be included for the first and second main segments. For example, the first main segment is patterned to form a first main segment gap pattern with first segment gaps; the second main segment is patterned to form a second main segment gap pattern with second segment gaps. The first and second main segment gap patterns may be similar. For example, the first and second segments have the same shape except that one is flipped vertically and horizontally from the other.

The gaps reduce or minimize the thermal capacity of the sensor body. The absorber can be provided to enhance IR absorption. In the case that the absorber is metallic, it should be configured to have an ambient sheet resistance to optimize absorption or minimize reflection.

In one embodiment, the gap patterns include a plurality of slots or elongated openings along a second direction. As shown, the slots are along the y-direction. Alternatively, the slots may be along the x-direction. Providing other configurations of gap patterns may also be useful. For example, openings may be a matrix of openings, such as square, rectangular, circle, oval, other geometric shapes or a combination thereof. For example, may include a combination of different-shaped openings as well as a combination of elongated and isolated openings in first or second directions. The pattern, such as dimensions and spacing, should be selected to improve absorption. For example, the spacing or gaps or openings should be less than ¼ wavelength to avoid impacting absorption. In a preferred embodiment, the gap pattern is configured to provide sufficient mechanical stability to maintain the free-standing sensor body physically intact without impacting absorption and maximize the surface area of the openings or gaps within a body segment.

Figure 7A:
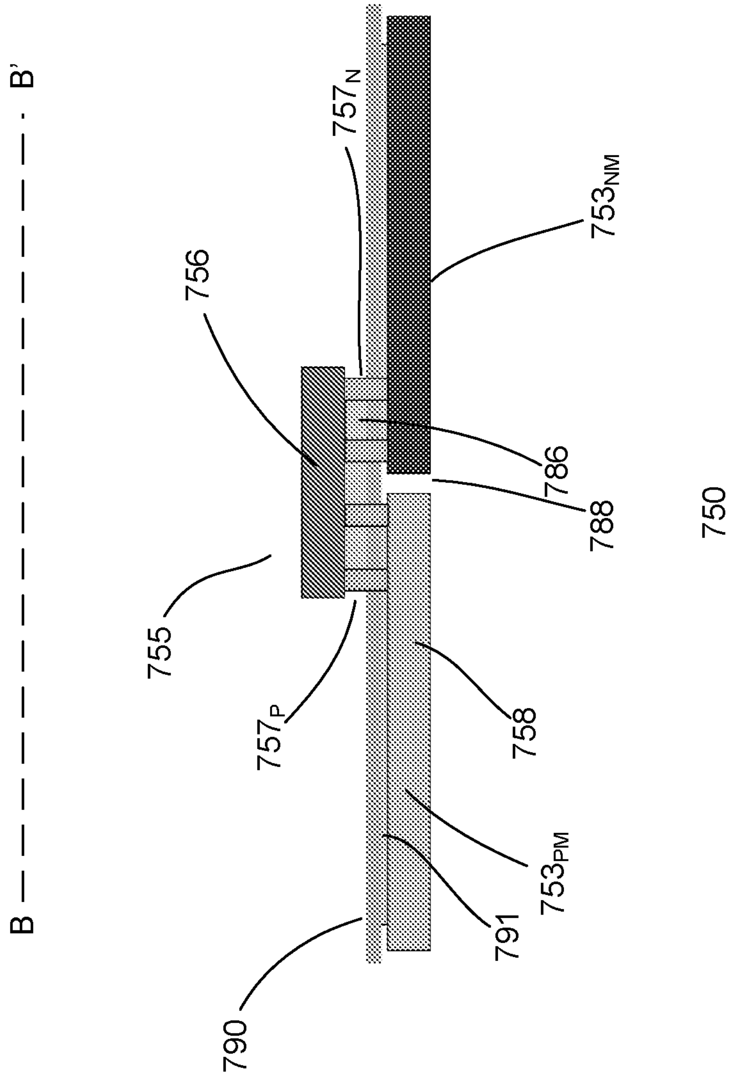
FIG. 7*a* shows a simplified cross-sectional view of an embodiment of a sensor along B-B'.

FIG. 7*a* shows a simplified cross-sectional view of an embodiment of a sensor along B-B'. The sensor is similar to the sensors described in FIGS. 3*a*-3*d* and 4*a*-4*d*. Common elements may not be described or described in detail.

A portion of the sensor body shown includes with first and second main segments $\mathbf{753}_{PM}$ and $\mathbf{753}_{NM}$. The main segments include a base gap 788 separating them. A sensor body contact 755 electrically connects the first and second main segments. The sensor body contact includes first and second sensor body via contacts $\mathbf{757}_P$ and $\mathbf{757}_N$ connected to the first and second main segments. A sensor body interconnect 756 interconnects the body via contacts. The sensor body via contacts, for example, are closed loop via contacts. To reduce contact resistance, silicide contacts (not shown) may be provided on main segments.

In one embodiment, an absorber 790 is disposed over the sensor body. As shown, the absorber is disposed over the main segments of the sensor body. As previously discussed, the absorber may also be disposed over the lead segments of the sensor body. The absorber, for example, is configured to absorb incident infrared radiation. The absorber may be a SiN layer. Other types of absorbers may also be useful. The absorber layer should be resistant to the etchant of the second release process. The thickness of the absorber may be about 30-100 nm. Other thicknesses may also be useful.

In one embodiment, a dielectric liner 791 may be provided between the absorber and sensor body. The dielectric liner, for example, may be silicon oxide. Other types of dielectric liners may also be useful. The dielectric liner may be provided to reduce film stress and improve adhesive between the sensor body and the absorber layer. For example, the silicon oxide liner layer may reduce stress and improve adhesion between the polysilicon sensor body and the silicon nitride absorber layer. The dielectric liner and absorber may be referred to as an absorber stack. As shown, the absorber includes absorber studs to protect the sidewalls of the dielectric liner. For example, the dielectric liner is encased within the absorber. This prevents the dielectric liner from being eroded during the release processes to form the free-standing sensor and lower sensor cavity. The studs may be formed by patterning the dielectric liner to form a stud trench. The stud trench, for example, surrounds a main segment and a lead segment. For example, first and second stud trenches are formed for the first and second sensor body segments. The absorber is formed on the dielectric liner, filling the stud trenches and tops of the dielectric liner. The absorber stack is patterned to cover the patterned sensor body. For example, the absorber stack is patterned to cover the main segments of the sensor body. As shown, the dielectric liner below the absorber over the base gap 788 is removed during the release processes.

Figure 7B:
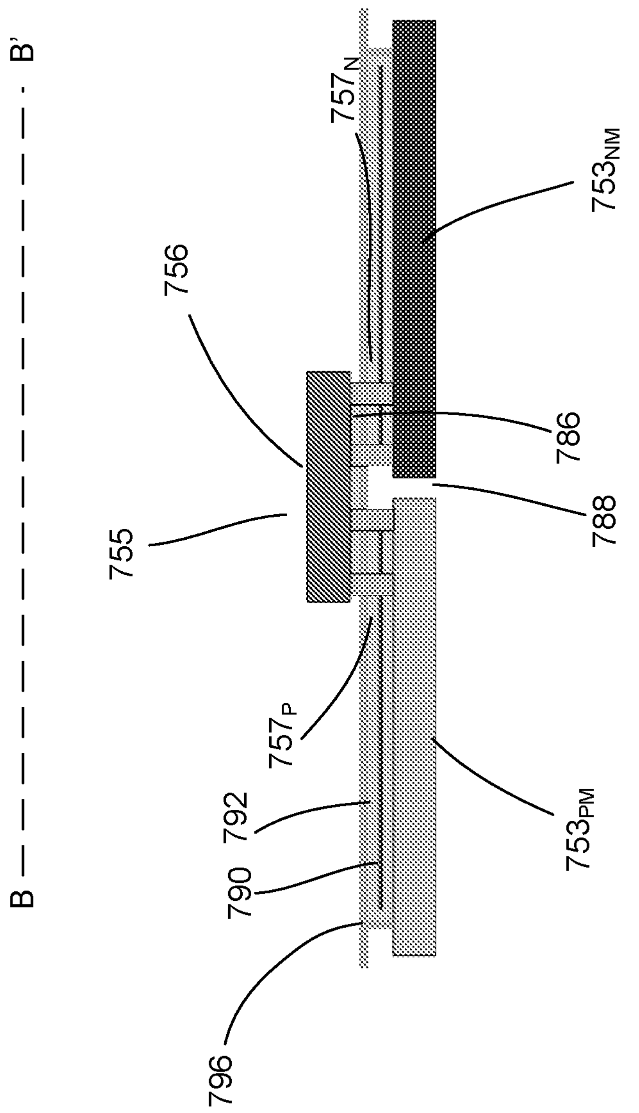
FIG. 7*b* shows a simplified cross-sectional view of another embodiment of a sensor along B-B'.

FIG. 7*b* shows a simplified cross-sectional view of another embodiment of a sensor along B-B'. The sensor is similar to the sensors described in FIGS. 3*a*-3*d*, 4*a*-4*d* and 7*a*. Common elements may not be described or described in detail.

A portion of the sensor body shown includes with first and second main segments $\mathbf{753}_{PM}$ and $\mathbf{753}_{NM}$ electrically coupled by a sensor body contact 755. In one embodiment, an absorber 790 is disposed over the sensor body. As shown, the absorber is embedded within an absorber protection stack. In one embodiment, the absorber is embedded in an inner protection layer 792 which is encased by an outer protection layer 796. In one embodiment, the inner and outer protection layers are dielectrics. The inner dielectric layer may be silicon oxide while the outer protection layer may be SiN. Other configurations of the protection absorber stack may also be useful. As for the absorber layer, it may be TiN. Other types of absorbers, such as NiCr, may also be useful. In the case of a metallic absorber, its thickness may be tuned such that the absorber has a sheet resistance which matches the ambient sheet resistance. As for the protection absorber stack, the thickness of the inner dielectric layer may be about 100 nm while the thickness of the outer protection layer may be about 50-100 nm. Other thicknesses for the various layers may also be useful.

To form the protected absorber stack, a first dielectric layer may be formed on the sensor body, followed by forming the absorber thereover. After forming the absorber, it is patterned to define the absorber over the sensor segments. A second dielectric layer is formed over the absorber. This, for example, forms a dielectric absorber stack. The dielectric absorber stack may be patterned to form stud trenches followed by forming the sensor protection layer. The sensor protection layer covers the stud trenches and the surface of the dielectric absorber stack. The protected absorber stack is patterned to be over the sensor body. As shown, the dielectric layer below the absorber over the base gap 788 is removed during the release processes.

Figure 8A:
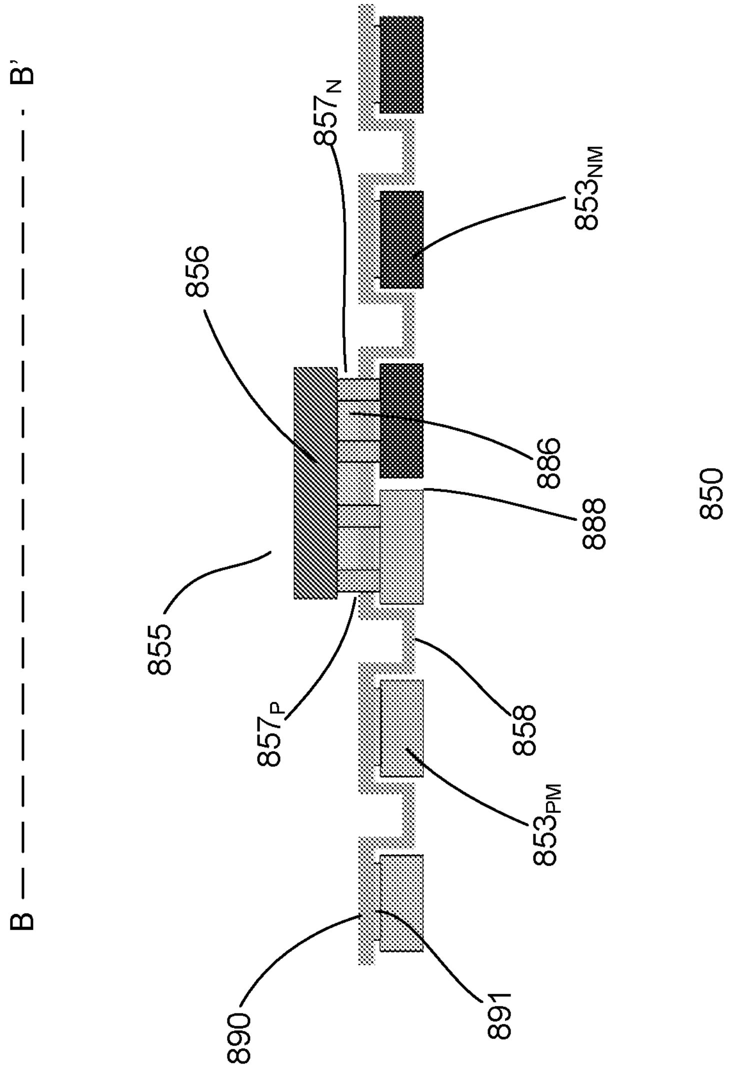
FIG. 8*a* shows a simplified cross-sectional view of another embodiment of a sensor along B-B'.

FIG. 8*a* shows a simplified cross-sectional view of another embodiment of a sensor along B-B'. The sensor is similar to the sensors described in FIGS. 3*a*-3*d*, 4*a*-4*d*, 5*a*-5*d*, 6*a*-6*d* and 7*a*-7*b*. Common elements may not be described or described in detail.

A portion of the sensor body shown includes with first and second main segments $\mathbf{853}_{PM}$ and $\mathbf{853}_{NM}$ electrically coupled by a sensor body contact 855. The main segments include segment gaps 858.

In one embodiment, an absorber 890 is disposed over the sensor body. As shown, the absorber is disposed over the main segments of the sensor body. In one embodiment, a dielectric liner 891 may be provided between the absorber and sensor body. The dielectric liner and absorber may be referred to as a lined absorber stack. In one embodiment, the lined absorber stack is a conformal stack. For example, the lined absorber stack conforms to the topography of the sensor body. The lined absorber stack may be formed after the sensor body is defined. The dielectric liner, for example, may be silicon oxide. For example, the dielectric liner is configured to reduce film stress and improve adhesion between the sensor body and absorber layer. Other types of dielectric liners may also be useful.

As shown, the absorber includes absorber studs to protect the sidewalls of the dielectric liner over the sensor body. For example, the dielectric liner on the top surface of the sensor body is encased within the absorber. This prevents the dielectric liner from being eroded during the release processes to form the free-standing sensor and lower sensor cavity. The studs may be formed by patterning the dielectric liner, which is conformal to the sensor body, to form first and second stud trenches for the first and second sensor body segments. The absorber is formed on the patterned dielectric liner, filling the stud trenches and the top surface of the dielectric liner. The lined absorber stack is patterned to be disposed over the sensor body. As shown, the dielectric liner outside of the absorber studs and below the absorber over the base gap 888 is removed during, for example, the second release process.

Figure 8B:
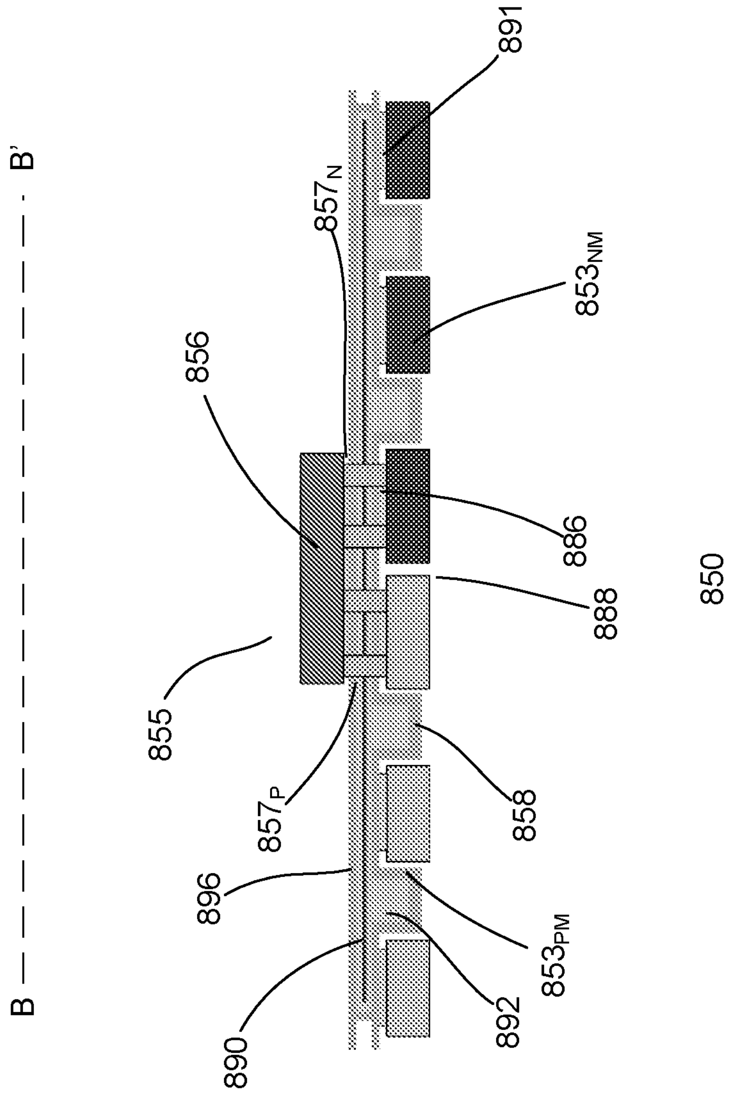
FIG. 8*b* shows a simplified cross-sectional view of another embodiment of a sensor along B-B'.

FIG. 8*b* shows a simplified cross-sectional view of another embodiment of a sensor along B-B'. The sensor is similar to the sensors described in FIGS. 3*a*-3*d*, 4*a*-4*d*, 5*a*-5*d*, 6*a*-6*d*, 7*a*-7*b* and 8*a*. Common elements may not be described or described in detail.

A portion of the sensor body shown includes with first and second main segments $\mathbf{853}_{PM}$ and $\mathbf{853}_{NM}$ electrically coupled by a sensor body contact 855. The main segments include segment gaps 858.

In one embodiment, a protected absorber stack is disposed over the sensor body. The protected absorber stack is conformal to the topography of the sensor body. As shown, the protected absorber stack is disposed over the sensor body. In one embodiment, the protected absorber stack includes an absorber 890 embedded in a dielectric layer 892 which is completely encased by sensor protection layer 896. For example, the dielectric layer is encased by upper and lower sensor protection layers and sensor protection studs. In one embodiment, a dielectric liner 891 is disposed between the sensor body and protected absorber stack.

To form the protected absorber stack, a dielectric liner is conformally formed over the sensor body. The dielectric liner is patterned to form first or liner stud trenches on the sensor body. A lower sensor protection layer is formed on the dielectric liner. The lower sensor protection layer fills the line stud trenches and the surface of the liner. After forming the lower sensor protection layer, a lower dielectric layer is formed thereover. The lower dielectric layer, for example, fills the gaps between the segment gaps and covers the top surface of the lower sensor protection layer. The absorber is formed on the lower dielectric layer. The absorber is patterned to be over the sensor body. An upper dielectric layer is formed over the lower dielectric layer and absorber. The dielectric absorber stack is patterned to form second or upper stud trenches of the upper and lower dielectric layer. An upper sensor protection layer is formed, filling the upper stud trenches and covering the upper dielectric layer. The protected absorber stack and dielectric liner are patterned to be over the sensor body. As shown, the dielectric liner outside of the lower studs and over the base gap 888 is removed during, for example, the second release process.

Figure 9A:
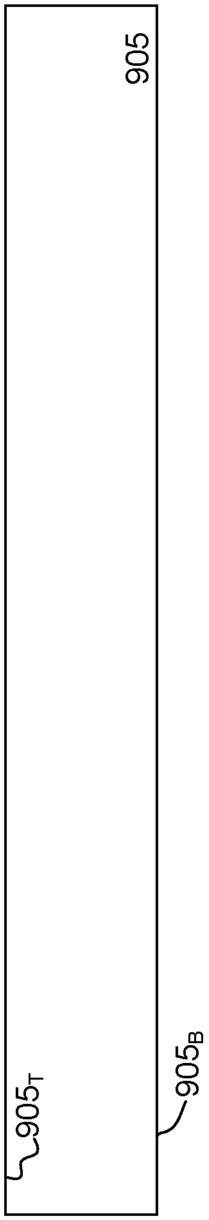
FIGS. 9*a*-9*q* show cross-sectional views of an embodiment of a process for forming a device.
Figure 9B:
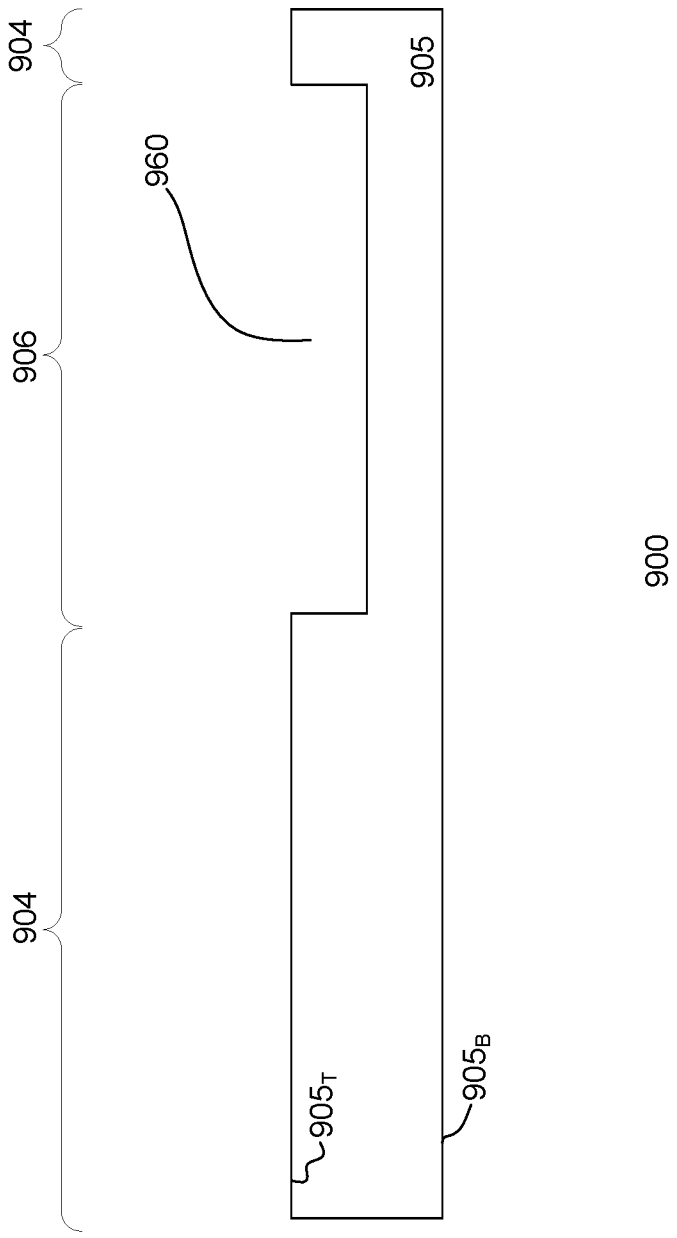
Figure 9C:
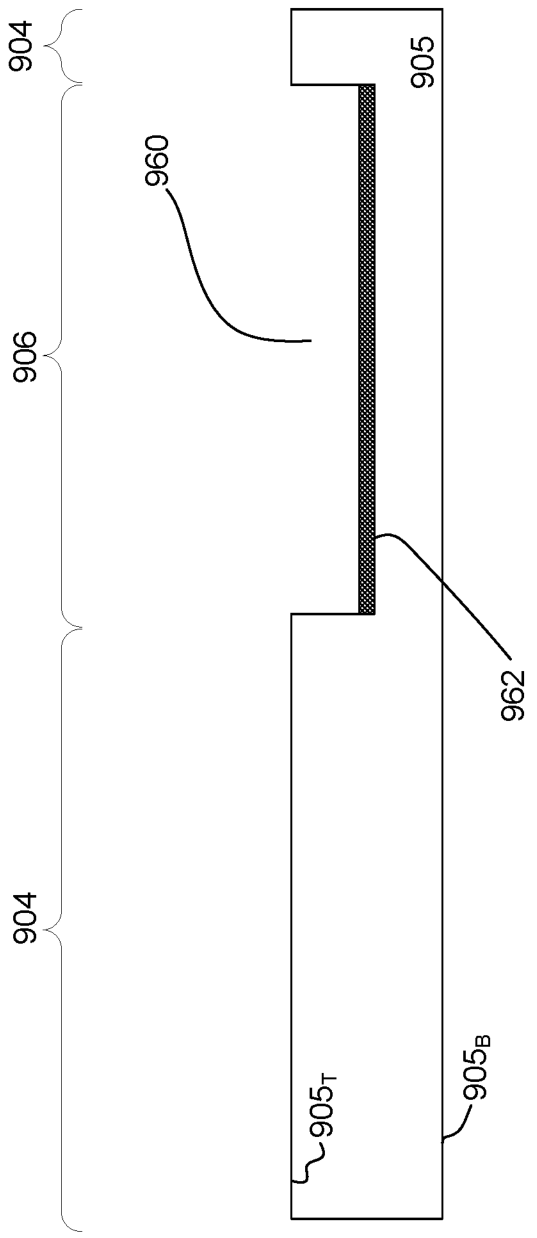
Figure 9D:
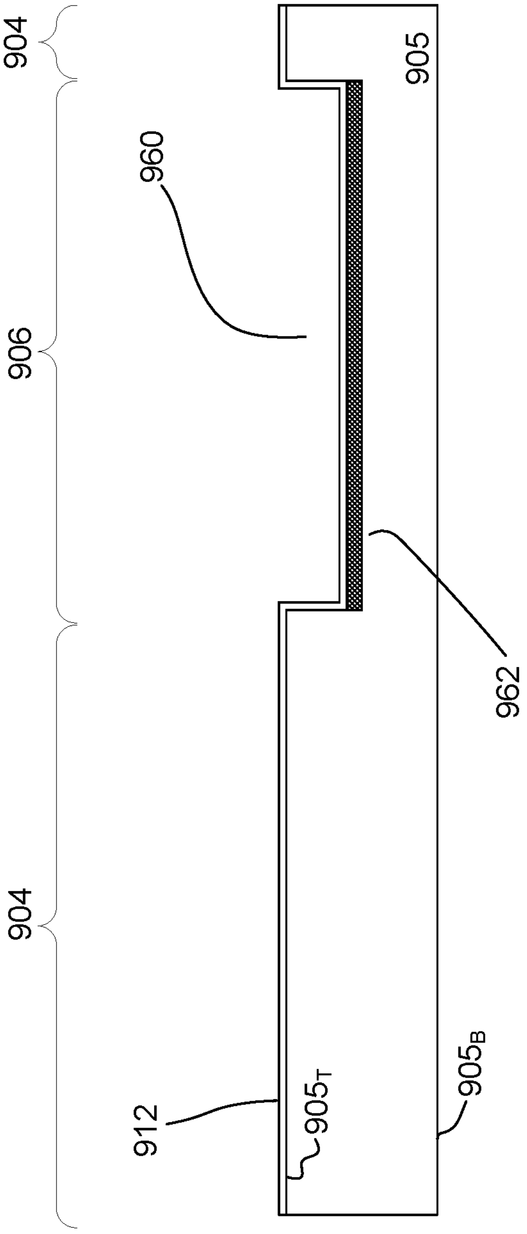
Figure 9E:
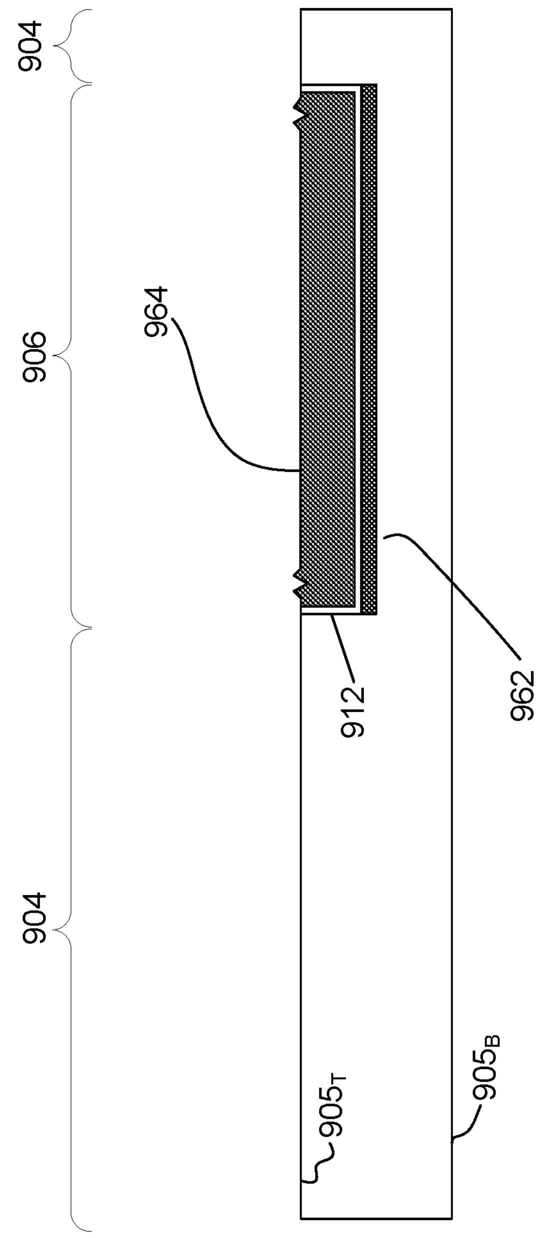
Figure 9F:
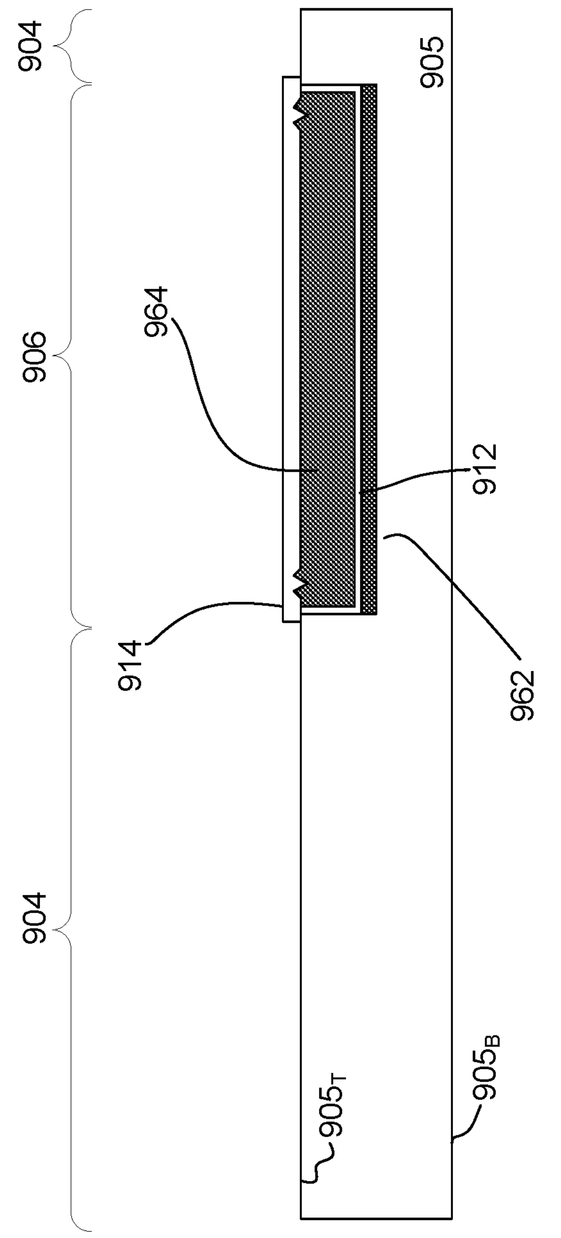
Figure 9G:
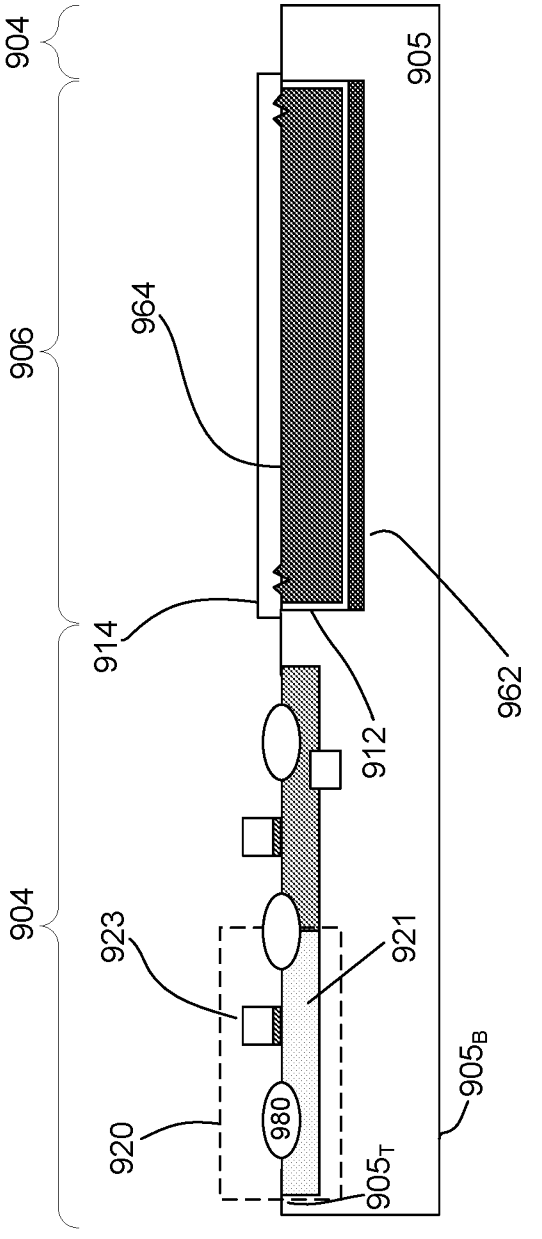
Figure 9H:
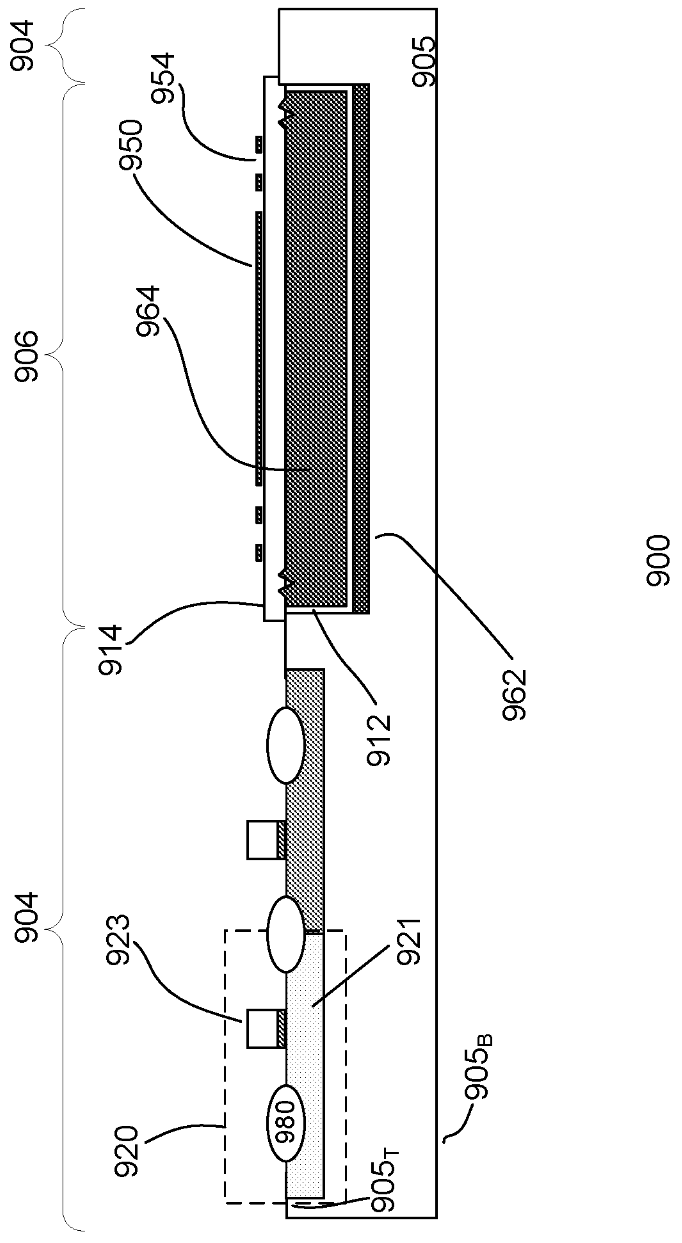
Figure 9I:
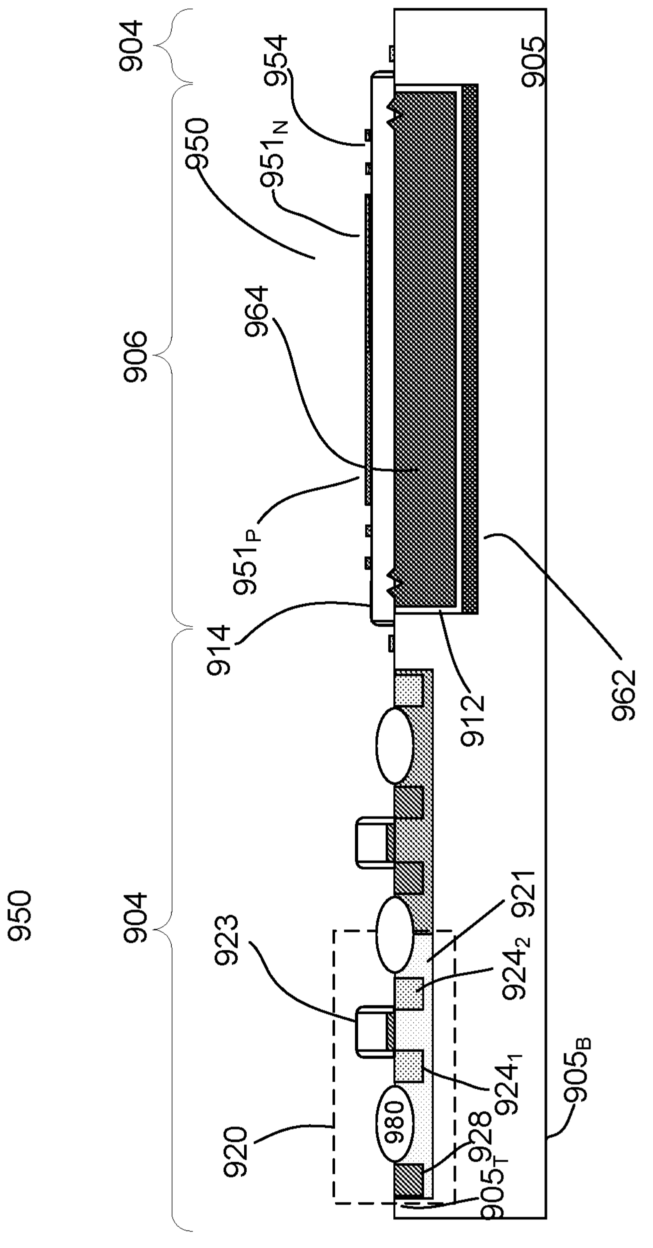
Figure 9J:
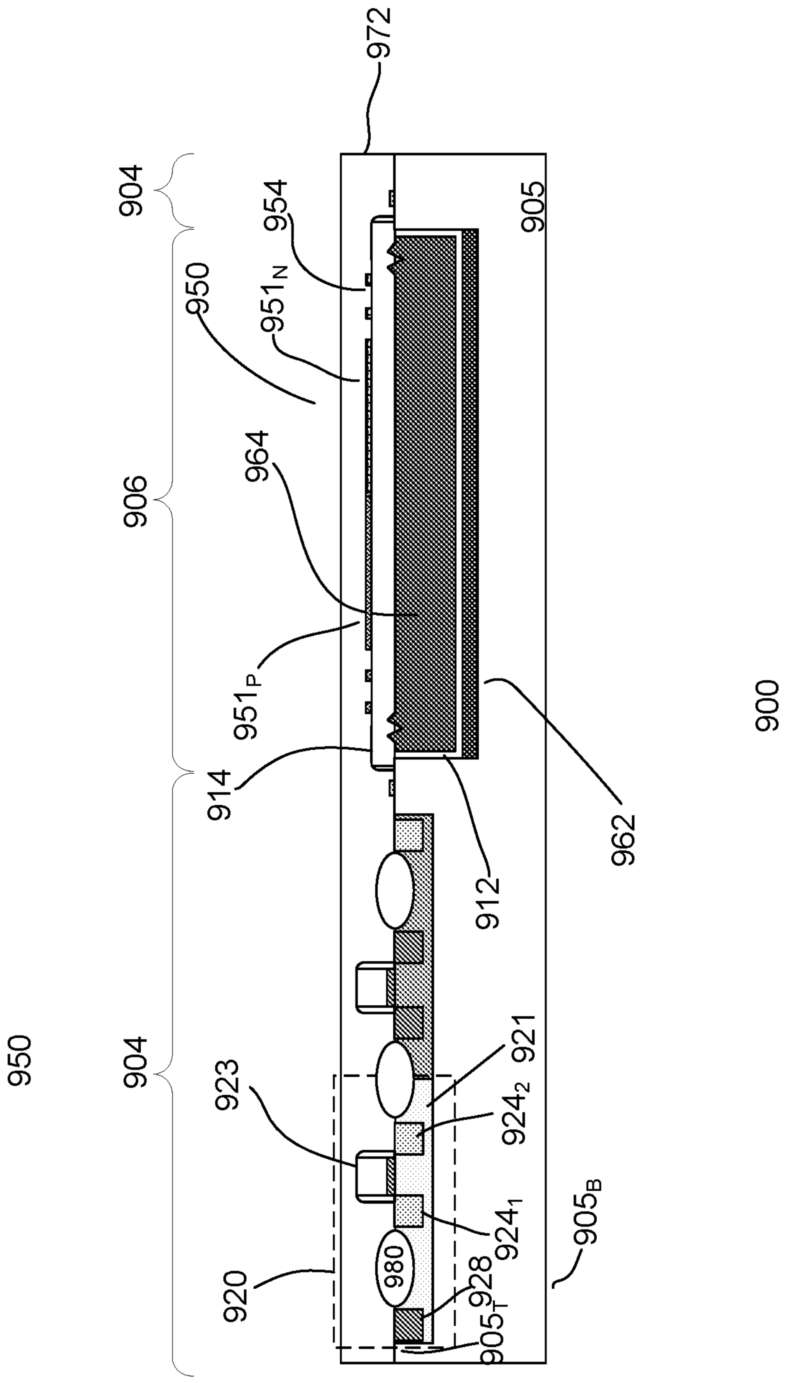
Figure 9K:
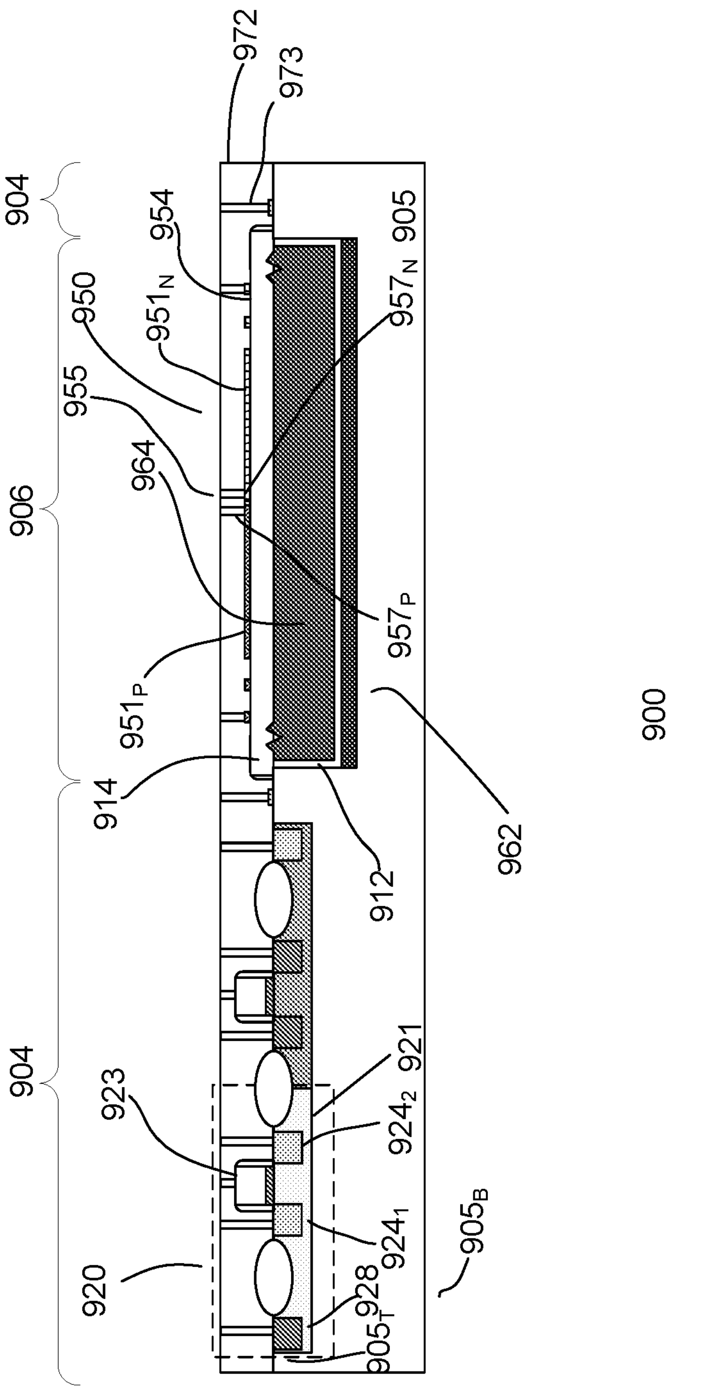
Figure 9I:
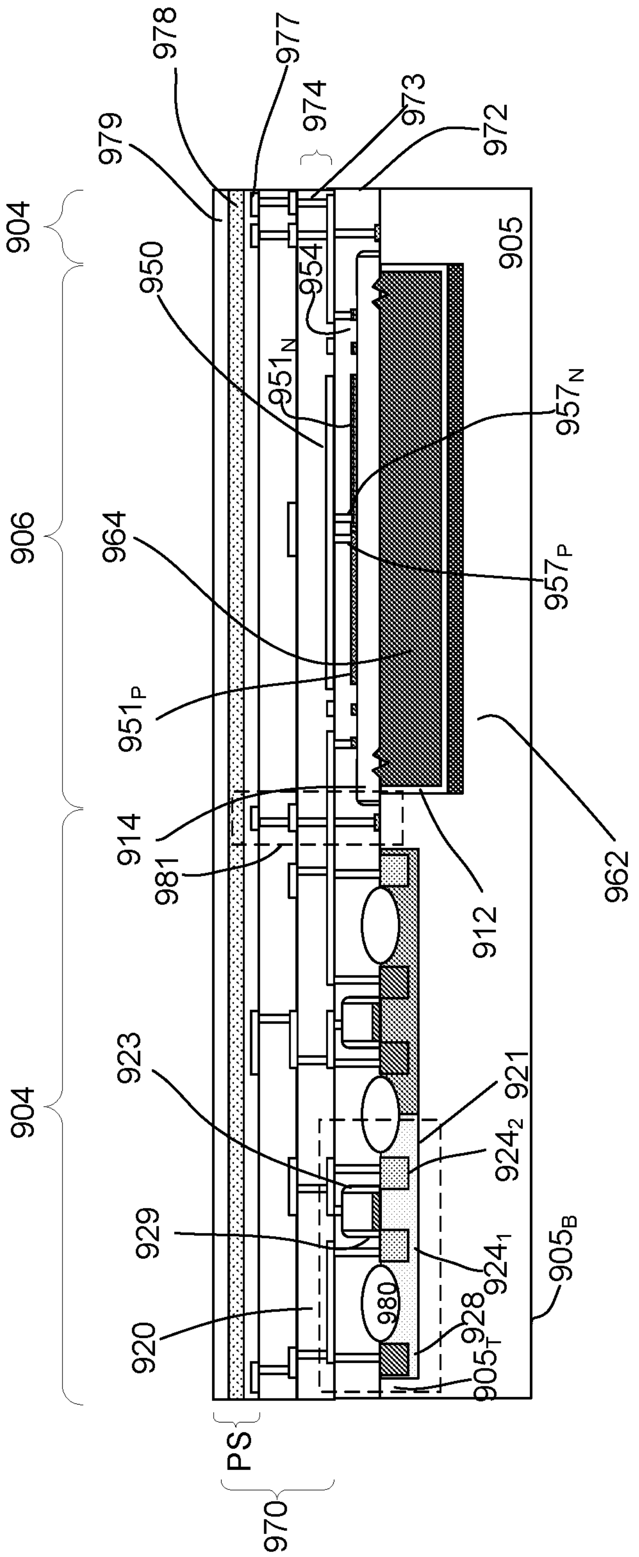
Figure 9M:
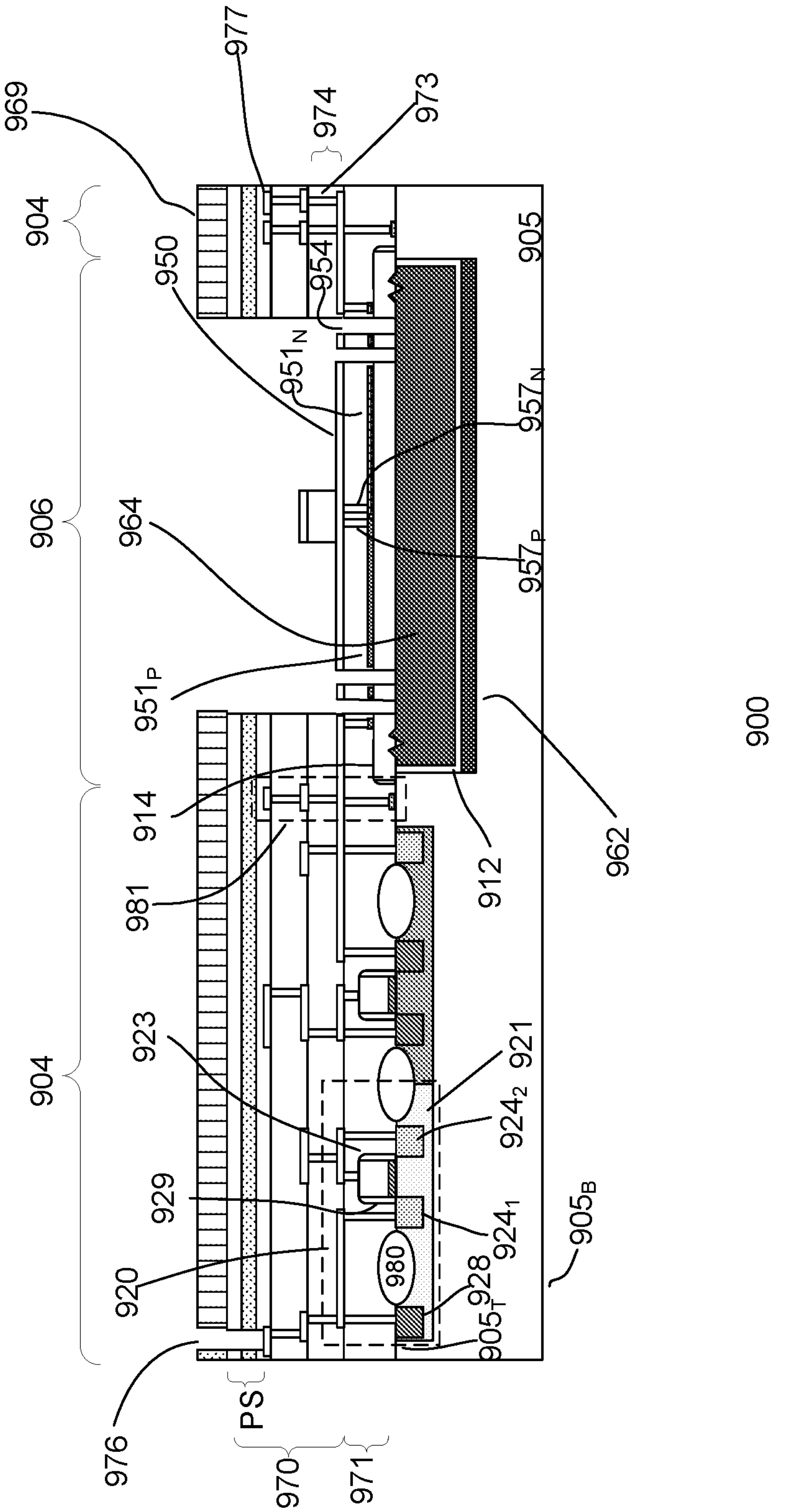
Figure 9N:
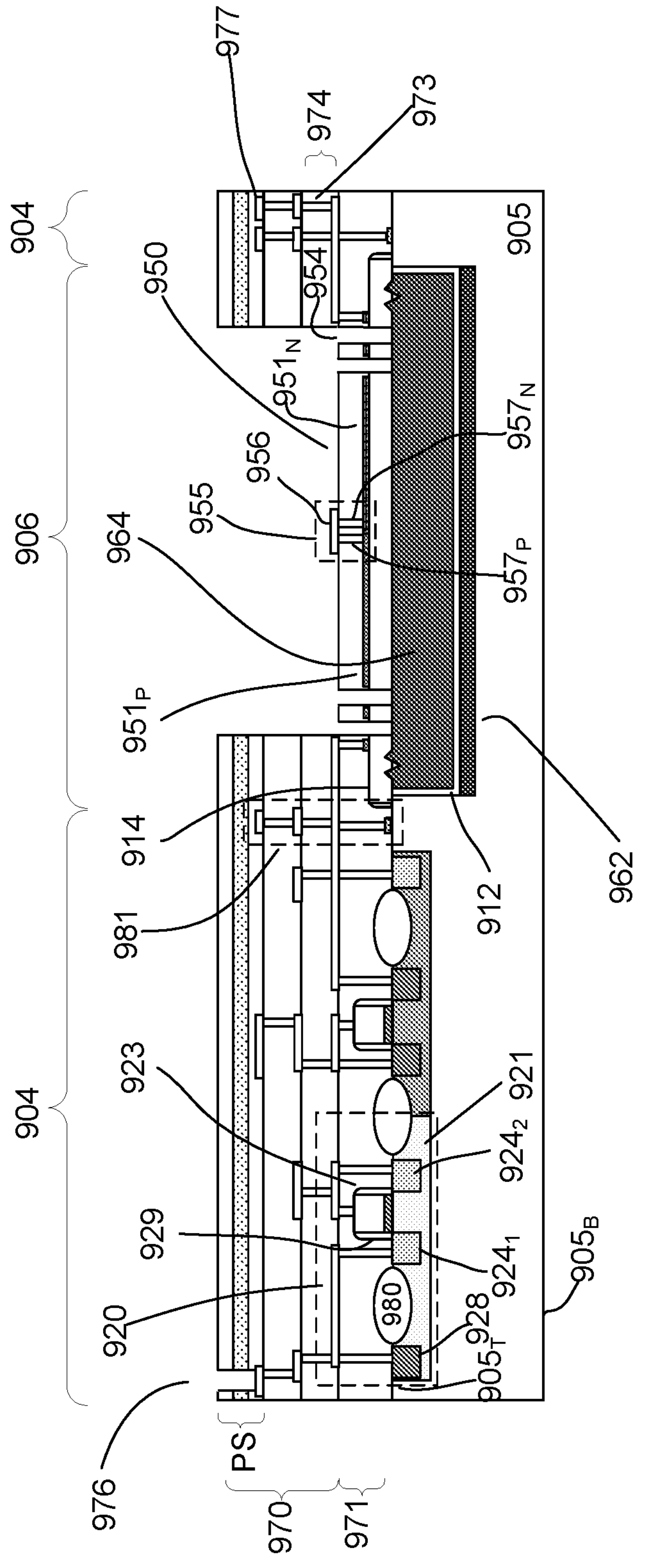
Figure 9O:
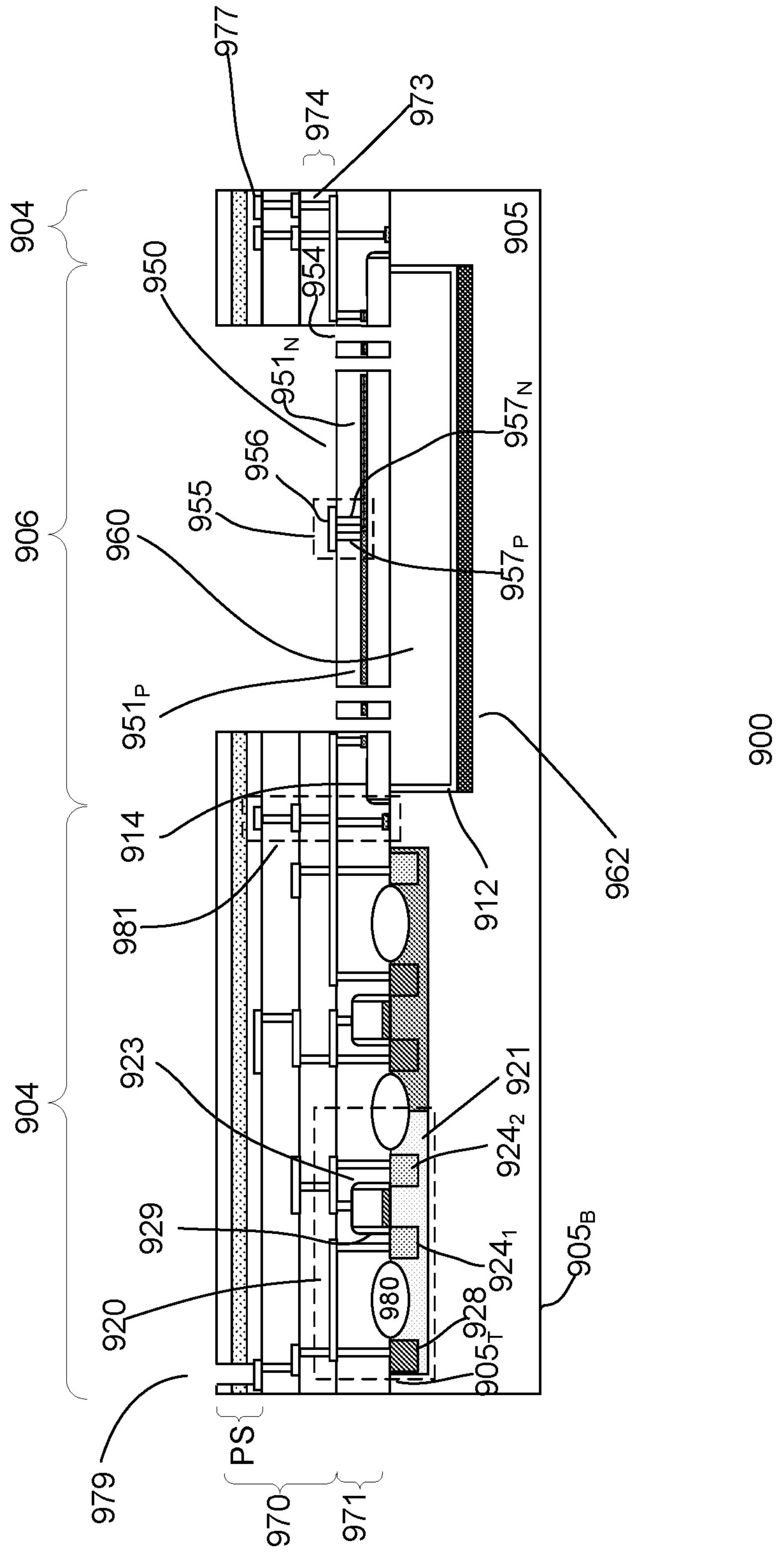
Figure 9P:
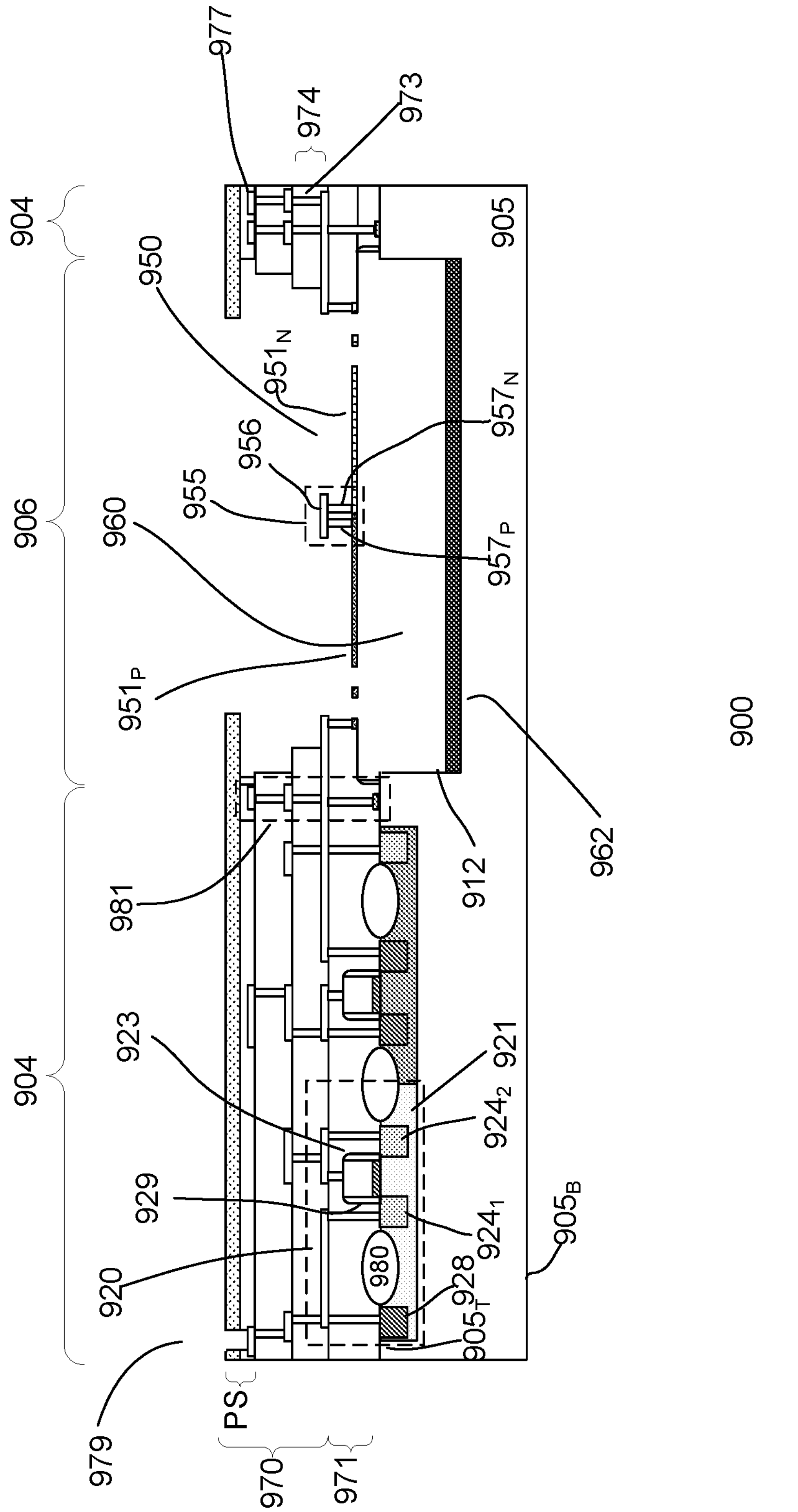
Figure 9Q:
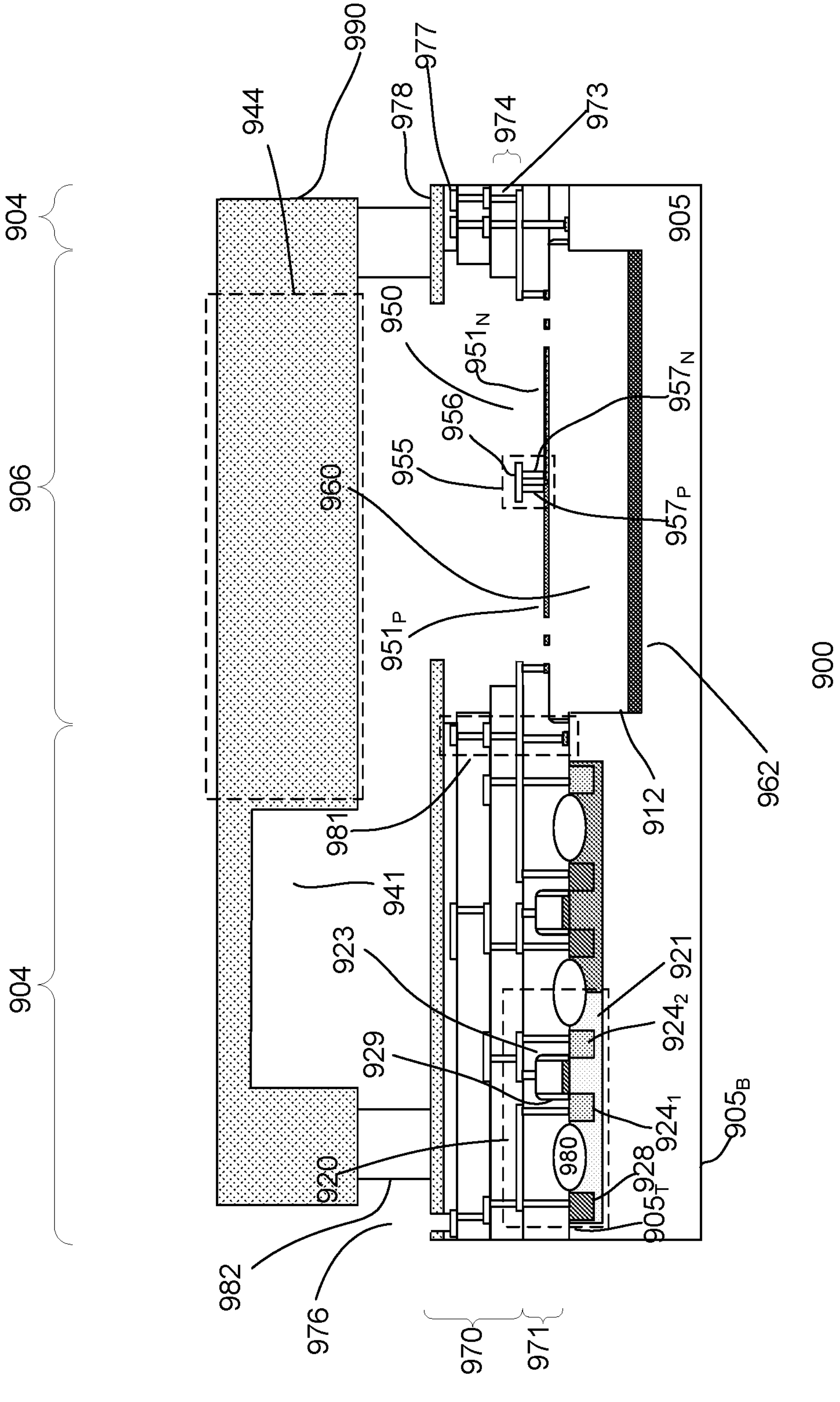

FIGS. 9*a*-9*q* show cross-sectional views of an embodiment of a process for forming a device 900. The device, for example, is similar to that described in FIGS. 2*a*-2*b*. For example, the device includes a sensor region with a sensor, such as those described in FIGS. 3*a*-3*d*, 4*a*-4*d*, 5*a*-5*d*, 6*a*-6*d*, 7*a*-7*b* and 8*a*-8*b*. Common elements may not be described or described in detail.

Referring to FIG. 9*a*, a substrate 905 is provided. The substrate, for example, may be a semiconductor substrate, such as a silicon substrate. Other types of substrates or wafers may also be useful. For example, the substrate may be silicon germanium, germanium, gallium arsenide, or crystal-on-insulator (COI) such as a silicon-on-insulator (SOI) substrate. The substrate may be a doped substrate. For example, the substrate can be lightly doped with p-type dopants. Providing a substrate with other types of dopants or dopant concentrations, as well as an undoped substrate, may also be useful. The substrate includes top and bottom surfaces $\mathbf{905}_T$ and $\mathbf{905}_B$. The top surface may be referred to as the active surface and the bottom surface may be referred to as the inactive surface.

As shown in FIG. 9*b*, the substrate 905 is prepared with first and second device regions 904 and 906. The first region is a CMOS region while the second region is a MEMS region. The CMOS region is configured to include CMOS components and the MEMS region is configured to include a MEMS component. The MEMS component, for example, is a sensor. For example, the sensor may be a thermoelectric-based infrared sensor, such as a thermopile sensor. Other types of MEMS components may also be useful.

In one embodiment, a lower sensor cavity 960 is formed in the sensor region of the substrate. The lower sensor cavity may be formed by etching the substrate using a mask. The mask, in one embodiment, may be a patterned photoresist mask with an opening corresponding to the lower sensor cavity. Alternatively, the mask may be a hard mask, such as silicon oxide, silicon nitride or metal lines in the ILD layers which are patterned with a photoresist mask to include an opening corresponding to the lower sensor cavity. An anisotropic etch, such as a reactive ion etch (RIE), etches the substrate to form the lower sensor cavity.

A reflector 962 is formed at the bottom of the lower sensor cavity. In one embodiment, the reflector is a metal silicide layer formed at the bottom of the lower sensor cavity. The metal silicide reflector may be a $TiSi_x$, $WSi_x$ or $AlSi_x$ reflector. Other types of metal silicide reflectors may also be useful.

To form the reflector, a conductive metal layer is formed on the substrate. The conductive metal layer may line the surface of the substrate and the bottom of the lower sensor cavity. In one embodiment, the mask used to form the substrate remains. As such, the conductive metal layer covers the mask on the surface of the substrate. In the case of a photoresist mask, it is removed after depositing the conductive metal layer. This removes the conductive metal layer over the mask, leaving a portion of the conductive metal layer which covers the bottom of the lower sensor cavity. An anneal is performed, causing a reaction between the conductive metal and silicon substrate of the cavity bottom to form the metal silicide layer. In the case of a hard mask, the metal layer over the substrate is not removed. The hard mask prevents the reaction with the substrate. Unreacted metal and the hard mask are removed after the annealing process. Removing the unreacted metal and hard mask may be achieved using a first wet etch.

Alternative types of reflectors may also be formed at the bottom of the lower sensor cavity. In another embodiment, the reflector is a doped region at the bottom of the cavity. For example, an implant may be performed using the mask that forms the lower sensor cavity. The implant implants reflector dopants to form the reflector at the bottom of the lower sensor cavity. The reflector dopants may be n-type or p-type. The dopant concentration of the reflector is selected accordingly to reflect infrared radiation at a desired degree of reflection. For example, the dopant concentration of the doped reflector layer may be about $10^{21}$ dopants/$cm^3$. The conductive properties of the surface of the doped region are attributed to the high concentration of dopants being applied, thereby enabling the reflection of the incoming infrared radiation. After implanting the dopants, the implant mask is removed.

In other embodiments, the reflector may be a non-conductive reflector, such as a photonic crystal reflector. For example, a photonic crystal layer is formed by etching the surface of the lower sensor cavity. The photonic crystal layer may include a grating pattern configured to reflect incident infrared radiation. For example, different grating patterns of varying depths may be etched from the surface of the photonic crystal layer to adjust the wavelengths and properties of the reflected infrared radiation. The photonic crystal layer may include a grating pattern configured to reflect incident radiation. Forming other types of reflectors may also be useful.

Referring to FIG. 9*d*, after forming the reflector, a reflector protective liner 912 is formed on the substrate. For example, the protective liner serves to protect the reflector from etchants, such as $XeF_2$, used in a release process to form the lower sensor cavity but is being structured and etched away at the CMOS region. The protective liner may be a silicon oxide liner. Other types of protective liners may also be used. The protective liner may be formed by, for example, chemical vapor deposition (CVD). Other forming techniques or other types of protective liners may also be useful. The protective liner lines the substrate as well as the sides and bottom of the lower sensor cavity, covering the reflector. The thickness of the protective liner, for example, may be about 150-200 nm. Other thicknesses may also be useful.

A sacrificial layer 964 is formed on the substrate, as shown in FIG. 9*e*. The sacrificial layer covers the substrate and fills the lower sensor cavity. In one embodiment, the sacrificial layer is a polysilicon layer. Other types of sacrificial materials may also be used for the sacrificial layer. The sacrificial layer may be formed by CVD. Excess sacrificial material over the substrate is removed. For example, a polish, such as a chemical mechanical polish (CMP) is employed to remove the excess sacrificial material. In one embodiment, the CMP removes excess sacrificial material. The protective liner, for example, serves as a CMP stop layer. The protective liner is removed after the CMP process. The process forms a planar or substantially planar top surface with the substrate and the sacrificial layer in the cavity. Providing any other techniques for forming a planar surface between the sacrificial fill and substrate surface may also be useful. For example, fabrications that do not possess CMP will require performing structuring and isotropic back etching processes to planarize the surface which may rely on RIE or deep RIE back etching.

A dielectric layer 914 is formed on the substrate, as shown in 9*f*. The dielectric may be a silicon oxide layer. Other types of dielectric layers may also be formed. The dielectric layer is patterned, leaving it remaining over the lower sensor cavity with the sacrificial fill. The dielectric layer protects the sensor region while the CMOS region is processed. The dielectric layer defines a top of the lower sensor cavity and serves as a membrane for a sensor in the sensor region. The dielectric layer may be formed by CVD and patterned using mask and etch processes. In addition, the dielectric layer may serve as a sacrificial support on which a sensor is formed. The dielectric layer or sensor support, for example, is removed during the release processes. In one embodiment, the sensor support is removed during the second release process to form the free-standing sensor.

Referring to FIG. 9*g*, the CMOS region is processed. For example, front-end-of-line (FEOL) processing is performed on the substrate. The CMOS region of the substrate is processed to include first and second transistor regions 920. In one embodiment, first and second transistor wells 921 are formed in the first and second transistor regions. The first transistor well may be a p-type well for an n-type MOS transistor and the second transistor well may be an n-type well for a p-type MOS transistor. The wells, for example, may be formed by ion implantation using an implant mask. The implant mask may be a photoresist implant mask patterned to provide openings for the implant regions. Separate implant processes are employed for forming p-type and n-type wells.

As shown, isolation regions 980 are formed on the substrate to isolate the different regions of the substrate. The isolation regions, for example, may also be provided for well contact regions. The isolation regions, for example, are field oxide (FOX) isolation regions. The FOX regions may be formed by selective thermal oxidation of the substrate using a nitride mask. Other types of isolation regions may also be useful. For example, the isolation regions may be shallow trench isolation (STI) regions. The STI regions are trenches formed in the substrate and are filled with a dielectric material, such as silicon oxide. The STI regions may have a coplanar top surface with the substrate produced by CMP. In one embodiment, the STI regions are formed prior to dopant implantation so as not to be influenced by their growth by the doping of the silicon.

Gate layers are formed on the substrate. In one embodiment, the gate layer includes a gate dielectric layer and a gate electrode layer. The gate dielectric layer may be a thermal oxide layer while the gate electrode layer may be a polysilicon layer. The gate electrode layer may be formed by CVD. The gate electrode layer, for example, covers the substrate in the CMOS and sensor regions. In one embodiment, the gate layers are patterned to form gates 923 in the transistor regions. For example, the gate layers are patterned to form the gates in the CMOS region and removed in the sensor region. Patterning the gate layers may be achieved using mask and etch techniques. For example, the gate layers are patterned by RIE using a patterned resist mask. A gate includes a gate electrode 923 over a gate dielectric 913. Other processes or configurations of processes may also be employed to form the gates.

In FIG. 9*h*, the MEMS region is processed. For example, the CMOS region is masked off, protecting it from the processing of the MEMS region. A hard mask layer, such as a silicon oxide or silicon nitride layer, may be employed. The hard mask layer may be patterned to expose the sensor region, leaving the CMOS region protected. The hard mask layer may serve as an etch-stop layer. Other types of hard mask layers may also be useful. The hard mask layer enables the MEMS region to be processed while protecting the CMOS region.

In one embodiment, a sensor body 950 is formed on the dielectric layer over the filled lower sensor cavity in the MEMS region. For example, a sensor body layer, such as polysilicon is formed. The sensor body layer is patterned to form the sensor body, such as those previously described. Other types of sensor body layers may also be useful. For example, the sensor body layer may be silicon germanium (SiGe), gallium nitride (GaN) or a 2D material, such as graphene, black phosphorus or molysulfide. As shown, the sensor body includes gaps or spaces 954, as previously described, to facilitate release processes performed subsequently. Other techniques or processes for forming the sensor body may also be useful. After forming the sensor body, the mask protecting the CMOS region is removed.

As described, the gates and transistor gates are formed using separate processes. In other embodiments, the gates and sensor body may be formed in the same process. For example, gate layers are deposited on both the CMOS and sensor regions. The gate layers can be patterned using the same etch mask to form gates in the transistor regions and the sensor body in the sensor region. For example, the gate electrode and sensor body are formed from the same gate electrode layer and patterned using the same etch process.

Source/drain (S/D) regions $\mathbf{924}_{1\text{-}2}$ are formed adjacent to the gates, as shown in FIG. 9*i*. The S/D regions are heavily doped regions. For example, the first transistor includes heavily doped n-type S/D regions while the second transistor includes p-type S/D regions. Separate implants may be employed to form different types of S/D regions using implant masks, such as photoresist masks. After an implant, the implant mask is removed.

In one embodiment, lightly doped extension regions are formed adjacent to gates. P-type lightly doped extension regions are formed adjacent to the gate of the p-type transistor and n-type lightly doped extension regions are formed adjacent to the gate of the n-type transistor. Dielectric sidewall spacers may be formed on the sidewalls of the gates to facilitate the formation of the lightly doped extension regions. Spacers may also be formed on the dielectric layer or sensor support 914 when forming the gate sidewall spacers. After forming the spacers, the lightly doped extension regions are formed. Separate implants may be employed to form different types of lightly doped extension regions using implant masks, such as photoresist masks. After an implant, the implant mask is removed.

After forming the extension regions, a spacer dielectric layer is formed on the substrate. The spacer dielectric layer may be a silicon oxide layer. Other types of spacer dielectric layers may also be useful. An anisotropic etch is performed, removing horizontal portions of the spacer dielectric layer, and leaving spacers on the sidewalls of the gate. P-type S/D regions are formed adjacent to the gate of the p-type transistor and n-type S/D regions are formed adjacent to the gate of the n-type transistor. Separate implants may be employed to form different types of S/D regions using implant masks, such as photoresist masks.

After forming the S/D regions, a sensor implant process may be performed. For example, dopants are implanted to form the n-doped and p-doped sensor segments of the sensor body. The implants may dope the sensor segments to tune the sensor body having an ambient sheet resistance to also serve as an absorber. Separate implant processes may be employed for the n-doped and p-doped sensor segments.

As described, the implants to form the S/D regions are separate from those used to form the sensor. For example, the S/D implant mask protects the sensor during a S/D implant and the sensor implant mask protects the transistor during a sensor implant. In alternative embodiments, the implants used to form S/D regions of the transistors may be integrated into the process for forming the segments of the sensor body. For example, the p-type or n-type sensor segments are doped with the same implant process as the p-type or n-type S/D regions or body layer may be the same as the gate electrode layer. Other configurations of forming the sensor body and S/D regions may also be useful.

Metal silicide contacts may be formed on the substrate. For example, metal silicide contacts may be formed on the S/D regions, gates, well contacts as well as sensor via contact regions and sensor terminal contact regions on the sensor body. A metal layer, such as Ti, W, Co or Al, may be deposited on the substrate and annealed to cause a reaction between the metal and silicon to form metal silicide contacts. Unreacted metal is removed by, for example, a wet etch, leaving the metal silicide contacts. In other embodiments, the metal silicide contacts for the CMOS region and sensor region may be separate processes.

In some embodiments, after forming the sensor body, an absorber is formed on the sensor body. The absorber layer may include an absorber protection layer or stack, as described in, for example, FIGS. 7*a*-7*b* and 8*a*-8*b*. Forming other types of absorbers and absorber protection layers or stacks may also be useful.

In FIG. 9*j*, a first dielectric layer 972 is formed over the substrate. In one embodiment, the dielectric layer covers the CMOS and sensor regions. For example, the dielectric layer covers the transistors and MEMS structure. The dielectric layer serves as a contact level (C0 dielectric) or pre-metal interlayer dielectric (ILD) layer. The ILD layer may be a silicon oxide layer formed by CVD. Other types of dielectric layers may also be useful. For example, the ILD layer may be a dielectric stack which includes multiple dielectric layers, such as BPSG, PETEOS, SiON and PECVD oxide. Other configurations of ILD layers or stacks may also be useful. A polishing process, such as CMP, may be performed to produce a planar top surface of the ILD layer. The planar top surface is above the sensor and transistors. Providing any other planarization techniques, such as spin-on-glass (SOG) to fill the gaps or planarize the surface of the substrate, may also be useful.

Referring to FIG. 9*k*, the process continues to form via contacts 923 in the ILD layer. The via contacts are coupled to contact regions below. For example, via contacts are formed to connect to the S/D regions, gates, and well contacts in the CMOS region as well as sensor via contact regions and sensor terminal via contact regions of the sensor body in the MEMS region. In addition, via contacts are formed in a BEOL protection wall region. In one embodiment, the protection wall region surrounds the sensor region and protects the BEOL dielectric layer from damage within the CMOS region during the release processes. The sensor via contacts, sensor terminal via contacts and BEOL protection wall sensor via contacts, in one embodiment, are closed-loop contacts. Other configurations of contacts may also be useful.

The contacts, for example, are formed by a single damascene technique. The single damascene technique includes forming vias, filling the vias with a contact layer, and polishing, such as CMP, to remove excess contact material. Forming contacts using other techniques may also be useful.

In FIG. 9*l*, the process continues to form a BEOL dielectric layer 970. For example, the first metal level (M1) of the first IMD level as well as via levels and metal levels of additional IMD levels 974 are formed. As discussed, a via level includes via contacts 973 and a metal level includes metal lines 977. The metal lines and vias form interconnections of the device. As shown, the BEOL dielectric includes 2 IMD levels and a passivation stack over the uppermost metal level. For example, the BEOL dielectric includes M1, V1, M2, V2 and M3 metal and via levels of the IMD levels (IMD1, IMD2 and M3 over V2). The BEOL dielectric layer is formed over the ILD level with C0 or pre-metal contacts. Other configurations of or other numbers of IMD levels may be provided for the BEOL dielectric. As previously discussed, the ILD and C0 contacts may be considered to be formed as part of the FEOL processing and the IMD and other levels above may be considered to be formed as part of BEOL processing.

A passivation layer is formed over the uppermost metal or pad level. For example, the passivation layer is formed over M3 which serves as a pad level. The passivation layer, for example, is part of the BEOL dielectric layer. In one embodiment, the passivation layer is a passivation stack PS with multiple passivation layers. In one embodiment, the passivation stack includes first, second and third passivation dielectric layers 976, 978 and 979. The passivation stack is configured to protect the BEOL from damage during the release processes. For example, the second passivation layer protects the BEOL dielectric during the second release process which removes the third passivation layer. In one embodiment, the passivation stack includes a silicon oxide/silicon nitride/silicon oxide stack. For example, the first passivation layer is a silicon oxide layer, the second passivation layer is a silicon nitride layer and the third passivation layer is a silicon oxide layer. Other configurations of the passivation stack may also be useful. The passivation layer may be formed by CVD.

In one embodiment, the BEOL dielectric layer includes a BEOL protection wall 981 surrounding the sensor region. The BEOL protection wall is formed with via contacts and metal lines of the metal and via levels, including the C0 level. In some embodiment, the BEOL protection wall may also include undoped polysilicon, such as that used to form the gates. The BEOL protection wall is configured to prevent the BEOL dielectric from damage within the active CMOS region during the release processes. The BEOL protection wall also serves to define the sensor region, enabling the release processes to be performed. For example, the BEOL protection wall prevents etchants, in particular, from the second release processes from penetrating the BEOL dielectric within the active CMOS region. The active CMOS region, for example, is the region outside of the BEOL protection wall and includes active or functional CMOS interconnect components. In one embodiment, the BEOL protection wall includes a double wall configuration with wall discontinuities to accommodate connections. The double wall configuration extends an etchant path from the sensor region to the BEOL dielectric in the active CMOS region. Preferably, the double wall configuration maximizes the etchant path from the sensor region to the BEOL dielectric in the active CMOS region.

Referring to FIG. 9*m*, the process continues to define the upper sensor cavity in the BEOL dielectric. In one embodiment, a patterned etch mask is provided over the BEOL dielectric. The etch mask, for example, is a photoresist mask.

The mask is exposed and developed to form openings corresponding to the sensor region and pad openings 976. An isotropic etch, such as RIE, is performed. Other types of etching processes may also be useful. In one embodiment, due to the thickness between the pad openings and sensor openings, they are formed in separate etch processes. For example, separate etches and etch masks are used to form the pad openings and the sensor openings. The etches, for example, are selective to metal. For example, the etches remove materials other than metal. As shown, pad openings and the upper sensor cavity are defined in the BEOL dielectric. Since the pattern of the M1 metal over the sensor serves as a secondary etch or hard mask, the etch also forms release openings 954 corresponding to gaps of the sensor body.

As shown in FIG. 9*n*, the M1 metal in the sensor region is patterned. In one embodiment, the M1 metal is patterned to form the interconnect of the sensor body contact 955. For example, the interconnect which connects the first and second sensor body segments together is formed in this patterning process. Patterning the M1 metal in the sensor region to form the sensor body contact may be a self-aligned RIE etch. For example, the same mask used to form the sensor opening may also be used, except the chemistry is to remove the M1 metal. In one embodiment, M2 in the sensor region serves as a hard mask over M1 in the sensor region to form the sensor body contact. For example, the etch removes the M2 metal hard mask and patterns the M1 metal in the sensor region to form the sensor body contact. This completes forming the sensor body contact. The mask is removed thereafter.

The process continues to perform a first release of the double release process. The first release process removes the sacrificial fill in the lower cavity. This forms the lower sensor cavity 960. In one embodiment, a dry etch is performed to remove the sacrificial fill. The etchant etches the sacrificial layer with a high etch rate compared to the metal as well as the dielectric material of the BEOL dielectric, the protective liner and sensor support. For example, the etchant is highly selective to metal and silicon oxide. In one embodiment, a xenon difluoride ($XeF_2$) etchant is employed for the first release process. In another embodiment, isotropic sulfur hexafluoride ($SF_6$) etchant is used as an alternative etchant to $XeF_2$. Other types of etchants or etch processes may also be useful.

In FIG. 9*p*, a second release of the double-release process is performed. The second release removes the dielectric material encasing the sensor to form a free-standing sensor. In one embodiment, a dry etch is performed to remove the dielectric material encasing the sensor. The dry etch removes silicon oxide at a high etch rate compared to the metal, silicon and silicon nitride. For example, the etchant is highly selective to metal, silicon and silicon nitride. The second release process also removes the silicon oxide passivation layer and protective liner lining the trench walls and bottom as well as eroding the BEOL dielectric within the sensor region. However, the BEOL protection wall prevents eroding of the BEOL dielectric in the active CMOS region. In one embodiment, the second release employs a vapor HF (VHP) etchant. Other types of etchants may also be useful.

Referring to FIG. 9*q*, the process continues. As shown, a cap 990 is bonded to the substrate. For example, a sealing ring 982 is employed to bond the cap to the BEOL dielectric. The sealing ring may include a cap portion and a substrate portion. For example, a cap sealing ring may be disposed on the cap in a cap sealing region and the substrate sealing ring may be disposed on the top of the BEOL dielectric in a substrate sealing region. The cap and substrate sealing rings may be metal sealing rings. The metal sealing rings may include metal sealing ring stacks having multiple metal layers. Other configurations or types of sealing rings may also be useful.

In another embodiment, the substrate portion of the sealing ring can be formed by the uppermost metal level. For example, the metal pattern of the uppermost metal level may include the substrate portion of the sealing ring. The substrate portion of the sealing ring is exposed by patterning the passivation stack. For example, the passivation stack may be patterned to form a sealing ring opening to expose the substrate portion of the sealing ring and pad openings to expose bond pads.

The cap may be bonded using, for example, thermal compression. For example, the cap and substrate sealing rings are bonded together by thermal compression. Thermal compression may be performed at the wafer level. For example, wafer-level vacuum packaging may be employed to form the cap. The cap is bonded prior to dicing the wafer to separate the devices.

The cap, in one embodiment, is formed of a material transparent to infrared radiation. For example, the cap is capable of transmitting infrared radiation to the sensor. The cap, for example, may be a silicon cap. Other types of materials which transmit infrared radiation may also be useful.

In one embodiment, the cap includes an anti-reflective region 944. The anti-reflective region facilitates the transmission of infrared radiation through the cap. The anti-reflective region may include a bottom grating (not shown) on the inner (bottom) surface of the cap and a top grating (not shown) on the outer (top) surface of the cap. The gratings can have a moth-eye grating pattern or structure to facilitate the transmission of infrared radiation. Other grating patterns for the gratings may also be useful. Other types of anti-reflective regions may also be useful.

In some embodiments, the anti-reflective region includes anti-reflection coatings disposed on the front and back sides of the cap. Materials with a different reflective index may be deposited alternatively on the surfaces of the anti-reflective region. For example, materials for the anti-reflection coating may be zinc sulfide or germanium (Ge) and deposited in the same manner as the moth-eye grating pattern or structure. Providing any other materials and deposition techniques for the anti-reflective coating may also be useful.

A getter (not shown) may be disposed on the inner surface of the cap. For example, the bottom surface of the cap may include a recess 941 over the CMOS region. The getter may be disposed in the recess on the bottom surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates maintenance of the vacuum, improving reliability. Other configurations of the cap may also be useful. After completion of wafer-level packaging, the wafer is diced to singulate the wafer into individual device packages.

Figure 10A:
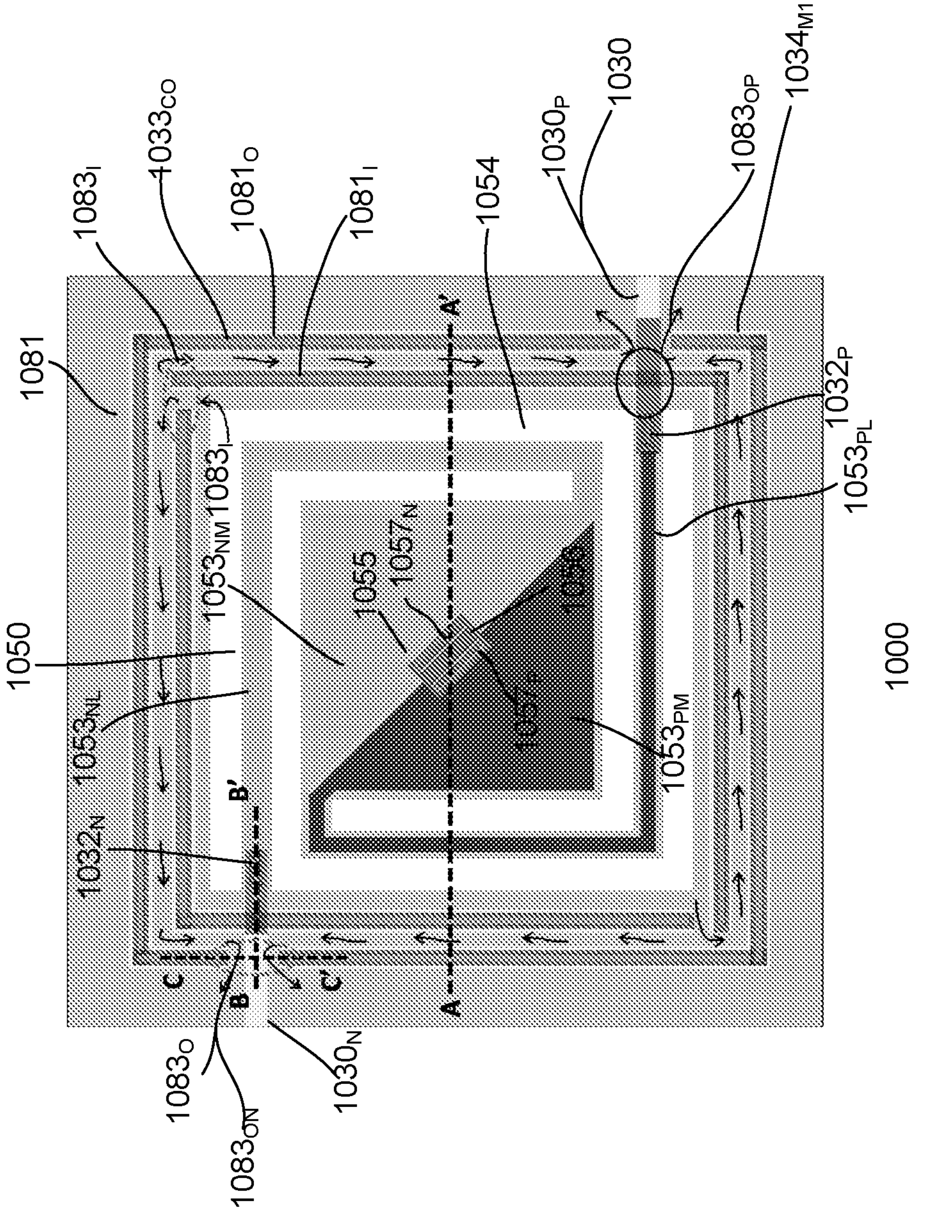
FIGS. 10*a*-10*b* show top views of the layout of the sensor region corresponding to different metal levels illustrating etchant flow path during the second release of a double-release process.
Figure 10B:
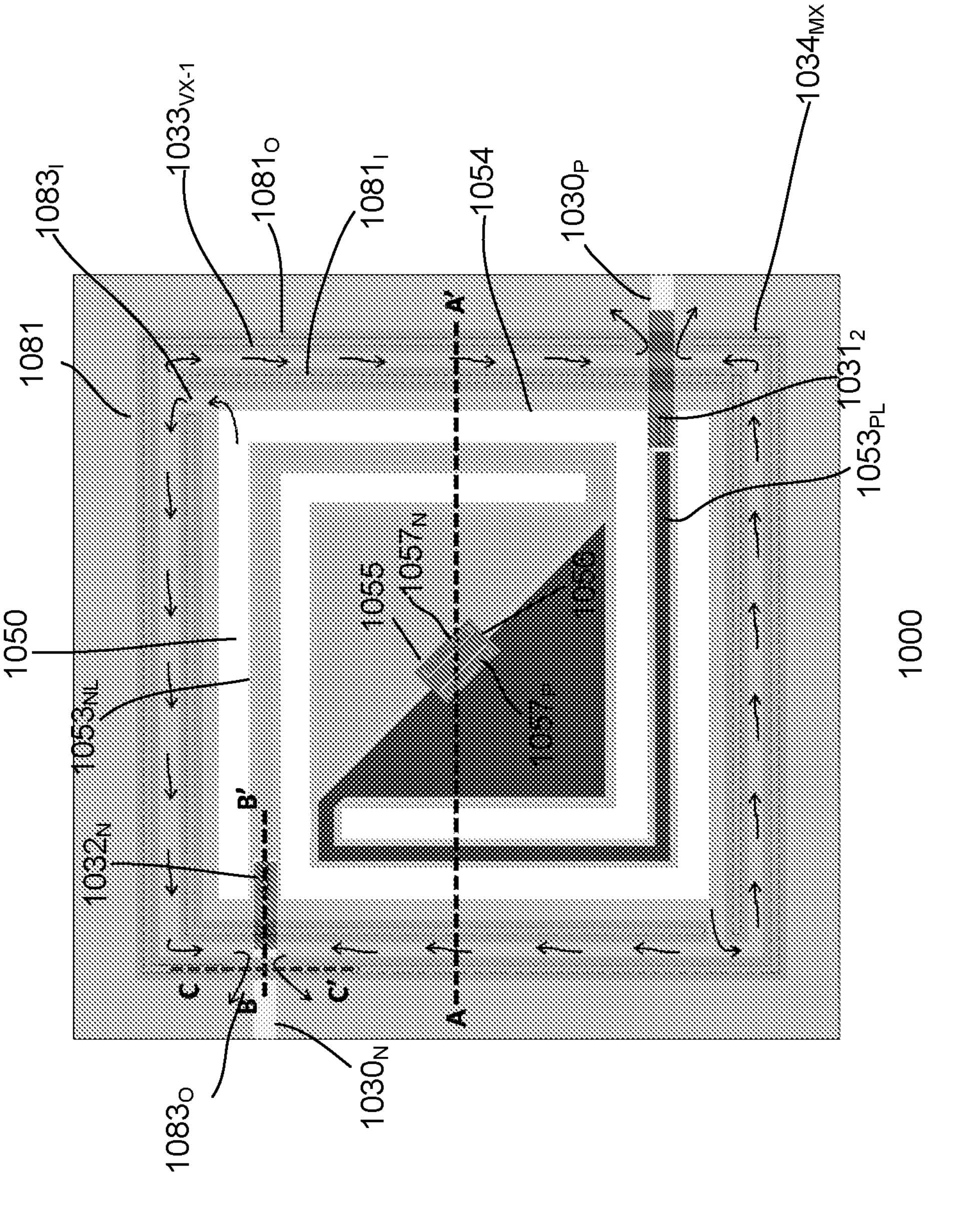

FIGS. 10*a*-10*b* show top views of the layout of the sensor region corresponding to different metal levels illustrating etchant flow path during the second release of a double-release process. In particular, FIG. 10*a* shows the layout of M1 and FIG. 10*b* shows the layout of M2 and above. As for M3, it is not shown. M3 may be similar to M2 or different. For example, discontinuities in M3 may be provided in different locations than in M2. The sensor region includes a sensor 1050. The sensor region and sensor are similar to those previously described. Common elements may not be described or described in detail.

As shown, the sensor region includes a sensor 1050. The sensor includes a sensor body first and second body segments. The first body segment includes a first main segment $\mathbf{1053}_{PM}$ and a first lead segment $\mathbf{1053}_{PL}$ and the second body segment includes a second main segment $\mathbf{1053}_{NM}$ and a second lead segment $\mathbf{1053}_{NL}$. At an end of the first and second lead segments, first and second terminal via contacts $\mathbf{1032}_{P}$ and $\mathbf{1032}_{N}$ are provided. For example, the first terminal via contact is disposed at about an end of the first lead segment and the second terminal via contact is disposed at about an end of the second lead segment. First and second sensor via contacts $\mathbf{1057}_{P}$ and $\mathbf{1057}_{N}$ are disposed at about an interface of the first and second main segments.

In one embodiment, the via contacts are closed-loop via contacts. Providing closed-loop via contacts improves the mechanical stability of the free-standing sensor after the second release process. Other types of via contacts may also be useful. The terminal and sensor via contacts, for example, may be disposed within the pre-metal or C0 dielectric level. For example, the via contacts provide interconnections to interconnects on the first metal (M1) dielectric level.

In one embodiment, a BEOL protection wall 1081 surrounds the sensor region. As shown, the protection wall is a rectangular-shaped protection wall. Other shapes for the protection wall may also be useful. The BEOL protection wall includes via contacts and metal lines or interconnects of the metal and via levels of the BEOL dielectric (including the C0 level). The BEOL protection wall may also include polysilicon patterned on the surface of the substrate (e.g., gate layers). The BEOL protection wall is configured to prevent the BEOL dielectric from damage within the active CMOS region during the release processes. For example, the BEOL protection wall prevents etchants from the release processes from penetrating the BEOL dielectric within the active CMOS region.

As shown, sensor terminal interconnects 1030 are coupled to the sensor via contacts and a sensor contact interconnect 1056 couples the sensor via contacts together. In one embodiment, a first sensor terminal interconnect $\mathbf{1030}_{P}$ is connected to the first sensor via contact; a second sensor terminal interconnect $\mathbf{1030}_{N}$ is connected to the second sensor via contact. The sensor terminal and sensor contact interconnects, for example, are M1 interconnects.

In one embodiment, the BEOL protection wall includes a double wall configuration. As shown, the BEOL protection wall includes inner and outer protection walls $\mathbf{1081}_{I}$ and $\mathbf{1081}_{O}$. The double wall configuration extends an etchant path from the sensor region to the BEOL dielectric in the active CMOS region. Preferably, the double wall configuration maximizes the etchant path from the sensor region to the BEOL dielectric in the active CMOS region. Other configurations of the BEOL protection wall may also be useful.

Discontinuities are provided in the BEOL protection wall. In one embodiment, the discontinuities are provided to accommodate metal interconnects to the sensor. Preferably, the discontinuities are provided to accommodate metal interconnects to the sensor and to extend the etchant path of the release processes as long as possible to the CMOS active region.

In one embodiment, the C0, M1 and V1 levels of the outer protection wall include terminal interconnect discontinuities $\mathbf{1083}_{O}$ to accommodate the sensor terminal interconnects 1030. The C0, M1 and V1 levels of the protection wall include a first outer wall terminal interconnect discontinuity $\mathbf{1083}_{OP}$ to accommodate the first sensor terminal interconnect and a second outer wall terminal interconnect discontinuity $\mathbf{1083}_{ON}$ to accommodate the second sensor terminal interconnect. For example, the C0 contact $\mathbf{1033}_{C0}$, the M1 interconnect $\mathbf{1034}_{M1}$ and V1 of the outer protection wall includes first and second outer wall terminal interconnect discontinuities. The outer wall terminal interconnect discontinuities avoid shorting of the sensor terminals. As for layers above V1, the outer protection wall does not have any discontinuities.

In one embodiment, the sensor terminal interconnects are part of the M1 metal layer. For example, the first sensor terminal interconnect of the first lead segment of the first body segment is part of the M1 metal layer and the second sensor terminal interconnect of the second lead segment of the second body segment is part of the M1 metal layer. Other configurations of the sensor terminal interconnects may also be useful.

In one embodiment, the inner protection wall $\mathbf{1081}_{i}$ does not include first and second terminal interconnect discontinuities as the outer protection wall. For example, the inner protection wall does not have inner wall discontinuities where the outer wall terminal interconnect discontinuities are located. Instead, the inner protection wall includes first and second inner wall discontinuities $\mathbf{1083}_{i}$ located at other parts of the inner protection wall to avoid shorting the first and second terminal interconnects. For example, the various layers of the inner protection wall include first and second inner wall discontinuities. The first and second inner wall discontinuities avoid shorting of the first and second terminal interconnects. In one embodiment, the inner wall discontinuities are configured to provide a long travel path for the etchants of the double-release process to the active CMOS region of the BEOL dielectric. Preferably, the inner wall discontinuities provide the longest possible travel path for the etchants of the double-release process to the active CMOS region of the BEOL dielectric.

As shown, the inner protection wall includes first and second inner protection wall discontinuities. The first and second inner protection wall discontinuities are disposed at opposing diagonal portions of the inner protection wall. For example, the first and second inner protection wall discontinuities are disposed at opposing diagonal portions at all levels. The opposing diagonal portions are distal from the outer protection wall terminal interconnect discontinuities. For example, the first and second inner protection wall discontinuities are located far away from the first and second outer protection wall terminal interconnect discontinuities. Preferably, the first and second inner protection wall discontinuities are located as far away as possible from the first and second outer protection wall terminal interconnect discontinuities.

In one embodiment, the M1 terminal interconnects are coupled to the C0 via contacts. The first and second inner wall discontinuities enable a long etchant path of the second release process to prevent damage to the active CMOS BEOL dielectric, as illustrated by the arrows. This prevents the etchant from damaging the BEOL dielectric in the active CMOS region from the second release process.

Figure 11A:
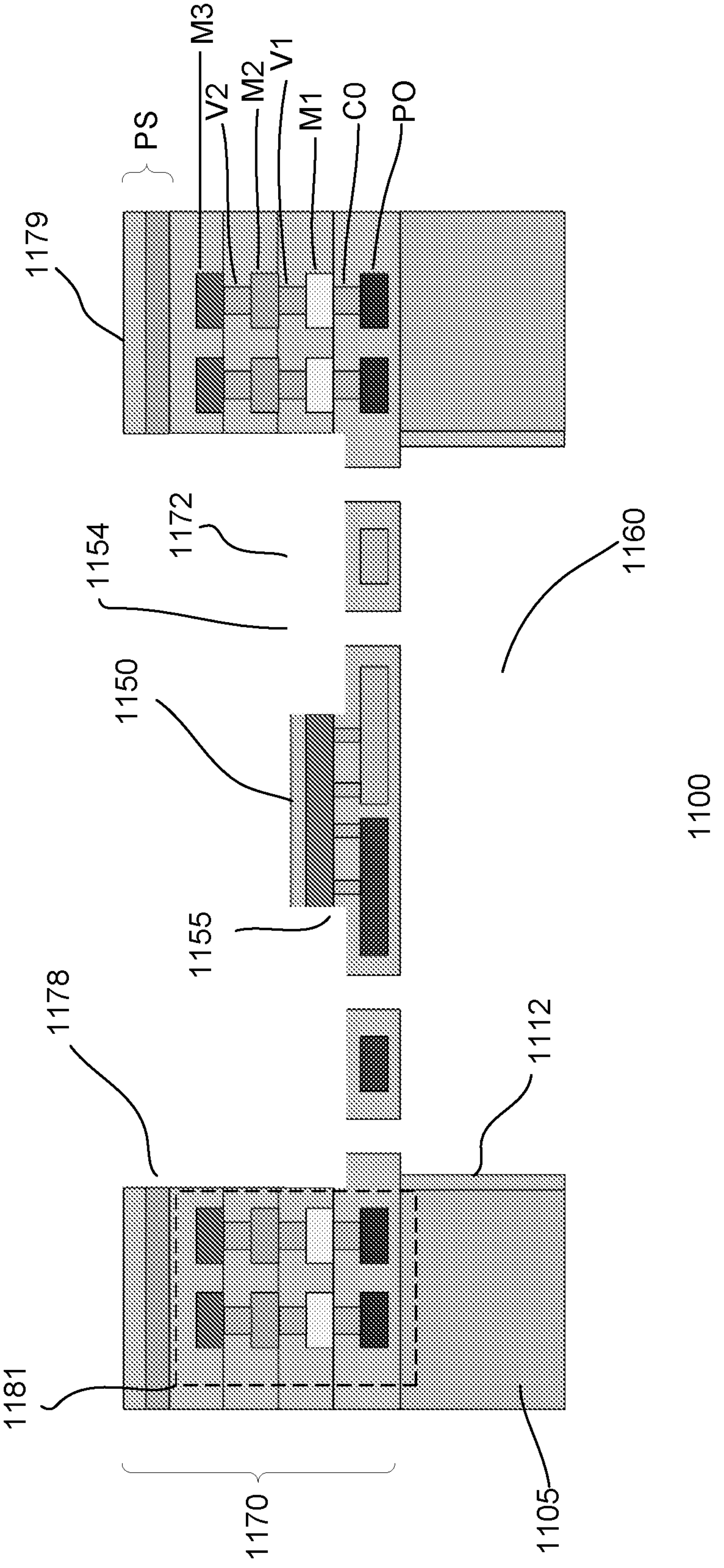
FIGS. 11*a*-11*b* show simplified cross-sectional views of the sensor region of the device along A-A' of FIGS. 10*a*-10*b* after the first release process and after the second release process.
Figure 11B:
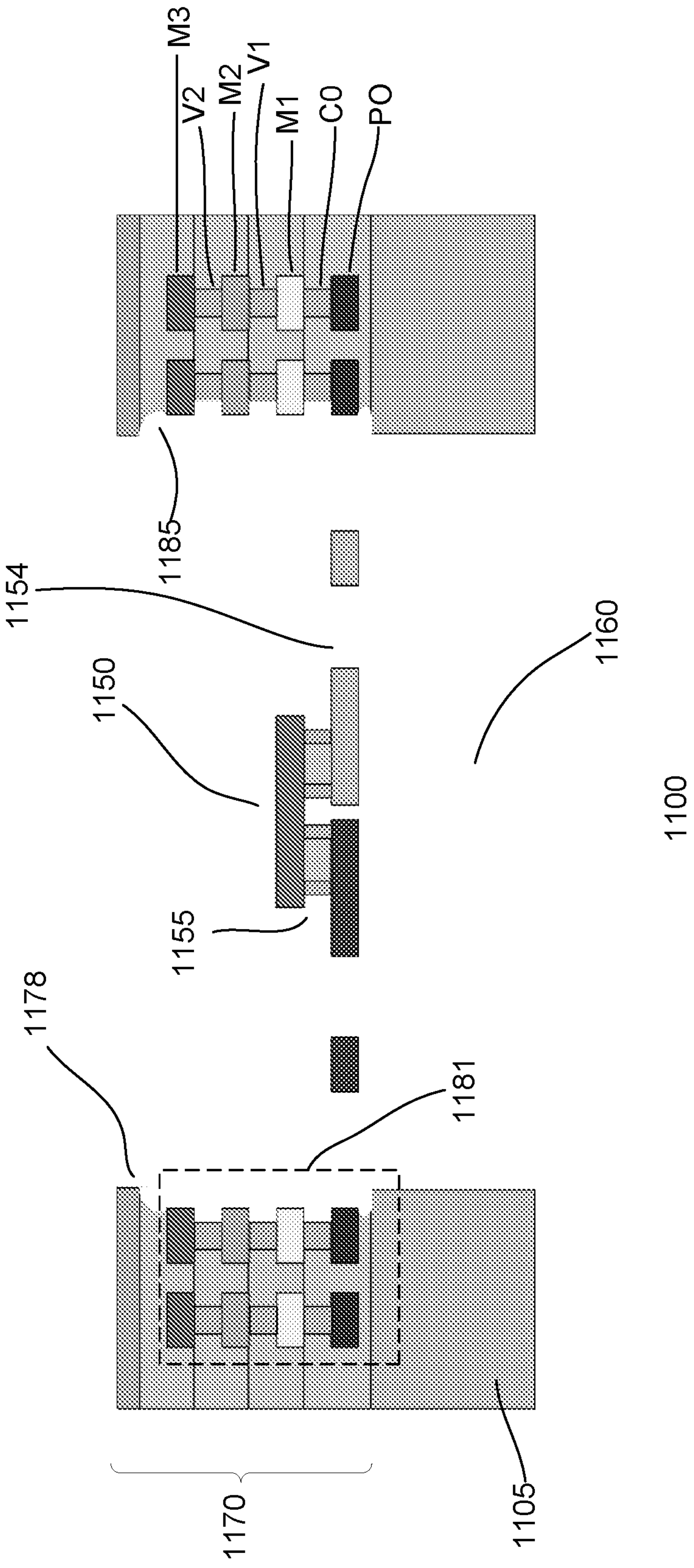

FIGS. 11*a*-11*b* show simplified cross-sectional views of the sensor region of the device along A-A' of FIGS. 10*a*-10*b* after the first release process and after the second release process. Common elements may not be described or described in detail.

Referring to FIG. 11*a*, the device is shown after the first release process. The first release process is selective to the BEOL dielectric 1170 and metal of the M1 metal level. For example, the first release process removes the lower sensor cavity fill, leaving the protective liner 1112, the dielectric layer encasing the sensor and the upper passivation layer 1179.

In FIG. 11*b*, a second release process is performed. The second release process removes dielectric material, such as silicon oxide with a high etch rate compared to silicon, silicon nitride, polysilicon and metal. For example, the second release process removes the dielectric material encasing the sensor, forming a free-standing sensor. In addition, the second release process removes the protective line lining the lower sensor cavity as well as erodes the BEOL dielectric 1170. The BEOL protection wall 1181 prevents the etchants of the second release process from damaging the BEOL dielectric in the active CMOS region.

Figure 12A:
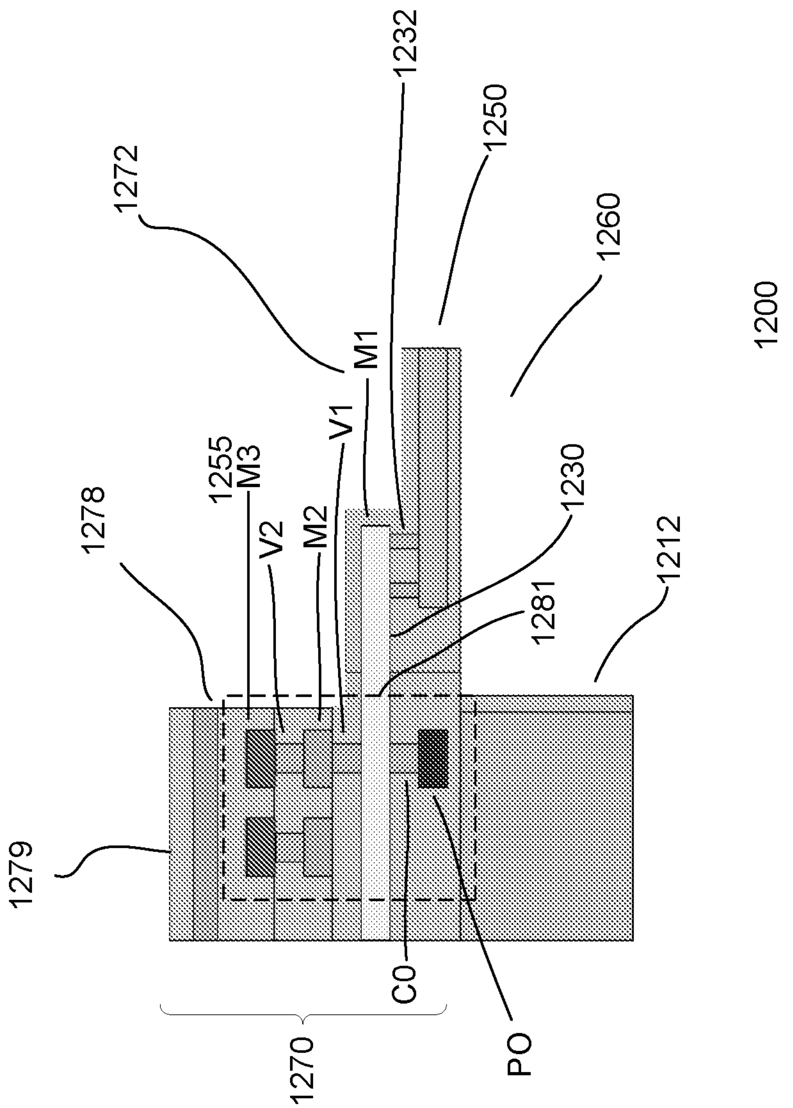
FIGS. 12*a*-12*b* show simplified cross-sectional views of the sensor region of the device along B-B' of FIGS. 10*a*-10*b* after the first release process and after the second release process.
Figure 12B:
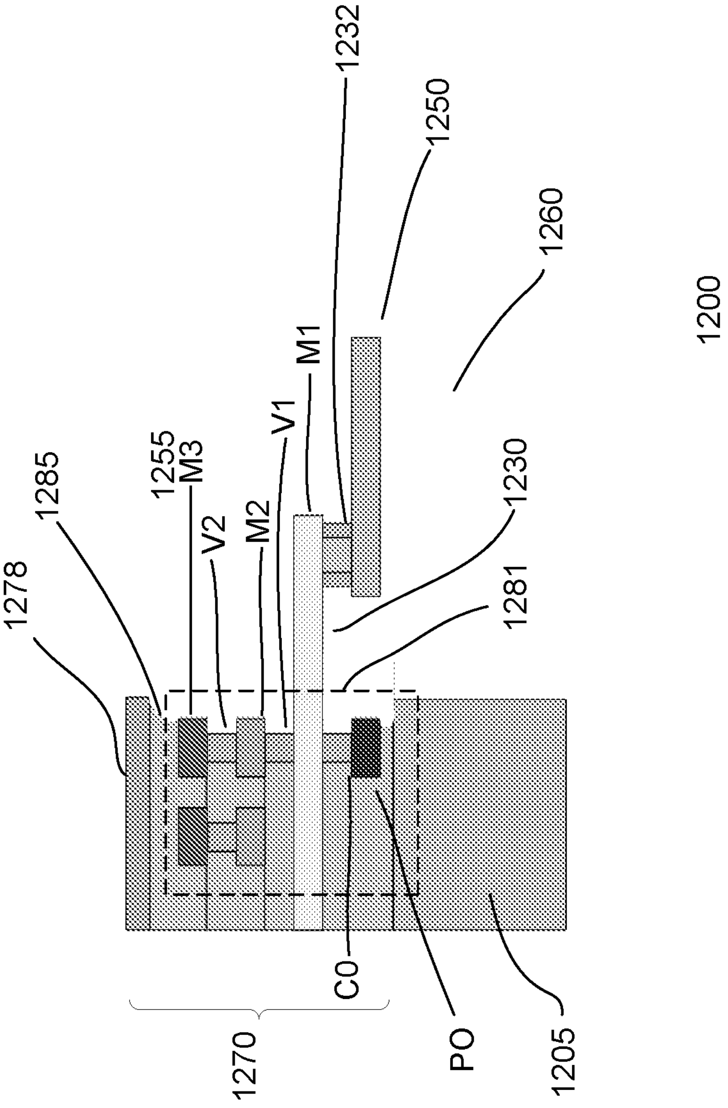

FIGS. 12*a*-12*b* show simplified cross-sectional views of the sensor region of the device along B-B' of FIGS. 10*a*-10*b* before and after the first release process and after the second release process. Common elements may not be described or described in detail.

Referring to FIG. 12*a*, the device is shown after the first release process. The first release process is selective to the BEOL dielectric 1270 and metal of the M1 metal level. For example, the first release process removes the lower sensor cavity fill, leaving the protective liner 1212, the dielectric layer encasing the sensor and upper passivation layer 1279. As shown, a terminal interconnect at the M1 level connects to a terminal via contact 1232 connected to the sensor 1250.

In FIG. 12*b*, a second release process is performed. As discussed, the second release process removes dielectric material, such as silicon oxide with a high etch rate compared to silicon, silicon nitride, polysilicon and metal. The second release process removes the dielectric material encasing the sensor, forming a free-standing sensor. In addition, the second release process removes the protective line lining the lower sensor cavity, the upper passivation layer of the protective stack, as well as erodes the BEOL dielectric 1270. The BEOL protection wall 1281 prevents the etchants of the second release process from damaging the BEOL dielectric in the active CMOS region.

Figure 13A:
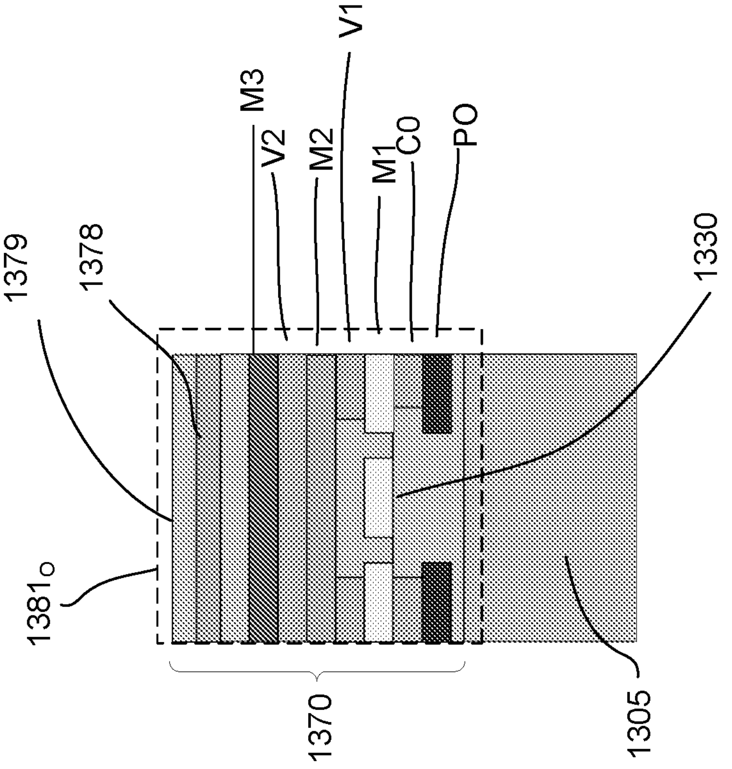
FIGS. 13*a*-13*b* show simplified cross-sectional views of the sensor region of the device along C-C' of FIGS. 10*a*-10*b* after the first release process and after the second release process.
Figure 13B:
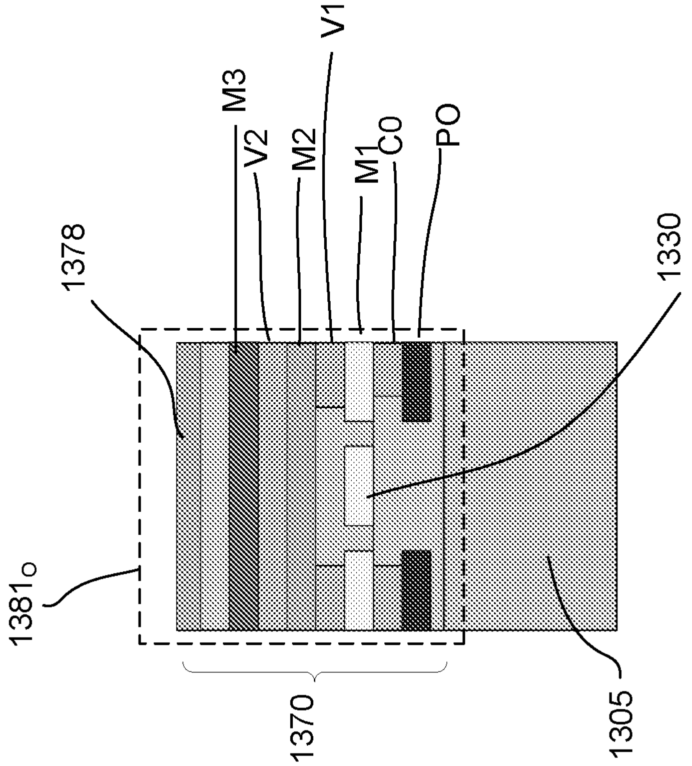

FIGS. 13*a*-13*b* show simplified cross-sectional views of the sensor region of the device along C-C' of FIGS. 10*a*-10*b* before and after the first release process and after the second release process. Common elements may not be described or described in detail.

Referring to FIG. 13*a*, the device is shown after the first release process. For example, the first release process removes the lower sensor cavity fill, leaving the protective liner, the dielectric layer encasing the sensor and upper passivation layer 1379.

As shown in FIG. 13*b*, a second release process is performed. The second release process removes the dielectric material encasing the sensor, forming a free-standing sensor. In addition, the second release process removes the protective line lining the lower sensor cavity, the upper passivation layer of the protective stack, as well as eroding the BEOL dielectric. The BEOL protection wall prevents the etchants of the second release process from damaging the BEOL dielectric in the active CMOS region.

Figure 14:
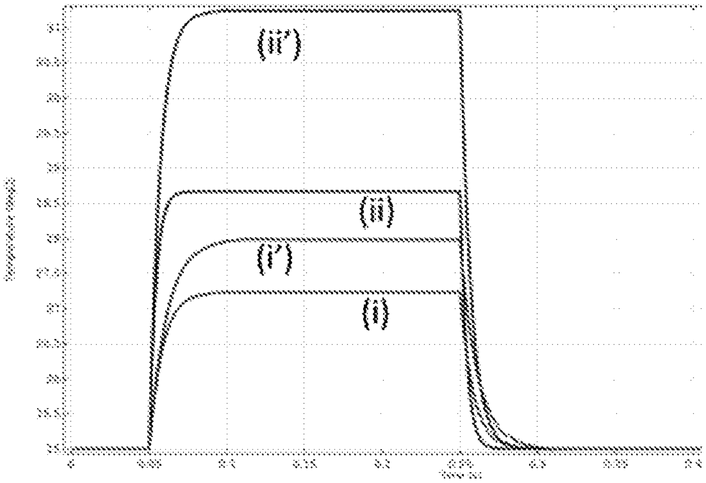
FIG. 14 shows a plot of the thermal conductivity, temperature increase and response speed of various thermal sensors.

FIG. 14 shows a plot of the thermal conductivity, temperature increase and response speed of different thermal sensors. In particular, the first and second sensors are tested. The first sensor includes a first variant which is not free-standing (version i) since only one release process is performed and a second variant (version ii) which is free-standing due to the double release process. Likewise, a second sensor is tested with the first variant (non-free-standing or version i') and a second variant (free-standing or version ii'). As clear from the test data, the free-standing versions have higher temperature increases and shorter response times compared to the respective non-free-standing versions. This evidence the effectiveness of the free-standing sensor compared to the non-free-standing sensor.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A device comprising:
- a substrate, the substrate includes
  - a complementary metal oxide semiconductor (CMOS) region, wherein the CMOS region includes transistor regions with transistors, and
  - a microelectromechanical systems (MEMS) region, wherein the MEMS region includes
    - a lower sensor cavity,
    - a free-standing sensor disposed over the lower sensor cavity, wherein the free-standing sensor is devoid of a support dielectric in contact with a bottom of the sensor which defines a top of the lower sensor cavity, wherein the free-standing sensor devoid of the support dielectric improves response time and sensor sensitivity;
- a back-end-of-line (BEOL) dielectric disposed on the substrate having
  - a pre-metal dielectric layer with pre-metal contacts, and
  - a plurality of inter metal dielectric (IMD) layers disposed over the pre-metal dielectric layer, wherein the IMD layers includes metal and via levels, the metal levels include metal lines and the via levels include via contacts for interconnecting the components of the device via the pre-metal dielectric layer.

2. The device of claim 1 wherein the free-standing sensor comprises an infra-red imaging sensor.

3. The device of claim 2 wherein the free-standing infra-red imaging sensor includes a sensor body, the sensor body comprises:
- a first body segment, the first body segment is a first polarity type body segment;
- a second body segment, the second body segment is a second polarity type body segment;
- a body segment gap separating the first and second body segments, the body segment gap is disposed between adjacent edges of the first and second body segments; and
- a sensor body contact, the sensor body contact electrically coupling the first and second body segments.

4. The device of claim 3 wherein the sensor body contact comprises:
- a sensor body contact interconnect disposed above the sensor body over the sensor body gap;
- first and second sensor body via contacts, the first and second via contacts disposed between the first and second body segments and the sensor body contact interconnect.

5. The device of claim 2 wherein the free-standing infra-red imaging sensor includes a sensor body, the sensor body comprises:

a first body segment, the first body segment is a first polarity type body segment, wherein the first body segment includes a first main body segment, the first main body segment comprises a first main body segment gap pattern, a first lead body segment, the first lead body segment extends from the first main body segment, wherein an end of the first lead body segment serves as a first sensor terminal;

a second body segment, the second body segment is a second polarity type body segment, wherein the second body segment includes a second main body segment, the second main body segment comprises a second main body segment gap pattern, a second lead body segment, the second lead body segment extends from the first main body segment, wherein an end of the second lead body segment serves as the second sensor terminal;

a body segment gap separating the first and second main body segments, the body segment gap is disposed between adjacent edges of the first and second main body segments; and a sensor body contact, the sensor body contact electrically coupling the first and second body segments.

6. The device of claim 5 wherein the sensor body contact comprises:

a sensor body contact interconnect disposed above the sensor body over the sensor body gap;

first and second sensor body via contacts, the first and second via contacts disposed between the first and second body segments and the sensor body contact interconnect.

7. The device of claim 6 wherein the first and second body via contacts comprise loop contacts, wherein a loop contact comprises a conductive outer loop filled with a dielectric fill, the loop contact provides mechanical support for the free-standing sensor.

8. The device of claim 1 wherein the pre-metal dielectric layer and BEOL dielectric comprises a protection wall surrounding the MEMS region, the protection wall is configured to protect the pre-metal dielectric layer and the BEOL dielectric in the CMOS region from damage from etchants during a second release process to form the free-standing sensor.

9. The device of claim 8 wherein the protection wall is a double protection comprising:

an inner protection wall; and an outer protection wall, wherein the inner protection wall and outer protection wall are configured with inner protection wall openings and outer protection wall openings are configured to provide electrical connections to the free-standing sensor without shorting, and extend an etchant flow path of the etchants of the second release to prevent damaging the pre-metal dielectric layer and BEOL dielectric in the CMOS region.

10. The device of claim 2 wherein the sensor body is doped to produce an ambient sheet resistance to serve as an absorber.

11. The device of claim 10 wherein:

a bottom of the lower sensor cavity comprises a reflector; and the absorber, the reflector and a depth of the cavity are part of an interferometric absorption system to improve absorption of infra-red radiation.

12. A method for forming a device comprising:

providing a substrate prepared with a complementary metal oxide semiconductor (CMOS) region and a microelectromechanical systems (MEMS) region;

processing the CMOS region, wherein processing the CMOS region comprises includes forming first and second types of transistors in first and second transistor regions of the CMOS region;

processing the MEMS region, wherein processing the MEMS region includes forming a lower sensor cavity trench filled with a cavity trench fill, forming a sensor support dielectric layer over the lower sensor cavity on top of the trench fill, forming a sensor on the sensor support dielectric layer;

forming a back-end-of-line (BEOL) dielectric disposed on the substrate having a pre-metal dielectric layer with pre-metal contacts, and a plurality of inter metal dielectric (IMD) layers with metal and via levels, the metal levels include metal lines and the via levels include via contacts for interconnecting the components of the device via the pre-metal dielectric layer;

patterning the BEOL dielectric to form a sensor opening in the BOEL dielectric, wherein patterning the BEOL dielectric also forms release openings to expose the cavity trench fill;

performing a first release to remove the cavity trench fill to form the lower sensor cavity; and performing a second release to remove the sensor support dielectric to form a free-standing sensor, wherein the free-standing sensor without the support dielectric improves sensor sensitivity and response time.

13. The method of claim 12 wherein forming the pre-metal dielectric layer and BEOL dielectric comprises forming a protection wall surrounding the MEMS region, the protection wall is configured to protect the pre-metal dielectric layer and the BEOL dielectric in the CMOS region from damage from etchants during the second release process to form the free-standing sensor.

14. The method of claim 13 wherein forming the protection wall comprises:

forming inner and outer protection walls, the inner protection wall is disposed within the outer protection wall, wherein forming the inner protection wall includes forming inner protection wall openings, and forming the outer protection wall includes forming outer protection wall openings; and wherein forming the inner and outer protection wall openings facilitate electrical connections to the sensor without shorting outer protection wall openings, and extend an etchant flow path of the etchants of the second release process to prevent damaging the pre-metal dielectric layer and the BEOL dielectric in the CMOS region.

15. The method of claim 12 wherein forming the sensor comprises forming an infrared sensor comprising an absorber.

16. The method of claim 15 comprises forming a reflector on a bottom surface of the lower sensor cavity.

17. The method of claim 16 wherein the absorber, the reflector and a depth of the cavity are part of an interferometric absorption system to improve absorption of infra-red radiation.

18. The method of claim 12 wherein forming the sensor comprises:

forming a first body segment, the first body segment is a first polarity type body segment, wherein the first body segment includes a first main body segment, the first main body segment comprises a first main body segment gap pattern, a first lead body segment, the first lead body segment extends from the first main body segment, wherein an end of the first lead body segment serves as a first sensor terminal;

forming a second body segment, the second body segment is a second polarity type body segment, wherein the second body segment includes a second main body segment, the second main body segment comprises a second main body segment gap pattern, a second lead body segment, the second lead body segment extends from the first main body segment, wherein an end of the second lead body segment serves as the second sensor terminal, wherein a body segment gap separating the first and second main body segments, the body segment gap is disposed between adjacent edges of the first and second main body segments; and forming a sensor body contact, the sensor body contact electrically coupling the first and second body segments.

19. The method of claim 18 wherein forming the sensor body contact comprises:

forming first and second sensor body via contacts, on first and second main body segments; and forming a sensor body contact interconnect on the first and second body via contacts to electrically couple the first and second body segments.

20. The method of claim 19 wherein forming the first and second body via contacts comprises forming device of claim 6 wherein the first and second body via loop contacts, wherein a loop contact comprises a conductive outer loop filled with a dielectric fill, the loop contact provides mechanical support for the free-standing sensor.

* * * * *